United States Patent
Kumazawa

[19]

[11] Patent Number: 6,157,497

[45] Date of Patent: *Dec. 5, 2000

[54] EXPOSURE APPARATUS

[75] Inventor: Masato Kumazawa, Kawasaki, Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/587,346

[22] Filed: Jan. 16, 1996

Related U.S. Application Data

[63] Continuation-in-part of application No. 08/453,538, May 30, 1995, Pat. No. 5,729,331, which is a continuation-in-part of application No. 08/391,944, Feb. 21, 1995, abandoned, which is a continuation of application No. 08/259,771, Jun. 14, 1994, abandoned.

[30] Foreign Application Priority Data

| Jun. 30, 1993 | [JP] | Japan | 5-161588 |
|---|---|---|---|
| Dec. 22, 1993 | [JP] | Japan | 5-345619 |
| May 30, 1994 | [JP] | Japan | 6-116800 |
| Jun. 6, 1994 | [JP] | Japan | 6-123762 |
| Jun. 23, 1994 | [JP] | Japan | 6-141326 |
| Jul. 29, 1994 | [JP] | Japan | 6-177898 |
| Aug. 25, 1994 | [JP] | Japan | 6-200494 |
| Jan. 18, 1995 | [JP] | Japan | 7-5835 |
| Jun. 2, 1995 | [JP] | Japan | 7-136779 |

[51] Int. Cl.[7] .......................... G02B 17/00; G02B 13/22; G03B 27/42

[52] U.S. Cl. .......................... 359/727; 359/663; 359/732; 355/53

[58] Field of Search .................... 359/727, 730, 359/732, 734, 735, 736, 663; 355/43, 53, 49, 51

[56] References Cited

U.S. PATENT DOCUMENTS

| 2,742,817 | 4/1956 | Altmau | 359/727 |
|---|---|---|---|
| 3,819,265 | 6/1974 | Feldman et al. | 355/51 |
| 3,910,684 | 10/1975 | Glatzel | 359/727 |
| 4,068,947 | 1/1978 | Buckley et al. | 355/72 |

(List continued on next page.)

FOREIGN PATENT DOCUMENTS

| 2050590 | 4/1972 | European Pat. Off. . |
|---|---|---|
| 0 313 200 | 4/1989 | European Pat. Off. . |
| 49-35453 | 9/1974 | Japan . |
| 57-154218 | 9/1982 | Japan . |
| 57-154219 | 9/1982 | Japan . |
| 60-78454 | 5/1985 | Japan . |
| 4-251812 | 9/1992 | Japan . |
| 5-249379 | 9/1993 | Japan . |

(List continued on next page.)

OTHER PUBLICATIONS

U.S. application No. 07/564,007, filed Aug. 7, 1990, Assignee: Nikon Corp.
English Abstract of JP 07 326 557, Dec. 12, 1995.

*Primary Examiner*—Georgia Epps
*Assistant Examiner*—Jordan M. Schwartz
*Attorney, Agent, or Firm*—Oliff & Berridge, PLC

[57] ABSTRACT

It is an object to provide a high-performance and compact exposure apparatus which can perform a projection exposure operation with satisfactory optical performance by using a plurality of compact projection optical systems each capable of ensuring a sufficient working distance and having excellent imaging performance, while preventing a decrease in throughput even in a large exposure area. An exposure apparatus for projecting and exposing an image of a mask onto a plate while moving a mask and a plate has a first projection optical system and a second projection optical system each of which is real-size and both-side telecentric and forms the erect image of the mask on the plate. The first or second projection optical system has a refraction optical system having a positive refracting power, and a concave reflecting mirror for reflecting a light beam from the refraction optical system toward the refraction optical system.

78 Claims, 26 Drawing Sheets

U.S. PATENT DOCUMENTS

| | | | |
|---|---|---|---|
| 4,103,989 | 8/1978 | Rosin | 359/730 |
| 4,103,990 | 8/1978 | Yamada | 359/727 |
| 4,171,871 | 10/1979 | Dill et al. | 359/730 |
| 4,391,494 | 7/1983 | Hershel | 359/727 |
| 4,425,037 | 1/1984 | Hershel et al. | 355/43 |
| 4,469,414 | 9/1984 | Shafer | 359/365 |
| 4,512,641 | 4/1985 | Mochizuki et al. | 359/362 |
| 4,814,830 | 3/1989 | Isohata et al. | 355/54 |
| 4,844,568 | 7/1989 | Suzuki et al. | 359/210 |
| 4,924,257 | 5/1990 | Jain | 355/53 |
| 4,953,960 | 9/1990 | Williamson | 359/663 |
| 5,031,977 | 7/1991 | Gibson | 359/355 |
| 5,159,172 | 10/1992 | Goodman et al. | 219/121.68 |
| 5,291,240 | 3/1994 | Jain | 355/53 |
| 5,298,939 | 3/1994 | Swanson et al. | 355/53 |
| 5,323,263 | 6/1994 | Schoenmakers | 359/366 |
| 5,369,521 | 11/1994 | Yoshino | 359/196 |
| 5,448,416 | 9/1995 | Okumura et al. | 359/727 |
| 5,559,629 | 9/1996 | Sheets et al. | 359/364 |
| 5,585,972 | 12/1996 | Markle | 359/732 |
| 5,614,988 | 3/1997 | Kato et al. | 355/46 |
| 5,617,211 | 4/1997 | Nara et al. | 356/401 |
| 5,729,331 | 3/1998 | Tanaka et al. | 355/53 |
| 5,805,356 | 9/1998 | Chiba | 359/727 |

FOREIGN PATENT DOCUMENTS

| | | |
|---|---|---|
| 6-29189 | 2/1994 | Japan. |
| 6-29190 | 2/1994 | Japan. |
| 6-53113 | 2/1994 | Japan. |
| 6-118341 | 4/1994 | Japan. |
| 6-331932 | 12/1994 | Japan. |
| 7-56090 | 3/1995 | Japan. |
| WO 93/09467 | 5/1993 | WIPO. |
| WO 96/25681 | 8/1996 | WIPO. |

10a

FS
FSa

30a

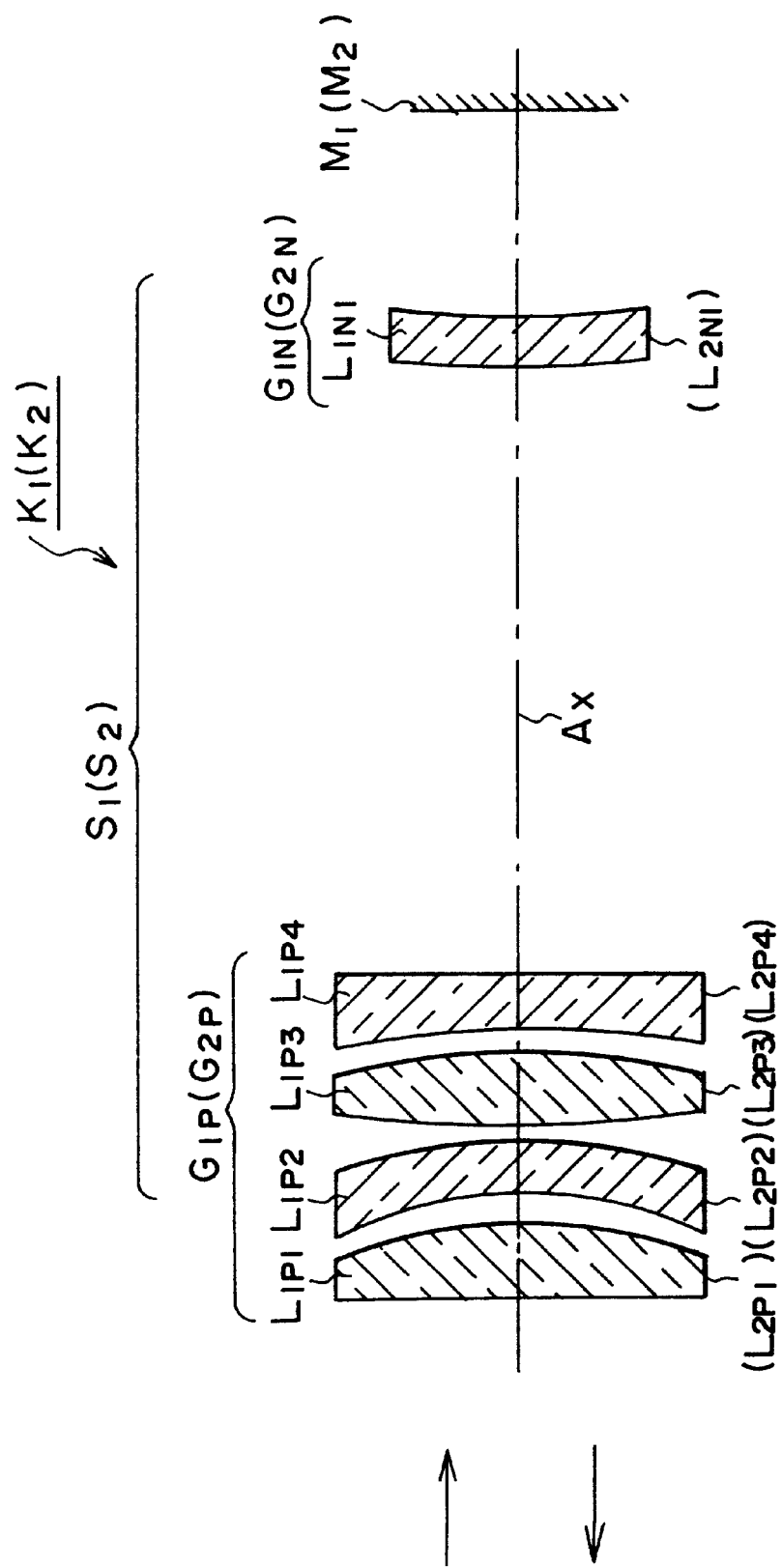

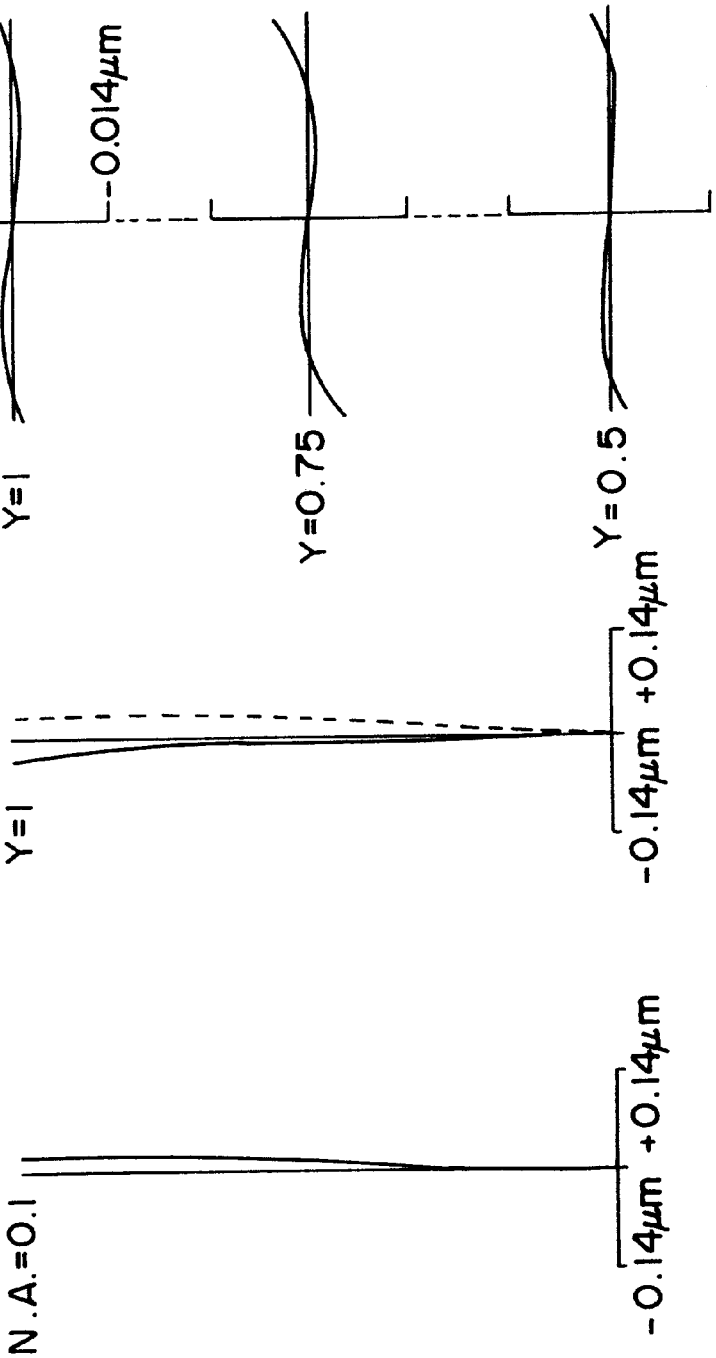

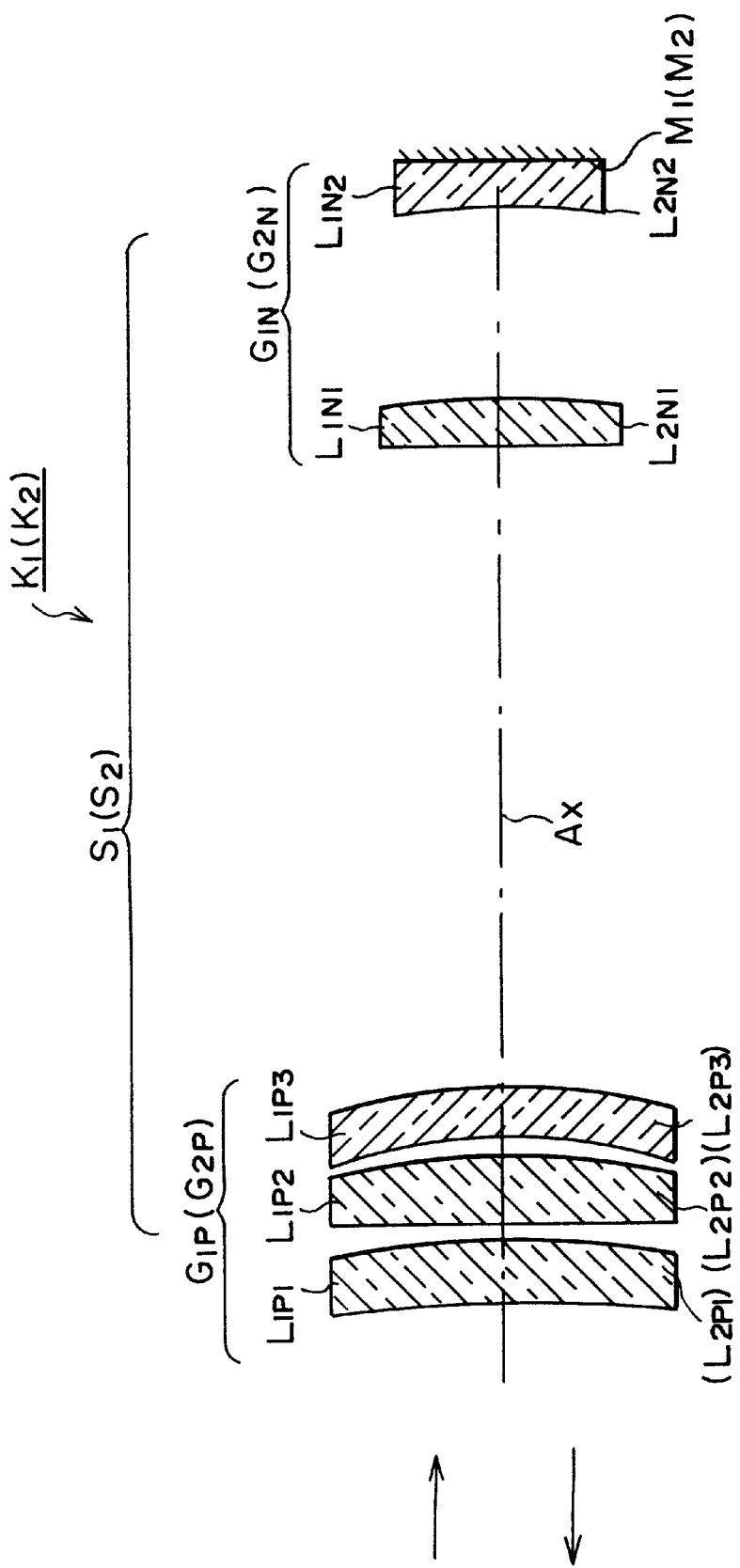

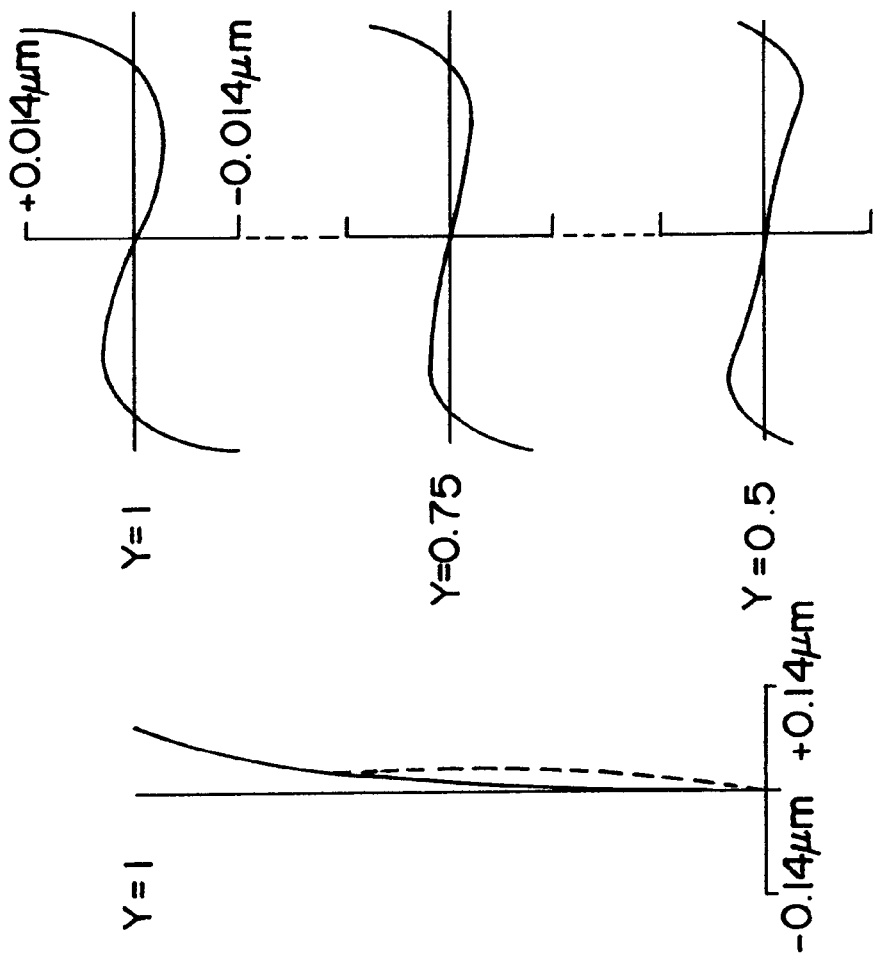

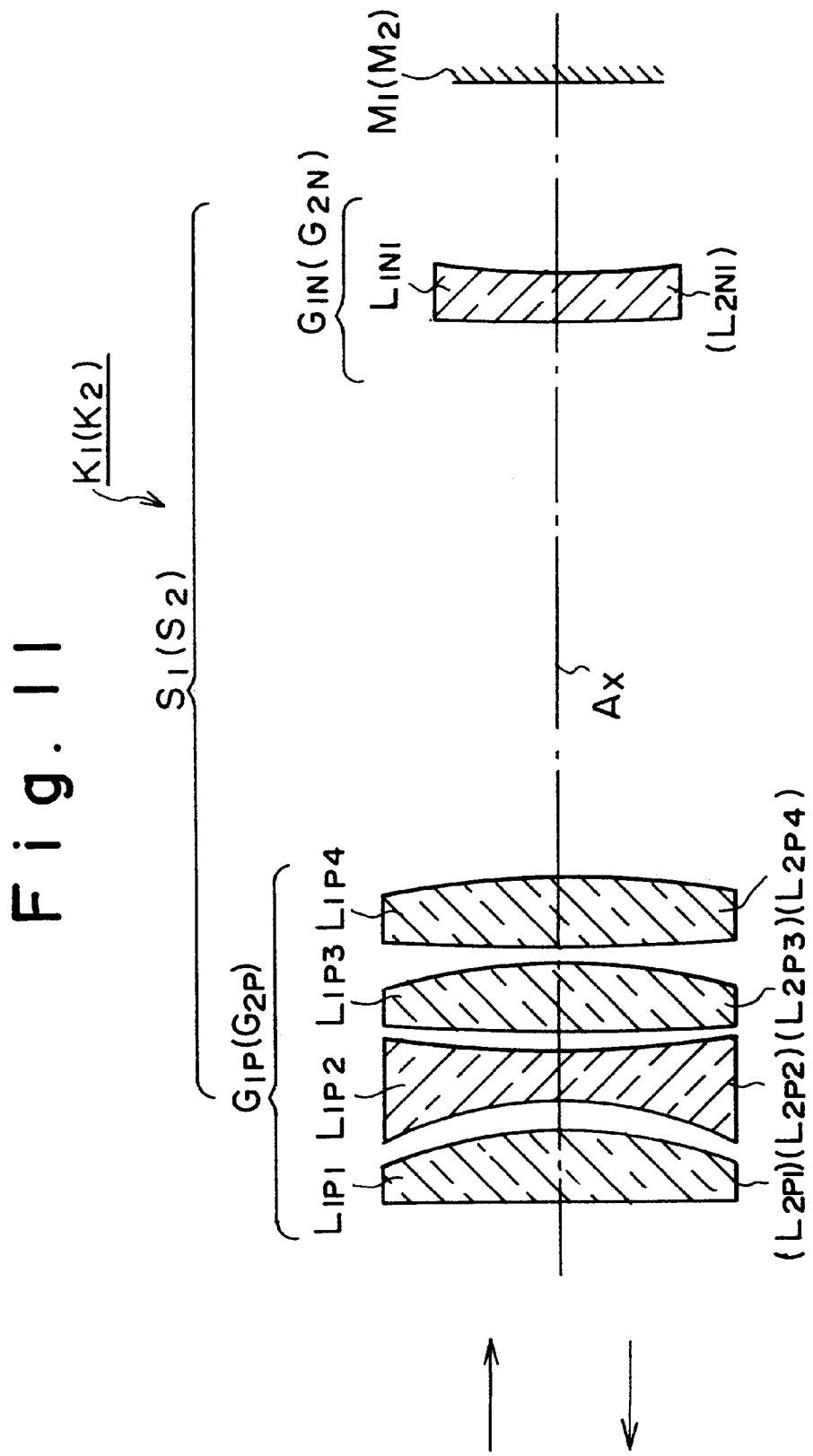

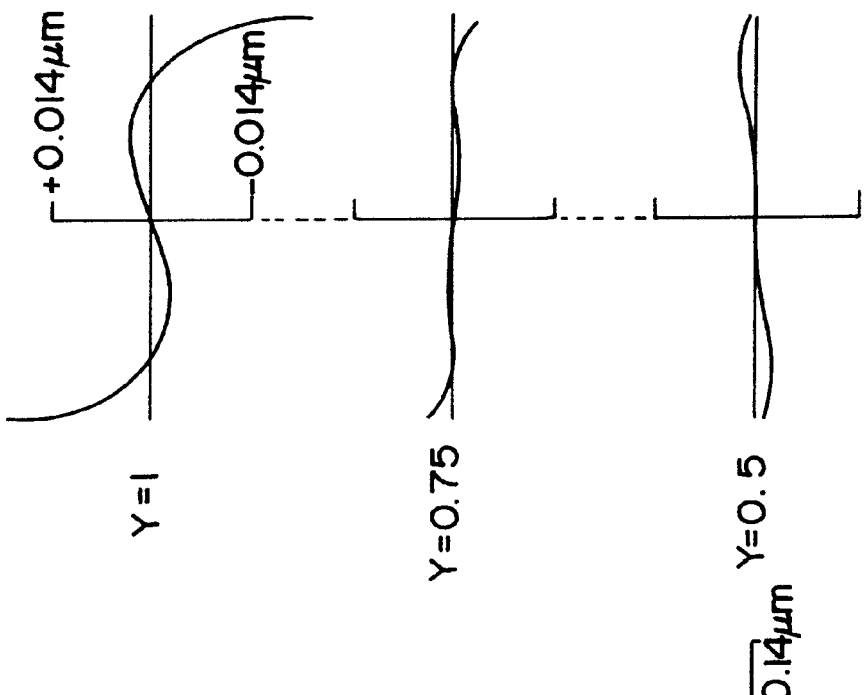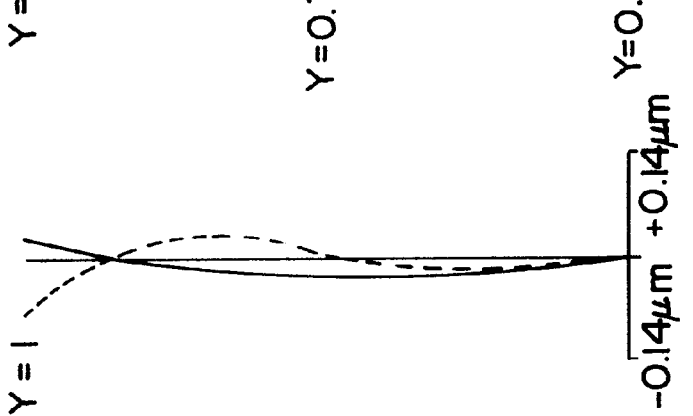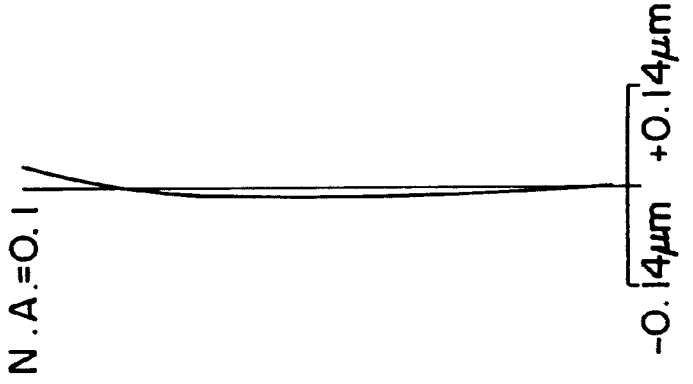

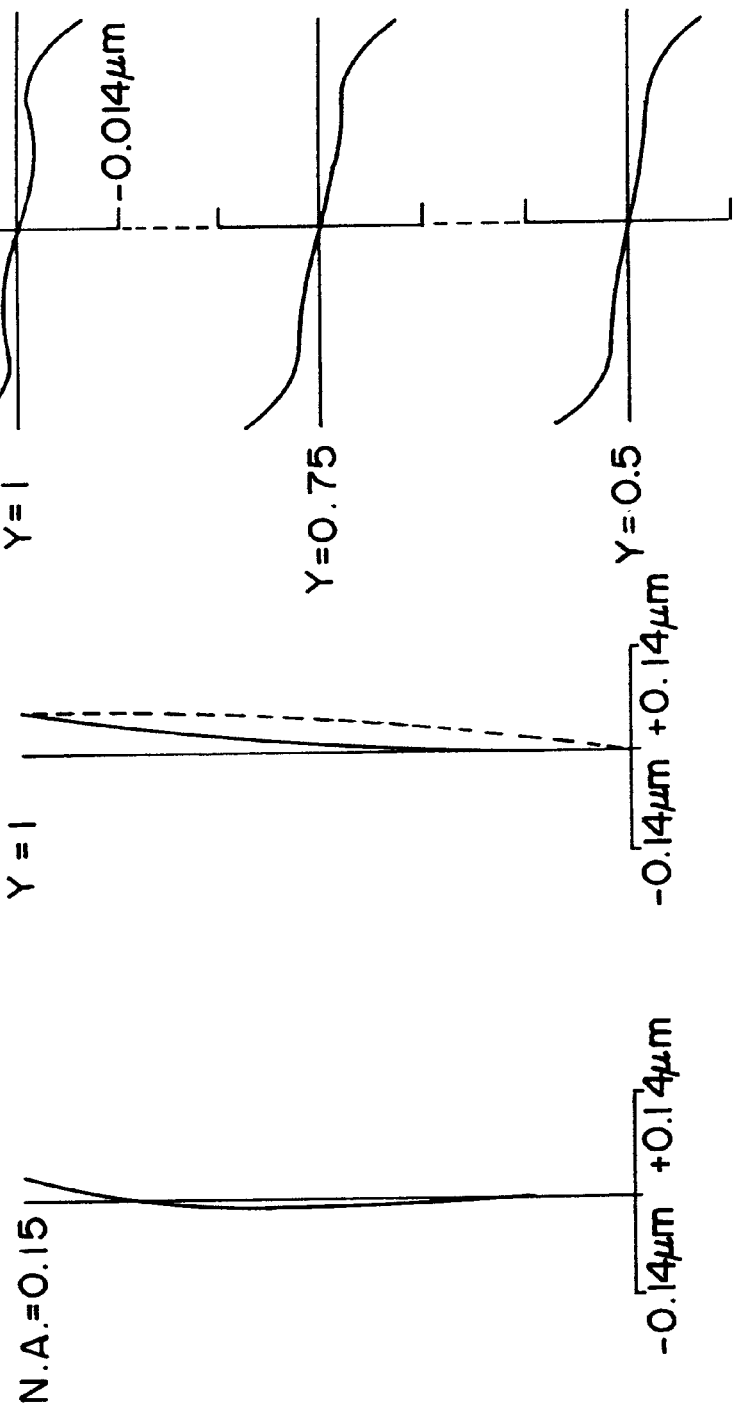

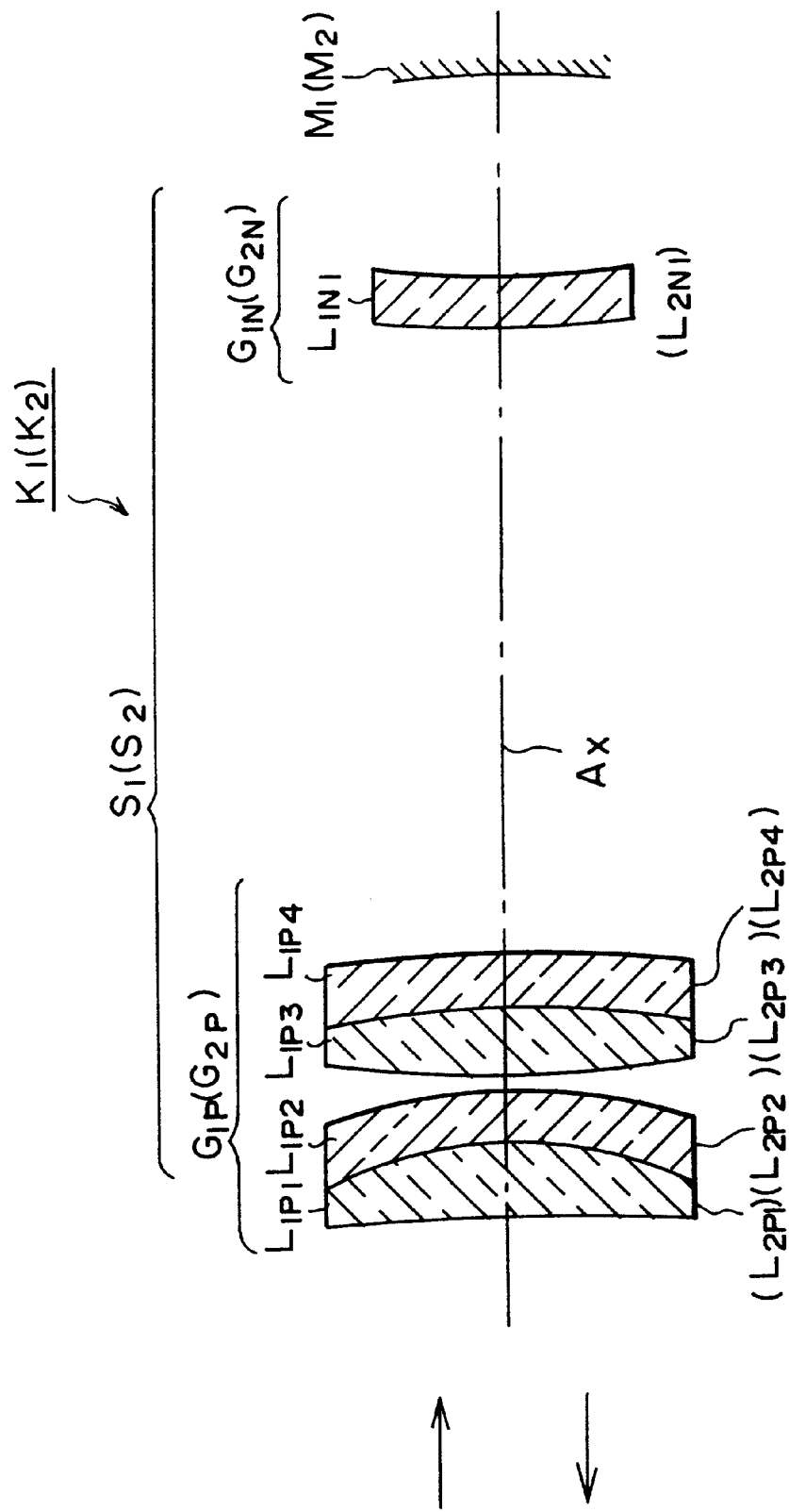

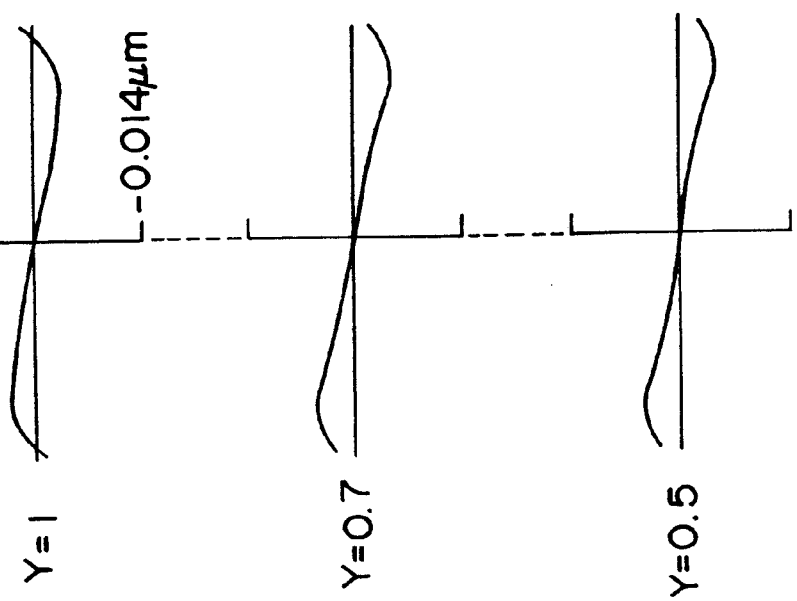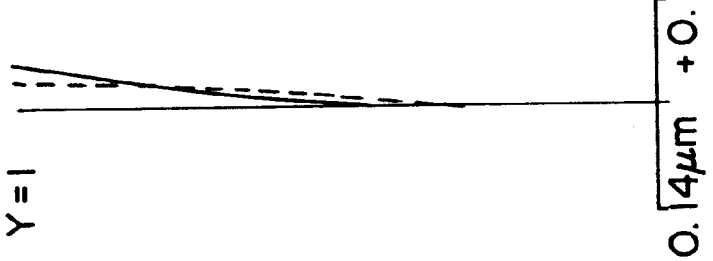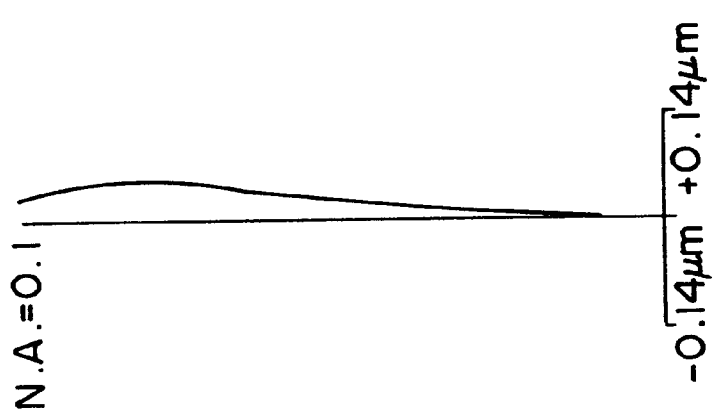

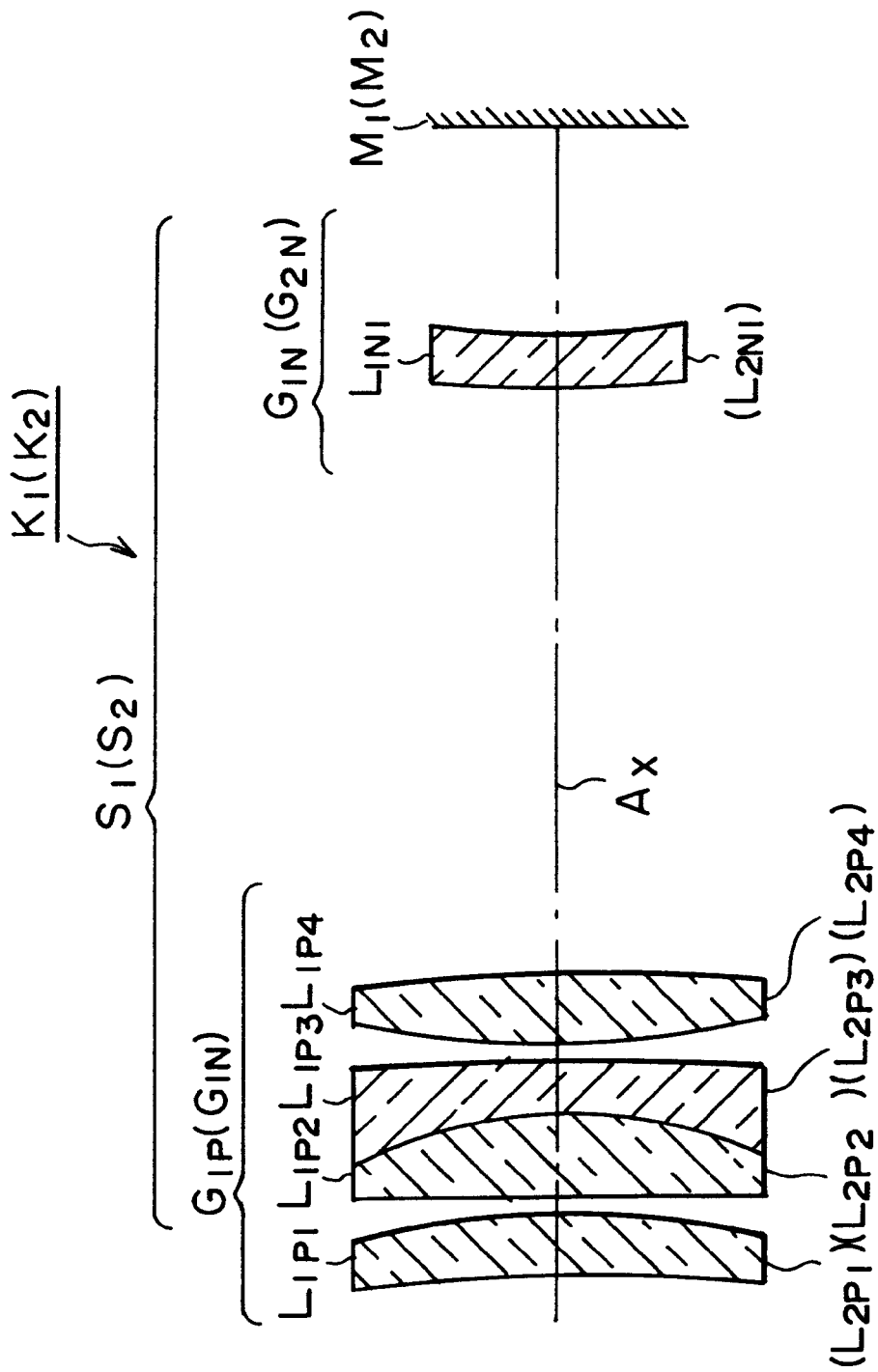

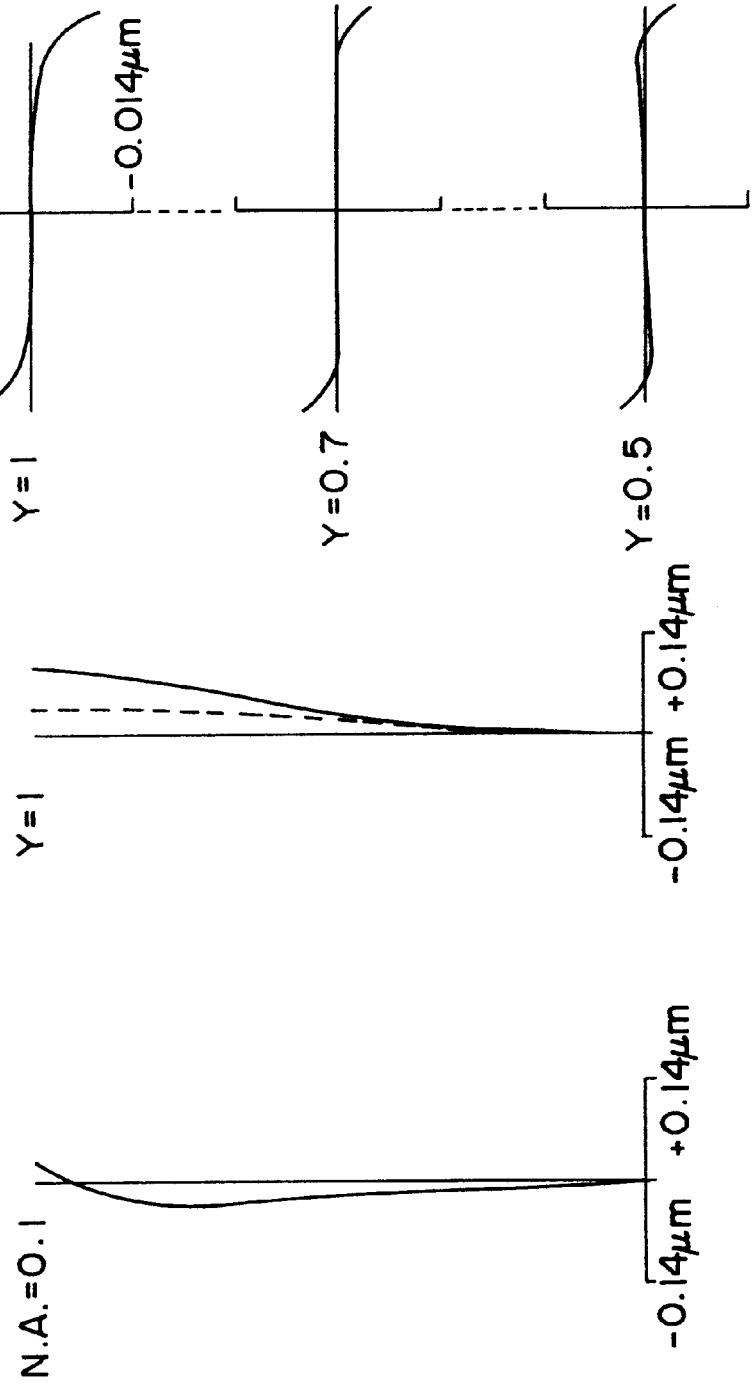

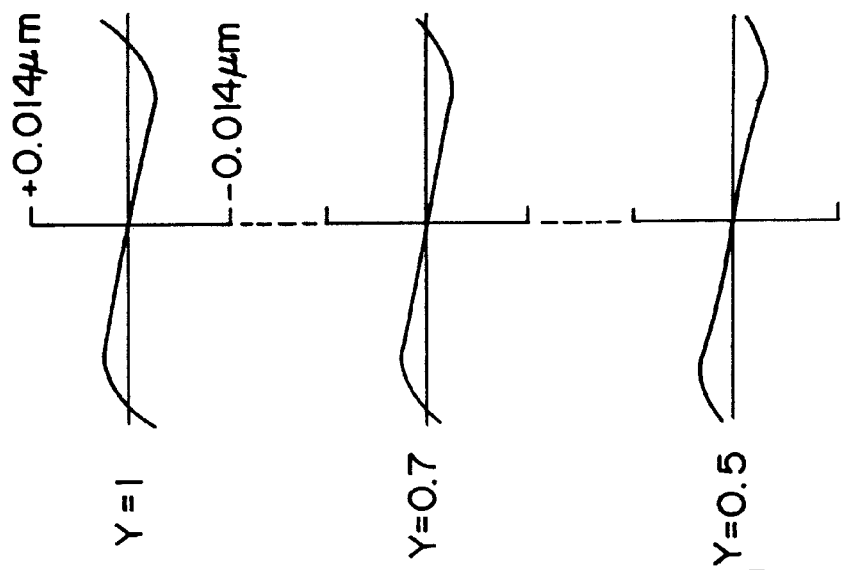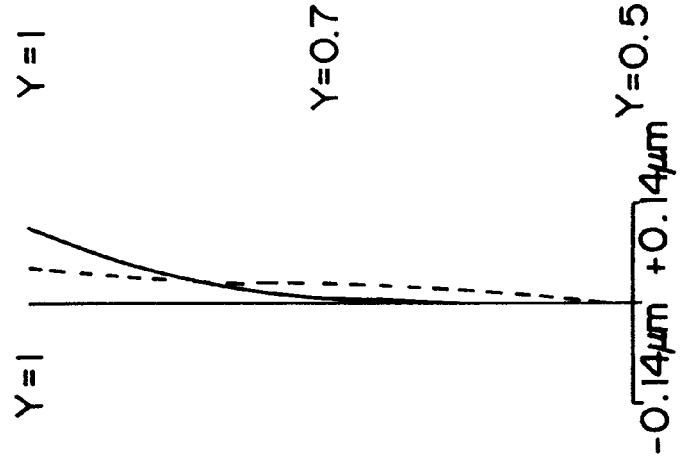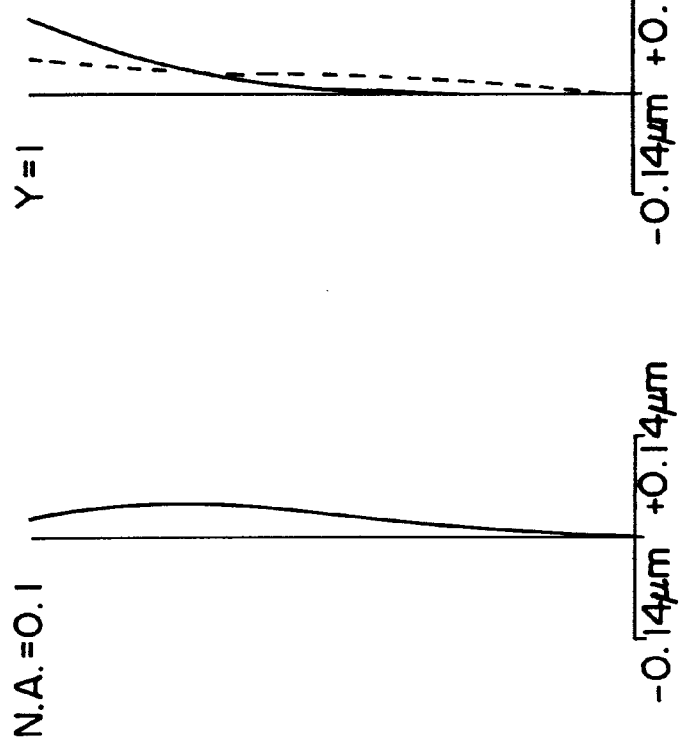

EXPOSURE APPARATUS

This is a continuation-in-part application of Ser. No. 08/453,538 filed May 30, 1995, issued as U.S. Pat. No. 5,729,331 on Mar. 17, 1998, which is in turn a continuation-in-part application of Ser. No. 08/391,944 filed Feb. 21, 1995, now abandoned, which is in turn a continuation application of Ser. No. 08/259,771 filed Jun. 14, 1994, now abandoned.

BACKGROUND OF THE INVENTION

1. Field of the Invention

The present invention relates to a scanning exposure apparatus for performing an exposure operation while moving a first object (e.g., a mask or a reticle) and a second object (e.g., a substrate).

2. Related Background Art

In recent years, liquid crystal display panels are popularly used as display elements for wordprocessors, personal computers, television sets, and the like. To manufacture such a liquid crystal display panel, a transparent thin-film electrode is patterned into a desired shape on a glass substrate by photolithography.

As an apparatus for performing lithography, e.g., a mirror projection type aligner is known.

Recently, large-sized liquid crystal display panels are demanded, and an increase in exposure area is required for such an aligner.

SUMMARY OF THE INVENTION

It is an object of the present invention to provide a compact and high-performance exposure apparatus which can perform a projection exposure operation with satisfactory optical performance by using a plurality of compact projection optical systems each capable of ensuring a sufficient working distance and having excellent imaging performance, while preventing a decrease in throughput even in a large exposure area.

In order to achieve the above object, according to the present invention, as shown in FIG. 1, there is provided an exposure apparatus for projecting and exposing an image of a first object onto a second object while moving the first object and the second object, comprising first and second both-side telecentric projection optical systems for forming a real-size erect image of the first object on the second object, wherein each of the first and second projection optical systems has a first imaging optical system for condensing a light beam from the first object to form a primary image, and a second imaging optical system for condensing the light beam from the primary image to form a secondary image, the first imaging optical system has a first positive lens group having a positive refracting power, a first negative lens group having a negative refracting power, and a first concave reflecting mirror such that the light beam from the first object is reflected by the first concave reflecting mirror through the first positive lens group and the first negative lens group and passes through the first negative lens group and the first positive lens group again, thereby forming the primary image, and the second imaging optical system has a second positive lens group having a positive refracting power, a second negative lens group having a negative refracting power, and a second concave reflecting mirror such that the light beam from the first object is reflected by the second concave reflecting mirror through the second positive lens group and the second negative lens group and passes through the second negative lens group and the second positive lens group again, thereby forming the secondary image.

When the focal length of the first positive lens group (and/or the second positive lens group) is $f_{GP}$, and the focal length of the first negative lens group (and/or the second negative lens group) is $f_{GN}$, the first and/or second imaging optical system preferably satisfies the following relation:

$$3<|f_{GN}/f_{GP}|.$$

On the basis of the above arrangement, the first negative lens group preferably includes a negative meniscus lens having a convex surface facing the first positive lens group side, and the second negative lens group preferably includes a negative meniscus lens having a convex surface facing the second positive lens group side.

The first and/or second imaging optical system constituting the projection optical system preferably includes a negative meniscus lens having a convex surface facing a first positive lens group side (and/or a second positive lens group side). When the radius of curvature of a lens surface of the negative meniscus lens on the first positive lens group side (and/or the second positive lens group side) is $r_{1N}$, the radius of curvature of a lens surface of the negative meniscus lens on a first concave reflecting mirror side (and/or a second concave reflecting mirror side) is $r_{2N}$, and the distance on an optical axis from an image-side principal point to the first concave reflecting mirror, which image side corresponds to the first concave reflecting mirror side of the negative meniscus lens (and/or the distance on the optical axis from an image-side principal point to the second concave reflecting mirror, which image side corresponds to the first concave reflecting mirror side), is $L_{NM}$, the following relations are preferably satisfied:

$$-30<q<-3$$

$$-4<L_{NM}/TL<0.2$$

where a shape factor q is represented as $q=(r_{2n}+r_{1N})/(r_{2N}-r_{1N})$.

When the distance from an image-side principal point, which image side corresponds to the first concave reflecting mirror side of the first positive lens group, to an image-side principal point, which image side corresponds to the first concave reflecting mirror side of the first negative lens group (and/or the distance from an image-side principal point, which image side corresponds to the second concave reflecting mirror side of the second positive lens group, to an image-side principal point, which image side corresponds to the second concave reflecting mirror side of the second negative lens group) is $L_{GP-GN}$, and the distance (total length) on the optical axis from an object surface O to the first concave reflecting mirror (and/or the second concave reflecting mirror) is TL, the first and/or second imaging optical system constituting the projecting optical system preferably satisfies the following relation:

$$0.35<L_{GP-GN}/TL.$$

When the focal length of the first positive lens group (and/or the second positive lens group) is $F_{GP}$, the distance (total length) on the optical axis from the object surface O to the first concave reflecting mirror (and/or the second concave reflecting mirror) is TL, and the radius of curvature of the first concave reflecting mirror (and/or the second concave reflecting mirror) is $r_M$, the first and/or second imaging optical system constituting the projection optical system preferably satisfies the following relations:

$0.95<|r_M TL|<1.08$ $0.3<f_{GP}/TL<1.0$.

The first negative lens group may have a positive lens and a negative meniscus lens having a concave surface facing the first positive lens group side, in an order from the first positive lens group side, and the second negative lens group may have a positive lens and a negative meniscus lens having a concave surface facing the second positive lens group side, in an order from the second positive lens group side. In this case, the negative meniscus lens in the first negative lens group is preferably bonded to the first concave reflecting mirror, and the negative meniscus lens in the second negative lens group is preferably bonded to the second concave reflecting mirror.

With the above arrangement, scanning exposure of the first object (e.g., a mask or a reticle) and the second object (e.g., a substrate) can be performed in a wide range with satisfactory optical performance of the projection optical system while ensuring a high throughput. Particularly, in the present invention, since the negative lens group in the first or second imaging optical system is arranged in the optical path between the positive lens group and the concave reflecting mirror, a sufficient working distance can be ensured.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 7 is a view showing the lens arrangement of a projection optical system according to the second embodiment.

FIGS. 8A, 8B and 8C are views showing various aberrations of the projection optical system shown in FIG. 7.

FIG. 9 is a view showing the lens arrangement of a projection optical system according to the third embodiment.

FIGS. 10A, 10B and 10C are views showing various aberrations of the projection optical system shown in FIG. 9.

FIG. 11 is a view showing the lens arrangement of a projection optical system according to the fourth embodiment.

FIGS. 12A, 12B and 12C are views showing various aberrations of the projection optical system shown in FIG. 11.

FIGS. 14A, 14B and 14C are views showing various aberrations of the projection optical system shown in FIG. 13.

FIG. 15 is a view showing the lens arrangement of a projection optical system according to the sixth embodiment.

FIGS. 16A, 16B and 16C are views showing various aberrations of the projection optical system shown in FIG. 15.

FIG. 17 is a view showing the lens arrangement of a projection optical system according to the seventh embodiment.

FIGS. 18A, 18B and 18C are views showing various aberrations of the projection optical system shown in FIG. 17.

FIGS. 26A, 26B and 26C are views showing various aberrations of the projection optical system shown in FIG. 24.

DESCRIPTION OF THE PREFERRED EMBODIMENTS

In the above-described aligner type projection exposure apparatus, the exposure area is increased by joining small exposure areas. In this case, to obtain a large exposure area, the exposure operation must be performed a number of times, resulting in a decrease in throughput (the number of substrates exposed per unit time). Since the joint accuracy between adjacent exposure areas must be increased, the magnification error or distortion in the projection optical system must be almost zero. In addition, the alignment accuracy must be largely increased, resulting in an increase in cost of the apparatus.

To increase the exposure area, a technique can be used in which a large projection optical system is formed to perform one-shot exposure of a large exposure area. In this case, however, large optical elements constituting the projection optical system must be accurately manufactured. This may result in an increase in manufacturing cost and an increase in size of the exposure apparatus. When the projection optical system becomes bulky, optical aberrations may increase accordingly.

As a projection optical system of an exposure apparatus for performing scanning exposure of a pattern formed on a mask by photolithography onto a substrate through the real-size projection optical system (with a magnification of 1), a projection optical system using a Dyson optical system is disclosed in, e.g., International Patent Laid-Open No. 57-502067.

In the Dyson optical system disclosed in International Patent Laid-Open No. 57-502067, however, the distance from the position of an object (or an image) to the optical system, i.e., the so-called working distance can hardly be sufficiently ensured. For this reason, an acute angle is formed by the mask and the substrate, so the mask and the substrate cannot be set almost parallel to each other, resulting in a significant limitation in scanning range. In addition, the arrangement of stages for holding the mask and the substrate is largely limited. Furthermore, a member for adjusting the optical performance of the projection optical system can hardly be inserted in a space within the working distance.

Figure 1:
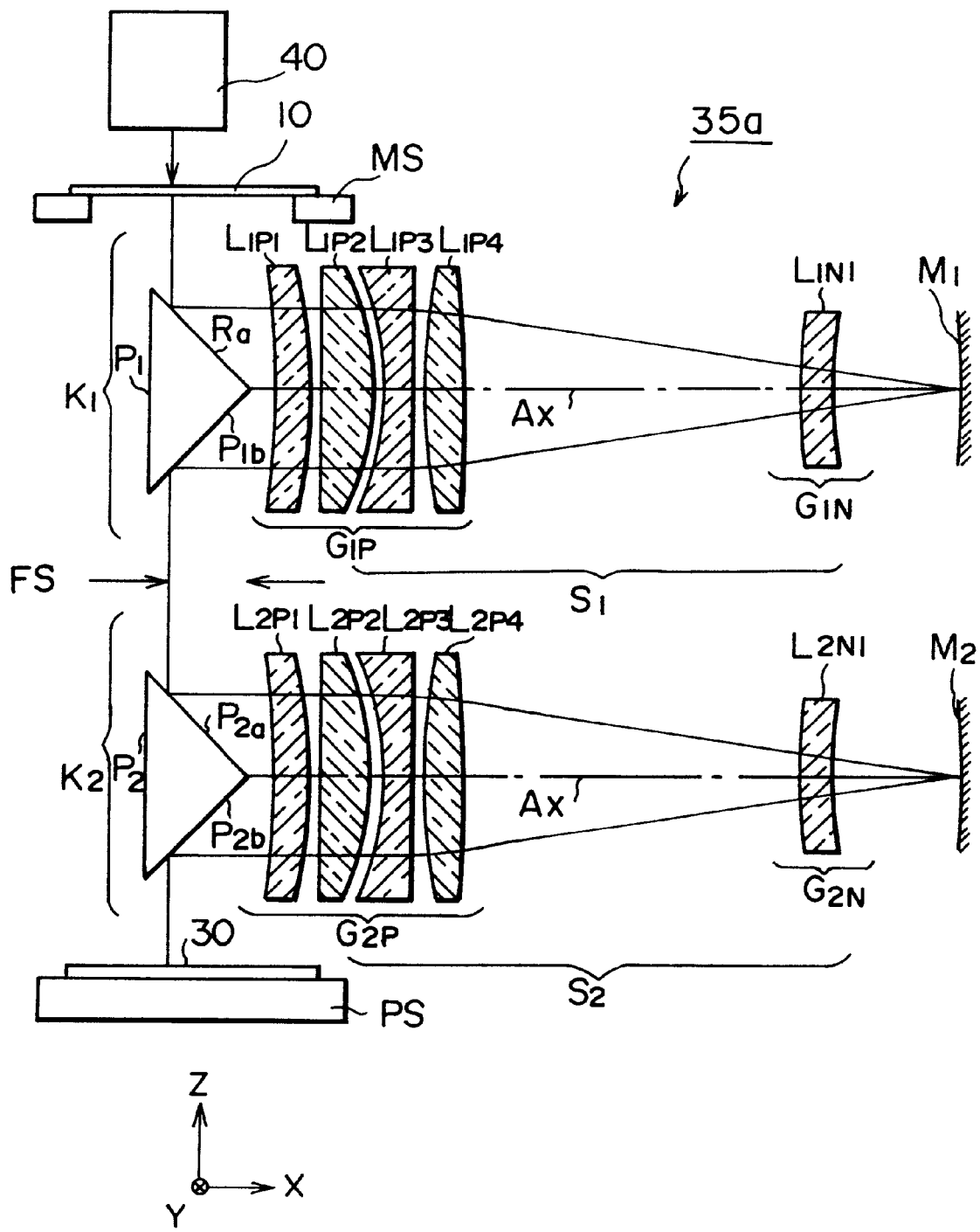
FIG. 1 is a view showing the arrangement of a projection optical system according to an embodiment of the present invention.

Embodiments according to the present invention will be described below with reference to the accompanying drawings. FIG. 1 is a view schematically showing the projection optical system of an exposure apparatus according to the present invention. In FIG. 1, a direction (scanning direction) for conveying a mask 10 with a predetermined circuit pattern formed thereon and a plate 30 as a glass substrate coated with a resist is set along the X-axis, a direction perpendicular to the X-axis in the plane of the mask 10 is set along the Y-axis, and the normal direction of the mask 10 is set along the Z-axis. FIG. 1 shows only a first projection optical system 35a.

Referring to FIG. 1, the first projection optical system 35a has a first imaging optical system $K_1$ for forming the primary image of the circuit pattern on the mask 10, and a second imaging optical system $K_2$ for forming the erect image (secondary image) of the circuit pattern onto the plate 30 on the basis of a light beam from the primary image. The first imaging optical system $K_1$ has a rectangular prism $P_1$ (first reflecting member) having reflecting surfaces $P_{1a}$ and $P_{1b}$ inclined by 45° with respect to the plane (X-Y plane) of the mask 10, a first refraction optical system $S_1$ consisting of a first positive lens group $G_{1P}$ and a first negative lens group $G_{1N}$, and a first concave reflecting mirror $M_1$.

The first positive lens group $G_{1P}$ comprises a positive meniscus lens $L_{1P1}$ having its convex surface facing the first concave reflecting mirror $M_1$ side, a positive lens $L_{1P2}$ having its surface with a larger curvature facing the first concave reflecting mirror $M_1$ side, a negative meniscus lens $L_{1P3}$ having its convex surface facing the first concave reflecting mirror $M_1$ side, and a biconvex positive lens $L_{1P4}$. The first negative lens group $G_{1N}$ comprises only a negative meniscus lens $L_{1N1}$ having its convex surface facing the first positive lens group $G_{1P}$ side.

The arrangement of the second imaging optical system $K_2$ is the same as that of the first imaging optical system $K_1$. More specifically, the second imaging optical system $K_2$ has a rectangular prism $P_2$ (second reflecting member) having reflecting surfaces $P_{2a}$ and $P_{2b}$ inclined by 45° with respect to the plane (X-Y plane) of the plate 30, a second refraction optical system $S_2$ consisting of a second positive lens group $G_{2P}$ and a second negative lens group $G_{2N}$, and a second concave reflecting mirror $M_2$.

As in the first positive lens group $G_{1P}$, the second positive lens group $G_{2P}$ comprises a positive meniscus lens $L_{2P1}$ having its convex surface facing the second concave reflecting mirror $M_2$ side, a positive lens $L_{2P2}$ having its surface with a larger curvature facing the second concave reflecting mirror $M_2$ side, a negative meniscus lens $L_{2P3}$ having its convex surface facing the second concave reflecting mirror $M_2$ side, and a biconvex positive lens $L_{2P4}$. The second negative lens group $G_{2N}$ comprises only a negative meniscus lens $L_{2N1}$ having its convex surface facing the second positive lens group $G_{2P}$ side.

A field stop FS for defining the projection area on the plate 30 is provided at the position where the primary image of the circuit pattern is formed by the first imaging optical system $K_1$.

The circuit pattern on the mask 10 is illuminated with an illumination light beam (exposure light beam) from an illumination optical system 40 at an almost uniform illuminance. The light beam passing through the circuit pattern propagates along the –Z direction in FIG. 1, is deflected by 90° by the reflecting surface $P_{1a}$ of the rectangular prism $P_1$, propagates along the +X direction in FIG. 1, and is incident on the first positive lens group $G_{1P}$ ($L_{1P1}$ to $L_{1P4}$). The light beam incident on the first positive lens group $G_{1P}$ ($L_{1P1}$ to $L_{1P4}$) reaches the first concave reflecting mirror $M_1$ through the first negative lens group $G_{1N}$ ($L_{1N1}$). The first concave reflecting mirror $M_1$ is arranged almost at the rear focal position of the first refraction optical system $S_1$ ($G_1p$ and $G_{1N}$). That is, the first concave reflecting mirror $M_1$ is located at the pupil plane of the first imaging optical system $K_1$. The rear focal position of the first refraction optical system $S_1$ is obtained when the rectangular prism $P_1$ side is defined as a front side, and the first concave reflecting mirror $M_1$ side is defined as a rear side.

The light beam reflected by the first concave reflecting mirror $M_1$ propagates along the –X direction in FIG. 1 through the first negative lens group $G_{1N}$ ($L_{1N1}$) and the first positive lens group $G_{1P}$ ($L_{1P1}$ to $L_{1P4}$) toward the reflecting surface $P_{1b}$ of the rectangular prism $P_1$. The refracting power received by the light beam incident from the positive meniscus lens $L_{1P1}$ side toward the first concave reflecting mirror $M_1$ is almost equal to that received by the light beam incident from the first concave reflecting mirror $M_1$ side and exiting from the positive meniscus lens $L_{1P1}$.

The light beam reaching the reflecting surface $P_{1b}$ of the rectangular prism $P_1$ is deflected by about 90° by the reflecting surface $P_{1b}$, propagates along the –Z direction in FIG. 1, and forms the primary image of the circuit pattern at the position of the field stop FS. In this primary image, the transverse magnification in the X direction is almost +1 time, and the transverse magnification in the Y direction is almost –1 time.

The light beam from the primary image forms the secondary image of the circuit pattern onto the plate 30 through the second imaging optical system $K_2$. The transverse magnifications in the X and Y directions of this secondary image are almost +1 time. That is, the secondary image formed on the plate 30 is an erect image. The function of the second imaging optical system $K_2$ is the same as that of the first imaging optical system $K_1$, and a detailed description thereof will be omitted.

Since the image of the circuit pattern, which is formed on the plate 30, is an erect image, scanning exposure can be performed by integrally moving the mask 10 held by a mask stage MS and the plate 30 held by a plate stage PS in the same direction.

The first imaging optical system $K_1$ is telecentric on the mask 10 side and on the field stop FS side because the first concave reflecting mirror $M_1$ is arranged at the rear focal position of the first refraction optical system $S_1$. Similarly, the second imaging optical system $K_2$ is telecentric on the field stop FS side and on the plate 30 side because the second concave reflecting mirror $M_2$ is arranged at the rear focal position of the first refraction optical system $S_2$. Therefore, the first projection optical system 35a is a both-side telecentric optical system (on the mask 10 side and on the plate 30 side).

Figure 2A:
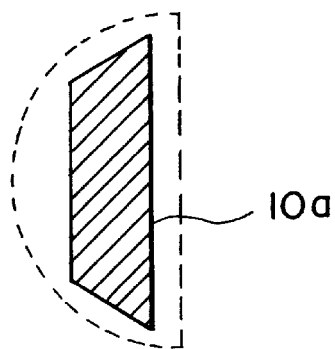
FIGS. 2A, 2B and 2C show the relationship between an exposure area and a field stop of the projection optical system.
Figure 2B:
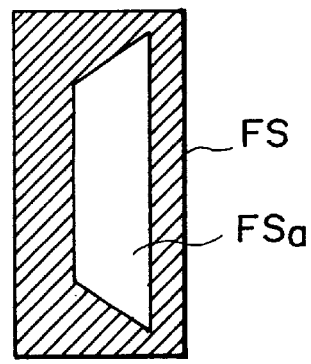
Figure 2C:
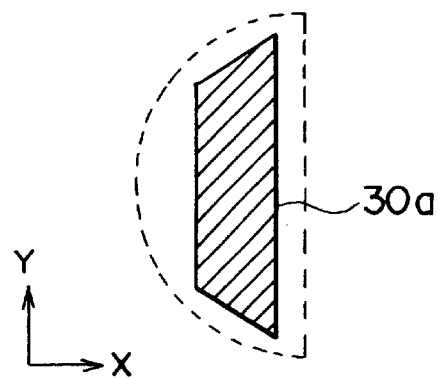

The exposure area of the first projection optical system 35a shown in FIG. 1 will be described below with reference to FIGS. 2A, 2B and 2C. FIG. 2A is a plan view showing the relationship between the effective field area and the field in the X-Y plane on the mask 10 in the first projection optical system 35a. FIG. 2B is a plan view of the field stop FS. FIG. 2C is a plan view showing the relationship between the effective exposure area and the exposure area in the first projection optical system 35a.

Referring to FIG. 2A, the effective field area as the maximum field area acquirable in the first projection optical system 35a is a semicircular area surrounded by a broken line on the mask 10. When an opening portion FSa of the field stop FS has a trapezoidal shape, as shown in FIG. 2B, a field area 10a on the mask 10 in the first projection optical system 35a has a trapezoidal shape similar to that of the opening portion FSa. The field area 10a is naturally included in the effective field area.

As shown in FIG. 2C, the effective exposure area as the maximum exposure area acquirable on the plate 30 in the first projection optical system 35a is a semicircular area surrounded by a broken line. An exposure area 30a on the plate 30 is defined as a trapezoidal shape similar to the opening portion FSa by the opening portion FSa of the field stop FS. The exposure area 30a is included in the effective exposure area. In the trapezoidal exposure area 30a, the height of the trapezoid in the X direction corresponds to the slit width, and an oblique side portion at the end portion in the Y direction (a portion where the height along the X direction changes) corresponds to an overlap area (an area overlapping an adjacent exposure area in the Y direction).

Figure 3:
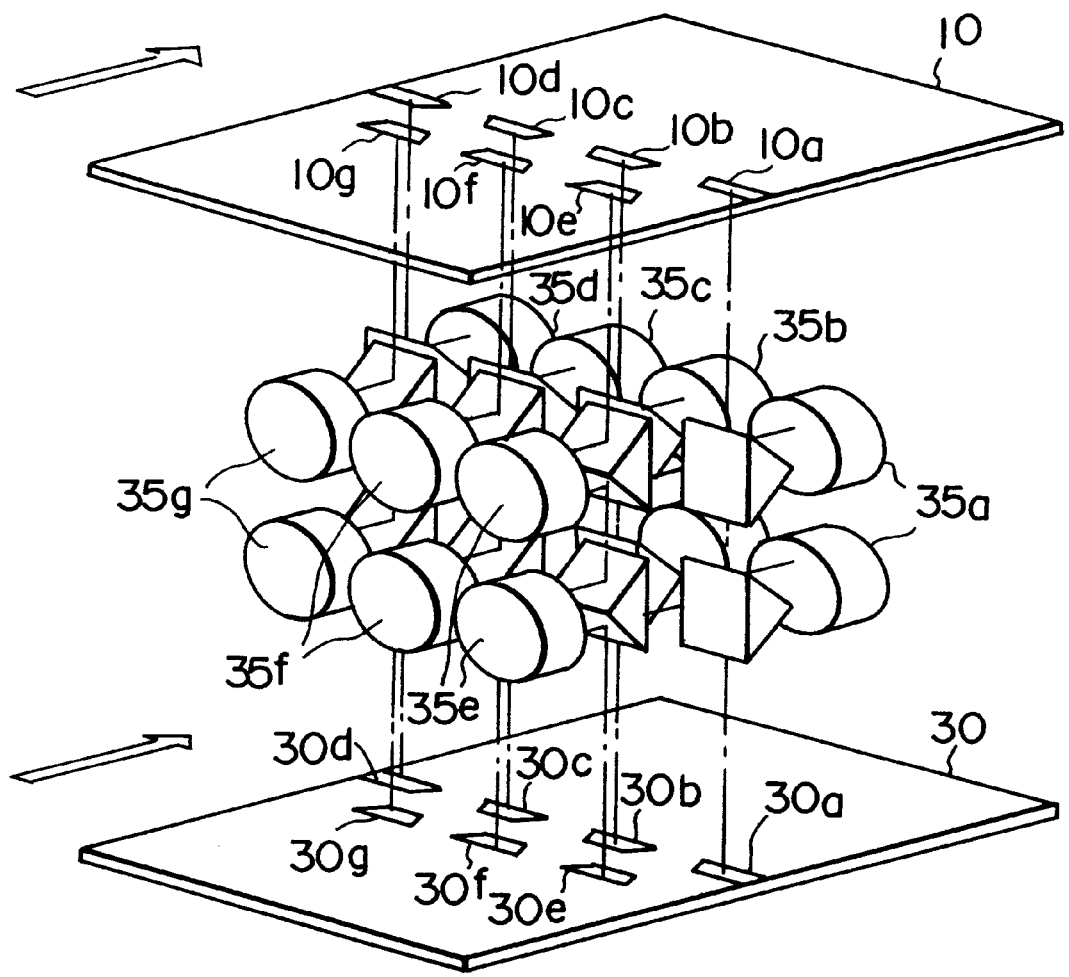
FIG. 3 is a view schematically showing an exposure apparatus according to the present invention.

The overall arrangement of the exposure apparatus according to the present invention will be described below with reference to FIG. 3. FIG. 3 is a view schematically showing an example of the exposure apparatus according to the present invention. In FIG. 3, the illumination optical system 40 shown in FIG. 1, the mask stage for supporting the mask 10, and the plate stage for supporting the plate 30 are not illustrated.

Referring to FIG. 3, four projection optical systems 35a to 35d and three projection optical systems 35e to 35g are arranged along the Y direction between the mask 10 and the plate 30. The projection optical systems 35a to 35d and the projection optical systems 35e to 35g are arranged at different positions in the X direction. Each of the projection optical systems 35a to 35g has the same arrangement as that of the first projection optical system 35a described in FIG. 1, and a detailed description thereof will be omitted.

Field areas 10a to 10g formed by the projection optical systems 35a to 35g are trapezoidal. The short sides of the field areas 10a to 10d formed by the projection optical systems 35a to 35d oppose those of the field areas 10e to 10g formed by the projection optical systems 35e to 35g. Therefore, exposure areas 30a to 30g formed on the plate 30 by the projection optical systems 35a to 35g are trapezoidal. The sum of the scanning direction (X direction) lengths of the exposure areas 30a to 30g is constant at any position in the direction (Y direction) perpendicular to the scanning direction. More specifically, the projection optical systems are arranged such that the areas of the exposure areas 30a to 30g overlap in the Y direction.

Since the erect images of the field areas 10a to 10g are formed in the exposure areas 30a to 30g, respectively, the image of the mask 10 is sequentially formed on the plate 30 by scanning the mask 10 and the plate 30 along the scanning direction.

In FIG. 3, the seven projection optical systems 35a to 35g are used. However, in the exposure apparatus according to the present invention, the number of projection optical systems is not limited to seven, and two (the first projection optical system and the second projection optical system) or more projection optical systems can be arranged.

To reduce deflection of the mask 10 and the plate 30 due to the gravity, the direction (Y direction) perpendicular to the scanning direction is preferably set along the vertical direction. Alternatively, the scanning direction (X direction) can be set along the vertical direction. In this case, however, scanning is performed against the gravity, so the load on the mask stage and the plate stage undesirably increases.

The overall arrangement of this embodiment has been described above. A preferred example of the projection optical system of this embodiment shown in FIG. 1 will be described below.

Figure 4:
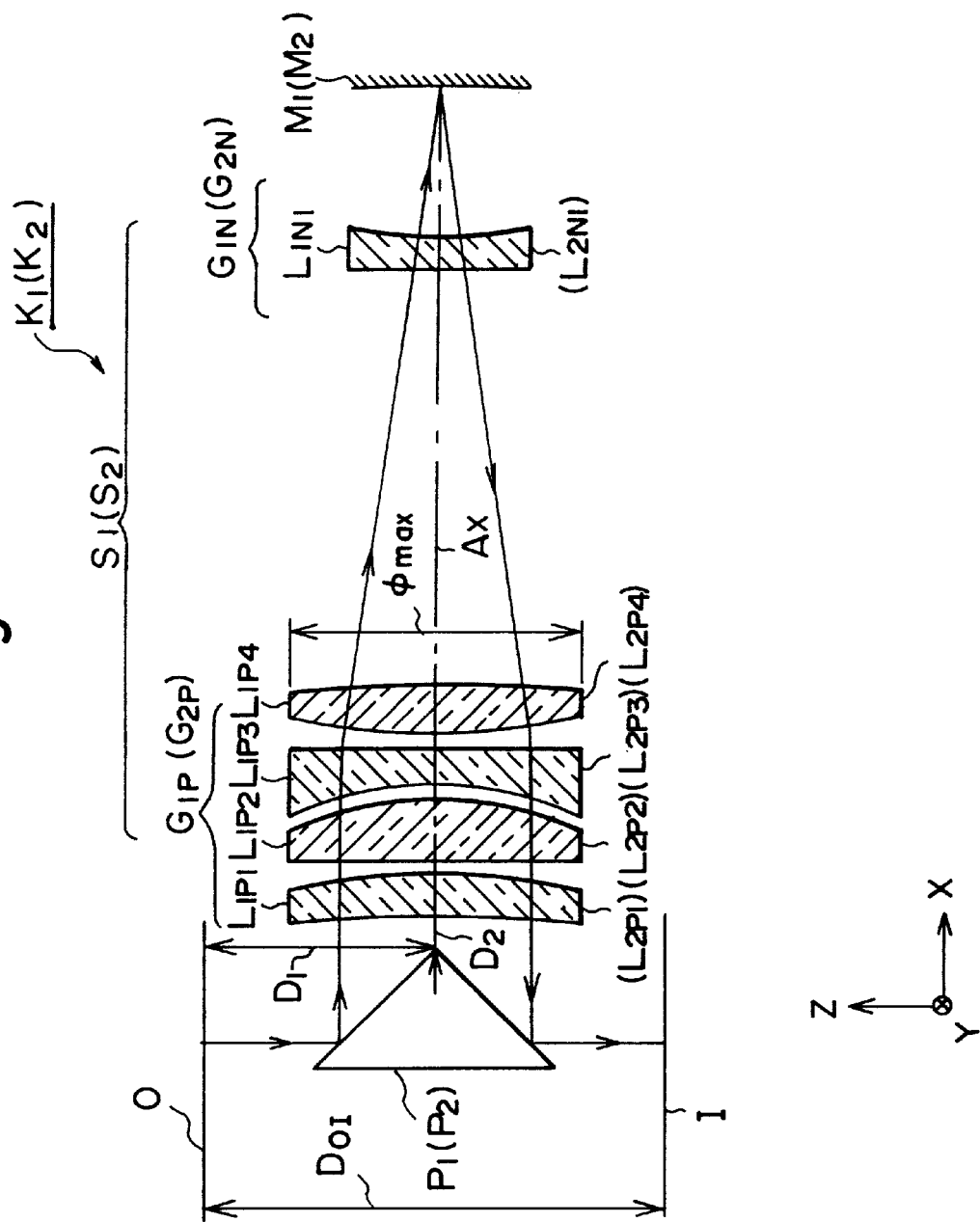
FIG. 4 is a view showing the lens arrangement of a projection optical system according to the first embodiment.

FIG. 4 is a view showing the lens arrangement of the first imaging optical system $K_1$ (or the second imaging optical system $K_2$) shown in FIG. 1. For the descriptive convenience, the lens arrangement shown in FIG. 4 will be described as that of the first imaging optical system $K_1$.

In the embodiment shown in FIG. 4, when the working distance of the first imaging optical system $K_1$ is WD, the distance from an object surface O to the vertex of the rectangular prism $P_1$ (a point on the ridgeline formed by the two reflecting surfaces perpendicular to each other) in the first imaging optical system $K_1$ (the distance from the object surface O to an optical axis AX of the first imaging optical system $K_1$) is $D_1$, the distance from the vertex of the rectangular prism $P_1$ to the vertex of the positive meniscus lens $L_{1P1}$ on the prism $P_1$ side is $D_2$, and the distance from the object surface O (mask) to an image surface I (primary image surface) is $D_{OI}$, the following relations are established:

$$WD = D_1 + D_2 \quad \text{(I)}$$

$$D_{OI} = 2D_1 \quad \text{(II)}$$

For this reason, to ensure a sufficient working distance in the first or second imaging optical system ($K_1$ or $K_2$) constituting the projection optical system, the following relation (1) is preferably satisfied when the maximum outer diameter of the first or second imaging optical system $K_1$ or $K_2$ is Φmax:

$$2(WD - D_2)/\Phi\text{max} > 1 \quad (1)$$

When relation (1) is satisfied, a sufficient space can be obtained in the Z direction of the mask 10, the plate 30, and the first and second imaging optical systems ($K_1$ and $K_2$). Therefore, a correction optical member for adjusting the optical performance including the magnification of the entire projection optical system can be arranged between the mask 10 and the first rectangular prism $P_1$, between the first rectangular prism $P_1$ and the second rectangular prism $P_2$, or between the second rectangular prism $P_2$ and the plate 30. In addition, the spatial limitation in arrangement of the stages for holding the mask 10 and the plate 30 can be largely decreased.

When the focal length of the first positive lens group $G_{1P}$ (or the second positive lens group $G_{2P}$) is $F_{GP}$, and the focal length of the first negative lens group $G_{1N}$ (or the second negative lens group $G_{2N}$) is $f_{GN}$, the first or second imaging optical system ($K_1$ or $K_2$) constituting the projection optical system preferably satisfies the following relation:

$$3 < |f_{GN}/f_{GP}| \qquad (2)$$

Relation (2) is a condition for satisfactorily correcting a spherical aberration when a sufficient working distance is ensured. If $|f_{GN}/f_{GP}|$ is below the lower limit of relation (2), the refracting power of the first negative lens group $G_{1N}$ (or the second negative lens group $G_{2N}$) becomes too strong, and the spherical aberration is undesirably excessively corrected. As for the aberration in this embodiment, the propagation direction of the light beam is defined as the positive direction.

The first or second negative lens group in the first or second imaging optical system ($K_1$ or $K_2$) constituting the projection optical system is preferably constituted by a negative meniscus lens. When the radius of curvature of the lens surface of the negative meniscus lens on the first positive lens group side (or on the second positive lens group side) is $r_{1N}$, the radius of curvature of the lens surface of the negative meniscus lens on the first concave reflecting mirror side (or on the second concave reflecting mirror side) is $r_{2N}$, and the distance on the optical axis from the image-side principal point to the first concave reflecting mirror, which image side corresponds to the first concave reflecting mirror side of the negative meniscus lens (or the distance on the optical axis from the image-side principal point to the second concave reflecting mirror, which image side corresponds to the second concave reflecting mirror side) is $L_{NM}$, the following relations are preferably satisfied:

$$-30 < q < -3 \qquad (3)$$

$$-4 < L_{NM}/TL < 0.2 \qquad (4)$$

A shape factor q is represented as $q=(r_{2N}+r_{1N})/(r_{2N}-r_{1N})$.

Relations (3) and (4) are conditions for satisfactorily correcting the spherical aberration when a sufficient working distance is ensured. If q is below the lower limit of relation (3), the spherical aberration is undesirably excessively corrected. If q exceeds the upper limit of relation (3), the spherical aberration is undesirably insufficiently corrected.

On the other hand, if $L_{NM}/TL$ is below the lower limit of relation (4), the image surface is curved in the positive direction, and the spherical aberration is undesirably excessively corrected. If $L_{NM}/TL$ exceeds the upper limit of relation (4), the image surface is curved in the negative direction, and the spherical aberration is undesirably insufficiently corrected.

To keep the image surface flat while suppressing the spherical aberration when a sufficient working distance is ensured, when the distance from the image-side principal point, which image side corresponds to the first concave reflecting mirror $M_1$ side of the first positive lens group $G_{1P}$, to the image-side principal point, which image side corresponds to the first concave reflecting mirror $M_1$ side of the first negative lens group $G_{1N}$ (or the distance from the image-side principal point, which image side corresponds to the second concave reflecting mirror $M_2$ side of the second positive lens group $G_{2P}$, to the image-side principal point, which image side corresponds to the second concave reflecting mirror $M_2$ side of the second negative lens group $G_{2N}$) is $L_{GP-GN}$, and the distance (total length) on the optical axis AX from the object surface O to the first concave reflecting mirror $M_1$ (or the second concave reflecting mirror $M_2$) is TL, the first or second imaging optical system ($K_1$ or $K_2$) constituting the projection optical system preferable satisfies the following relation:

$$0.35 < L_{GP-GN}/TL \qquad (5)$$

If $L_{GP-GN}/TL$ is below the lower limit of relation (5), the spherical aberration is insufficiently corrected, and the image surface is undesirably curved in the negative direction.

When the focal length of the first positive lens group $G_{1P}$ (or the second positive lens group $G_{2P}$) is $F_{GP}$, the distance (total length) on the optical axis AX from the object surface O to the first concave reflecting mirror $M_1$ (or the second concave reflecting mirror $M_2$) is TL, and the radius of curvature of the first concave reflecting mirror $M_1$ (or the second concave reflecting mirror $M_2$) is $r_M$, the first or second imaging optical system $K_1$ or $K_2$ constituting the projection optical system preferably satisfies the following relations:

$$0.95 < |r_M/TL| < 1.08 \qquad (6)$$

$$0.3 < f_{GP}/TL < 1.0 \qquad (7)$$

Relations (6) and (7) are conditions for suppressing the astigmatism and the curvature of field when a sufficient working distance is ensured. If $|r_M/TL|$ is below the lower limit of relation (6), the astigmatism is generated, and the image surface is undesirably curved in the negative direction. If $|r_M/TL|$ exceeds the upper limit of relation (6), the astigmatism is generated, and the image surface is undesirably curved in the positive direction. To suppress an insufficiently corrected spherical aberration, in addition to the astigmatism and the curvature of field, the upper limit of relation (6) is preferably set at 1.05, i.e., $|r_M/TL| < 1.05$.

If $f_{GP}/TL$ is below the lower limit of relation (7), the astigmatism is generated even when relation (6) is satisfied, and the image surface is undesirably curved in the negative direction. To suppress the astigmatism, the curvature of field, and the insufficiently corrected spherical aberration to obtain satisfactory imaging performance, the lower limit of relation (7) is preferably set at 0.5, i.e., $0.5 < f_{GP}/TL$. If $f_{GP}/TL$ exceeds the upper limit of relation (7), the astigmatism is generated, and the image surface is undesirably curved in the positive direction. To suppress the excessively corrected spherical aberration, in addition to the astigmatism and the curvature of field, to obtain satisfactory imaging performance, the upper limit of relation (7) is preferably set at 0.8, i.e., $f_{GP}/TL < 0.8$.

Table 1 shows the numerical data and condition correspondence values of the optical system shown in FIG. 4. Leftmost numbers represent the order from the object O side (or the primary image side) to the first concave reflecting mirror $M_1$ (the second concave reflecting mirror $M_2$); r, the radius of curvature of a lens surface or a reflecting surface; d, the distance between lens surfaces; n, the refractive index of a medium (optical material) with respect to a light beam with an exposure wavelength (g-line: 436 nm); and Φ, the outer diameter of a medium (optical material). In Table 1, WD represents the working distance of the first imaging optical system $K_1$; $D_1$, the distance from the object surface O to the vertex of the rectangular prism $P_1$ (a point on the ridgeline formed by the two reflecting surfaces perpendicular to each other) in the first imaging optical system $K_1$ (the distance from the object surface O to the optical axis AX of the first imaging optical system $K_1$); $D_2$, the distance from the vertex of the rectangular prism $P_1$ to the vertex of the positive meniscus lens $L_{1P1}$ on the rectangular prism PI side; $D_{OI}$, the distance from the object surface O (mask) to the image surface I (primary image surface); Φmax, the maximum outer diameter of the first or second imaging optical system ($K_1$ or $K_2$); $f_{GP}$, the focal length of the first positive lens group $G_{1P}$ (or the second positive lens group $G_{2P}$); $f_{GN}$, the focal length of the first negative lens group $G_{1N}$ (or the second negative lens group $G_{2N}$); TL, the distance (total length) on the optical axis AX from the object surface O to the first concave reflecting mirror $M_1$ (or the second concave reflecting mirror $M_2$); $r_M$, the radius of curvature of the first concave reflecting mirror $M_1$ (or the second concave reflecting mirror $M_2$); $r_{1N}$, the radius of curvature of the lens surface of the negative meniscus lens of the first negative lens group $G_{1N}$ on the first positive lens group $G_{1P}$ side; $r_{2N}$, the radius of curvature of the lens surface of the negative meniscus lens on the first concave reflecting mirror $M_1$ side; $L_{NM}$, the distance on the optical axis from the image-side principal point to the first concave reflecting mirror $M_1$, which image side corresponds to the first concave reflecting mirror $M_1$ side of the negative meniscus lens; and $L_{GP-GN}$, the distance from the image-side principal point, which image side corresponds to the first concave reflecting mirror $M_1$ side of the first positive lens group $G_{1P}$, to the image-side principal point, which image side corresponds to the first concave reflecting mirror $M_1$ side of the first negative lens group $G_{1N}$.

TABLE 1

First Embodiment

WD = 2.33
$D_1$ = 2.06
$D_2$ = 0.27
$D_{OI}$ = 4.12
TL = 9.66

| | r | d | n | Φ | Optical Member |
|---|---|---|---|---|---|
| 0 | | 2.33 | 1.00000 | | |
| 1 | −11.87 | 0.38 | 1.60384 | 2.7 | $L_{1P1}$ ($L_{2P1}$) |
| 2 | −5.42 | 0.05 | 1.00000 | | |
| 3 | −85.84 | 0.55 | 1.50332 | 2.7 | $L_{1P2}$ ($L_{2P2}$) |
| 4 | −3.00 | 0.08 | 1.00000 | | |
| 5 | −2.94 | 0.33 | 1.60384 | 2.7 | $L_{1P3}$ ($L_{2P3}$) |
| 6 | −18.79 | 0.05 | 1.00000 | | |
| 7 | 6.80 | 0.44 | 1.50332 | 2.7 | $L_{1P4}$ ($L_{2P4}$) |
| 8 | −10.44 | 3.77 | 1.00000 | | |
| 9 | 7.63 | 0.33 | 1.52670 | 1.7 | $L_{1N1}$ ($L_{2N1}$) |
| 10 | 5.47 | 1.35 | 1.00000 | | |
| 11 | −9.94 | | −1.00000 | 1.3 | $M_1$ ($M_2$) |

Condition Correspondence Values (1) 2(WD − $D_2$)/Φmax = 1.53
(2) |$f_{GN}/f_{GP}$| = 6.55
(3) q = −6.06
(4) $L_{NM}$/TL = 0.0795
(5) $L_{GP-GN}$/TL = 0.529
(6) |$r_M$/TL| = 1.03
(7) $f_{GP}$/TL = 0.613

In Table 1, an image height Y is 1.0, and a numerical aperture N.A on the image side is 0.1. The 0th surface corresponds to the object surface or the image surface.

The optical system shown in Table 1 satisfies relation (1) so that a sufficient working distance is ensured.

Figure 5:
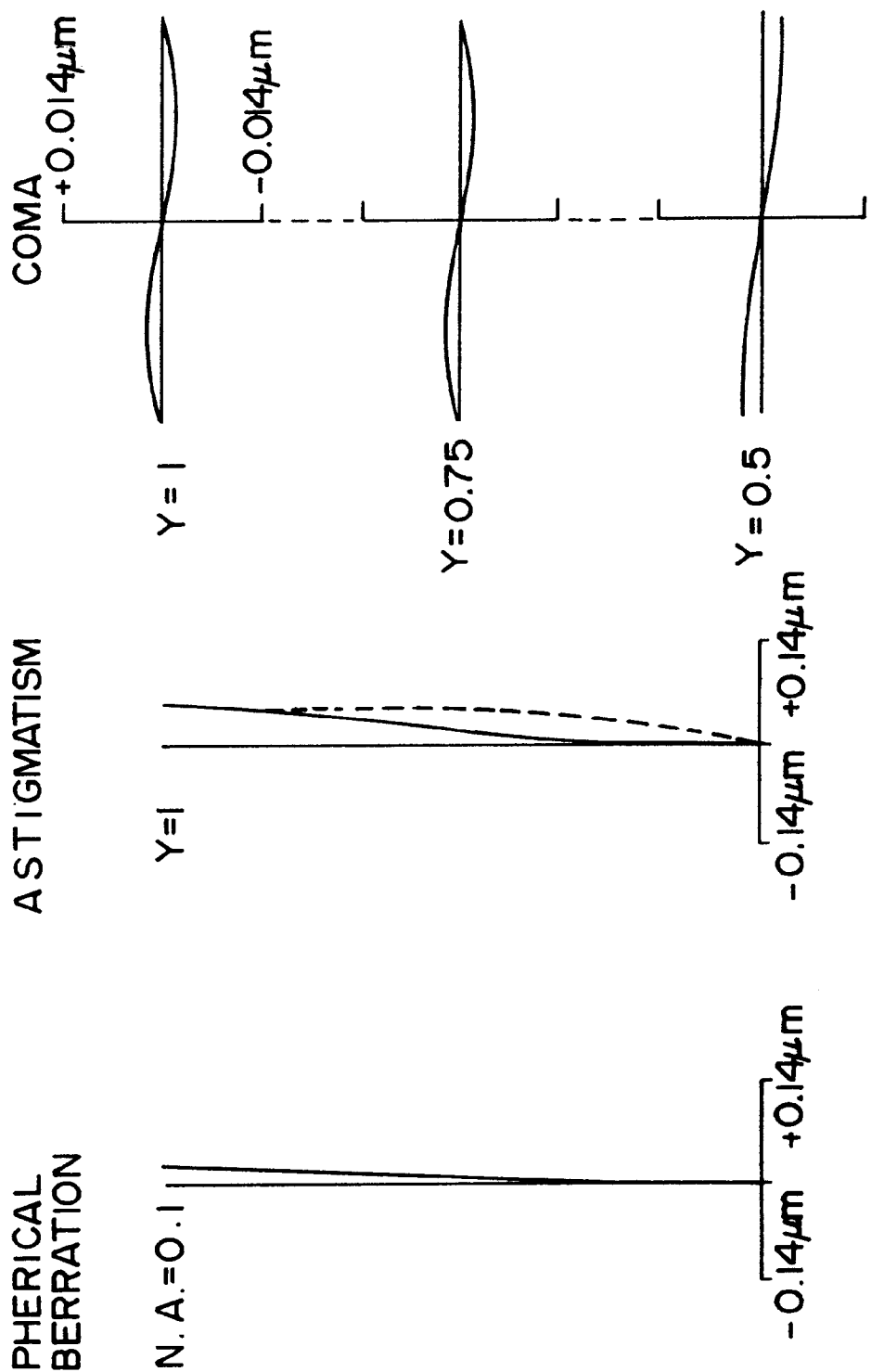
FIGS. 5A, 5B and 5C are views showing various aberrations of the projection optical system shown in FIG. 4.

FIGS. 5A, 5B and 5C show various aberrations caused by the light beam with an exposure wavelength (g-line: 436 nm) of the embodiment shown in FIG. 4. Comas shown in FIG. 5C are represented by aberration curves at image heights of 1, 0.75, and 0.5. The scale of a coma at each image height is ±0.014 μm. As is apparent from various aberrations shown in FIGS. 5A, 5B and 5C, the various aberrations are corrected in a good balance.

The embodiment shown in FIG. 4 can be regarded as an advanced Dyson optical system. As a comparative example for the embodiment shown in FIG. 4, a Dyson optical system having a thick-walled plano-convex lens $L_P$ and a concave reflecting mirror M.

Figure 6:
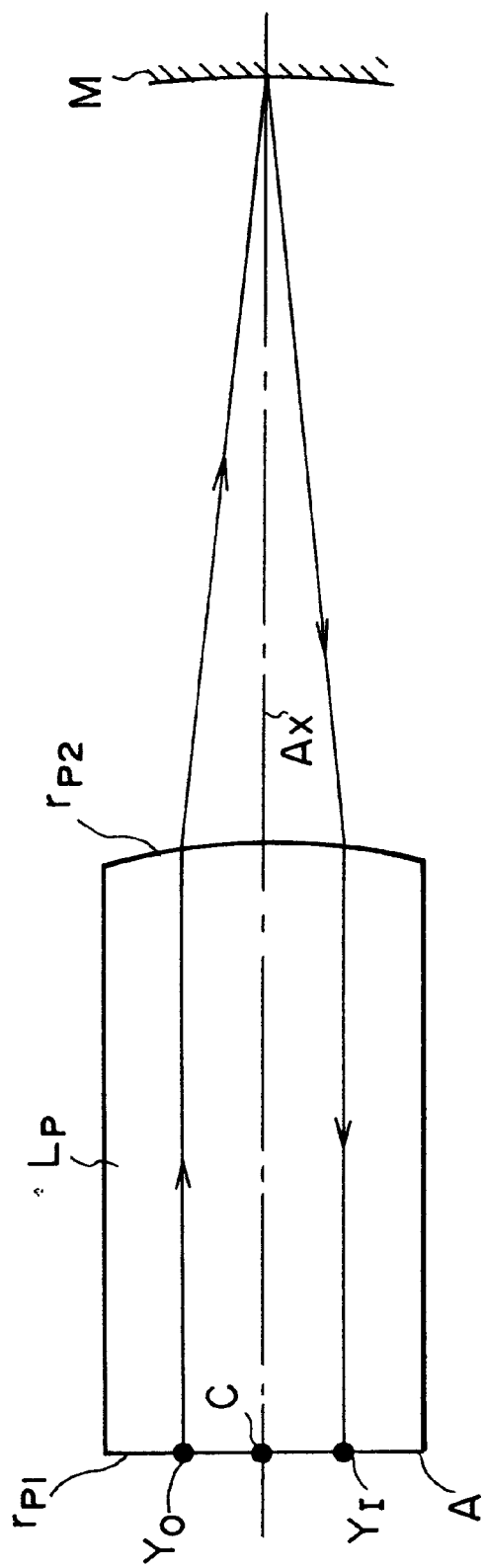
FIG. 6 is a view showing the lens arrangement of a projection optical system constituted as a Dyson optical system.

As shown in FIG. 6, the plano-convex lens $L_P$ is arranged such that a plane $r_{P1}$ matches an object surface A (object plane), and a center of curvature C of a lens surface $r_{P2}$ of the plano-convex lens $L_P$ matches the intersection of the object surface A and the optical axis AX of the Dyson optical system. The concave reflecting mirror M is arranged at the rear focal position of the plano-convex lens $L_P$ such that the center of curvature of the reflecting surface of the concave reflecting mirror M matches the center of curvature C of the lens surface $r_{P2}$ of the plano-convex lens $L_P$.

With this arrangement, as shown in FIG. 6, a light beam almost parallel to the optical axis AX and incident from an object point $Y_0$ on the object surface A on the plano-convex lens $L_P$ is refracted by the refracting surface $r_{P2}$ of the plano-convex lens $L_P$ and reaches the concave reflecting mirror M. The light beam reflected by the concave reflecting mirror M is refracted by the refracting surface $r_{P2}$ of the plano-convex lens $L_P$ again to become almost parallel to the optical axis AX, and reaches an image point $Y_I$ on the object surface A. The image of the object point $Y_0$ is formed at this image point $Y_I$.

Table 2 shows the numerical data of the Dyson optical system shown in FIG. 6, which has almost the same performance as that of the optical system of this embodiment shown in Table 1. Leftmost numbers represent the order from the object O side to the concave reflecting mirror M; r, the radius of curvature of a lens surface or a reflecting surface; d, the distance between lens surfaces; n, the refractive index of a medium (optical material) with respect to a light beam with an exposure wavelength (g-line: 436 nm); and Φ, the outer diameter of a medium (optical material).

TABLE 2

| | r | d | n | Φ | Optical Member |
|---|---|---|---|---|---|
| 0 | | 0 | 1.60384 | | |
| 1 | ∞ | 21.92 | 1.60384 | 4.8 | $L_P$ |
| 2 | −21.92 | 36.30 | 1.00000 | | |
| 3 | 58.22 | | −1.00000 | 7.4 | M |

When the distance from the object surface (object plane) or the image surface (image plane) to the concave reflecting mirror is the total length TL of the optical system, the total length TL of the first and second imaging optical systems ($K_1$ and $K_2$) of this embodiment shown in FIG. 1 is 9.66, and the total length TL of the Dyson optical system shown in Table 2 is 58.22. The total length of the Dyson optical system in FIG. 6 is as large as about six times that of the first and second imaging optical systems ($K_1$ and $K_2$) of this embodiment shown in FIG. 4. The outer diameters of the plano-convex lens $L_P$ and the concave reflecting mirror M in the Dyson optical system largely increase accordingly.

In the Dyson optical system shown in FIG. 6, therefore, when the projection optical system is constituted by combining the two optical systems, the size and manufacturing cost of the apparatus inconveniently increase.

In the Dyson optical system shown in FIG. 6, the object surface (object plane) and the image surface (image plane) match the plane $r_{P1}$ of the plano-convex lens $L_P$. For this reason, even when, e.g., a mask is set on the object surface (object plane), and, e.g., a plate is set on the image surface (image plane), scanning exposure can hardly be performed.

The plano-convex lens $L_P$ in the Dyson optical system shown in FIG. 6 can be made thin to obtain the working distance WD corresponding to the air conversion length. However, in this technique, a large spherical aberration and a large chromatic aberration are generated. It is difficult to sufficiently correct these aberrations because of the degree of freedom of aberration correction. Therefore, in the Dyson optical system shown in FIG. 6, no sufficient working distance can be ensured.

To the contrary, in this embodiment shown in FIG. 4, to sufficiently decrease the total length TL of the first and second imaging optical systems ($K_1$ and $K_2$) (the total length of the projection optical system), the radii of curvature of the concave reflecting mirrors ($M_1$ and $M_2$) are decreased. A light beam incident from a position higher than the optical axis on the first positive lens group $G_1$ or the second positive lens group $G_{2P}$ must be largely refracted by the first positive lens group $G_{1P}$ or the second positive lens group $G_{2P}$, so various large aberrations are generated. To ensure the degree of freedom of aberration correction, each of the first positive lens group $G_{1P}$ and the second positive lens group $G_{2P}$ is constituted by about four lenses. To achieve size reduction of the optical system, each of the first positive lens group $G_{1P}$ and the second positive lens group $G_{2P}$ is preferably constituted by about three to seven lenses.

In the first or second imaging optical system ($K_1$ or $K_2$) of this embodiment shown in FIG. 4, an excessively corrected spherical aberration tends to be generated in the first positive lens group $G_{1P}$ or the second positive lens group $G_{2P}$. In this embodiment, to satisfactorily correct the excessively corrected spherical aberration, the first negative lens group $G_{1N}$ (or the second negative lens group $G_{2N}$) having a negative refracting power is arranged in the optical path between the first positive lens group $G_{1P}$ (or the second positive lens group $G_{2P}$) and the first concave reflecting mirror $M_1$ (or the second concave reflecting mirror $M_2$). Particularly, to obtain the effective function of the first negative lens group $G_{1N}$ (or the second negative lens group $G_{2N}$) to correct the excessively corrected spherical aberration generated in the first positive lens group $G_{1P}$ (or the second positive lens group $G_{2P}$), a negative meniscus lens arranged at a position closer to the first concave reflecting mirror $M_1$ (or the second concave reflecting mirror $M_2$) is preferably included. In the first or second imaging optical system ($K_1$ or $K_2$) of this embodiment shown in FIG. 4 as well, the first negative lens group $G_{1N}$ (or the second negative lens group $G_{2N}$) has an arrangement including a negative meniscus lens arranged at a position closer to the first concave reflecting mirror $M_1$ (or the second concave reflecting mirror $M_2$).

As described above, according to the first and second imaging optical systems ($K_1$ and $K_2$) of this embodiment shown in FIG. 4, a compact projection optical system having excellent imaging performance can be realized at a low cost while ensuring the sufficient working distance WD. Therefore, a relatively compact and high-performance scanning exposure apparatus capable of performing an exposure operation in a large exposure area can be obtained.

An example of the first and second imaging optical systems ($K_1$ and $K_2$) has been described above with reference to FIG. 4. A projection optical system according to the second embodiment will be described below with reference to FIG. 7.

FIG. 7 is a view showing the lens arrangement of a first imaging optical system $K_1$ (or a second imaging optical system $K_2$) shown in FIG. 1 according to the second embodiment. For the descriptive convenience, the lens arrangement shown in FIG. 7 will be described as that of the first imaging optical system $K_1$.

As shown in FIG. 7, the first imaging optical system $K_1$ (or the second imaging optical system $K_2$) has a first refraction optical system $S_1$ (or a second refraction optical system $S_2$) consisting of a first positive lens group $G_{1P}$ (or a second positive lens group $G_{2P}$) and a first negative lens group $G_{1N}$ (or a second negative lens group $G_{2N}$), and a first concave reflecting mirror $M_1$ (or a second concave reflecting mirror $M_2$). For the descriptive convenience, in FIG. 7, a first rectangular prism $P_1$ (or a second rectangular prism $P_2$) arranged on the left side of the first refraction optical system $S_1$ (or the second refraction optical system $S_2$) is not illustrated.

As shown in FIG. 7, the first positive lens group $G_{1P}$ (or the second positive lens group $G_{2P}$) comprises a positive lens $L_{1P1}$ having its surface with a larger curvature facing the first concave reflecting mirror $M_1$ side (or a positive lens $L_{2P1}$ having its surface with a larger curvature facing the second concave reflecting mirror $M_2$ side), a negative meniscus lens $L_{1P2}$ having its convex surface facing the first concave reflecting mirror $M_1$ side (or a negative meniscus lens $L_{2P2}$ having its convex surface facing the second concave reflecting mirror $M_2$ side), a biconvex positive lens $L_{1P3}$ (or a biconvex positive lens $L_{2P3}$), and a negative lens $L_{1P4}$ (or a negative lens $L_{2P4}$). The first negative lens group $G_{1N}$ (or the second negative lens group $G_{2N}$) comprises only a negative meniscus lens $L_{2N1}$ having its convex surface facing the first positive lens group $G_1$ side (or a negative meniscus lens $L_{2N1}$ having its convex surface facing the second positive lens group $G_{2P}$ side).

Table 3 shows the numerical data of the optical system shown in FIG. 7. Leftmost numbers represent the order from an object O side (or the primary image side) to the first concave reflecting mirror $M_1$ (or the second concave reflecting mirror $M_2$); r, the radius of curvature of a lens surface or a reflecting surface; d, the distance between lens surfaces; n, the refractive index of a medium (optical material) with respect to a light beam with an exposure wavelength (g-line: 436 nm); and Φ, the outer diameter of a medium (optical material). In Table 3, WD represents the working distance of the first imaging optical system $K_1$; $D_1$, the distance from the object surface O to the vertex of the rectangular prism $P_1$ (a point on the ridgeline formed by the two reflecting surfaces perpendicular to each other) in the first imaging optical system $K_1$ (the distance from the object surface O to an optical axis AX of the first imaging optical system $K_1$); $D_2$, the distance from the vertex of the rectangular prism $P_1$ to the vertex of the positive meniscus lens $L_{1P1}$ on the prism $P_1$ side; $D_{OI}$, the distance from the object surface O (mask) to an image surface I (primary image surface); Φmax, the maximum outer diameter of the first or second imaging optical system ($K_1$ or $K_2$); $f_{GP}$ the focal length of the first positive lens group $G_{1P}$ (or the second positive lens group $G_{2P}$); $f_{GN}$, the focal length of the first negative lens group $G_{1N}$ (or the second negative lens group $G_{2N}$); TL, the distance (total length) on the optical axis AX from the object surface O to the first concave reflecting mirror $M_1$ (or the second concave reflecting mirror $M_2$); $r_M$, the radius of curvature of the first concave reflecting mirror $M_1$ (or the second concave reflecting mirror $M_2$); $r_{1N}$, the radius of curvature of the lens surface of the negative meniscus lens of the first negative lens group $G_{1N}$ on the first positive lens group $G_{1P}$ side; $r_{2N}$, the radius of curvature of the lens surface of the negative meniscus lens on the first concave reflecting mirror $M_1$ side; $L_{NM}$, the distance on the optical axis from the image-side principal point to the first concave reflecting mirror $M_1$, which image side corresponds to the first concave reflecting mirror $M_1$ side of the negative meniscus lens; and $L_{GP-GN}$, the distance from the image-side principal point, which image side corresponds to the first concave reflecting mirror $M_1$ side of the first positive lens group $G_{1P}$, to the image-side principal point, which image side corresponds to the first concave reflecting mirror $M_1$ side of the first negative lens group $G_{1N}$.

TABLE 3

Second Embodiment

WD = 2.33
$D_1$ = 2.06
$D_2$ = 0.27
$D_{OI}$ = 4.12
TL = 10.55

| | r | d | n | Φ | Optical Member |
|---|---|---|---|---|---|
| 0 | | 2.33 | 1.00000 | | |
| 1 | 230.38 | 0.58 | 1.50332 | 2.7 | $L_{1P1}$ ($L_{2P1}$) |
| 2 | −3.66 | 0.11 | 1.00000 | | |
| 3 | −2.93 | 0.38 | 1.60384 | 2.7 | $L_{1P2}$ ($L_{2P2}$) |
| 4 | −4.40 | 0.05 | 1.00000 | | |
| 5 | 12.74 | 0.55 | 1.50332 | 2.7 | $L_{1P3}$ ($L_{2P3}$) |
| 6 | −5.27 | 0.05 | 1.00000 | | |
| 7 | −8.29 | 0.38 | 1.60384 | 2.7 | $L_{1P4}$ ($L_{2P4}$) |
| 8 | −41.15 | 4.25 | 1.00000 | | |
| 9 | 11.17 | 0.33 | 1.52670 | 1.8 | $L_{1N1}$ ($L_{2N1}$) |
| 10 | 8.23 | 1.53 | 1.00000 | | |
| 11 | −10.78 | | −1.00000 | 1.6 | $M_1$ ($M_2$) |

Condition Correspondence Values of Second Embodiment (1) $2(WD - D_2)/\Phi max = 1.53$
(2) $|f_{GN}/f_{GP}| = 9.19$
(3) $q = -6.06$
(4) $L_{NM}/TL = 0.0860$
(5) $L_{GP-GN}/TL = 0.551$
(6) $|r_M/TL| = 1.02$
(7) $f_{GP}/TL = 0.636$ In Table 3, an image height Y is 1.0, and a numerical aperture N.A on the image side is 0.1. The 0th surface corresponds to the object surface or the image surface.

The optical system shown in Table 3 satisfies relation (1) so that a sufficient working distance is ensured.

The total length TL of the first and second imaging optical systems ($K_1$ and $K_2$) of the embodiment shown in Table 3 is 10.54, and the total length TL of the Dyson optical system shown in Table 2 is 58.22. Therefore, the total length of the embodiment shown in Table 3 is as small as about 1/6 that of the Dyson optical system in FIG. 6.

FIGS. 8A, 8B and 8C show various aberrations caused by the light beam with an exposure wavelength (g-line: 436 nm) of the embodiment shown in FIG. 7. Comas shown in FIG. 8C are represented by aberration curves at image heights of 1, 0.75, and 0.5. The scale of a coma at each image height is ±0.014 μm. As is apparent from various aberrations shown in FIGS. 8A, 8B and 8C, the various aberrations are corrected in a good balance.

A first imaging optical system $K_1$ (or a second imaging optical system $K_2$) constituting a projection optical system according to the third embodiment will be described below with reference to FIG. 9.

FIG. 9 is a view showing the lens arrangement of the first imaging optical system $K_1$ (or the second imaging optical system $K_2$) shown in FIG. 1 according to the third embodiment. For the descriptive convenience, the lens arrangement shown in FIG. 9 will be described as that of the first imaging optical system $K_1$.

As shown in FIG. 9, the first imaging optical system $K_1$ (or the second imaging optical system $K_2$) has a first refraction optical system $S_1$ (or a second refraction optical system $S_2$) consisting of a first positive lens group $G_{1P}$ (or a second positive lens group $G_{2P}$) and a first negative lens group $G_{1N}$ (or a second negative lens group $G_{2N}$), and a first concave reflecting mirror $M_1$ (or a second concave reflecting mirror $M_2$). For the descriptive convenience, in FIG. 9, a first rectangular prism $P_1$ (or a second rectangular prism $P_2$) arranged on the left side of the first refraction optical system $S_1$ (or the second refraction optical system $S_2$) is not illustrated.

As shown in FIG. 9, the first positive lens group $G_{1P}$ (or the second positive lens group $G_{2P}$) comprises a positive meniscus lens $L_{1P1}$ having its convex surface facing the first concave reflecting mirror $M_1$ side (or a positive meniscus lens $L_{2P1}$ having its convex surface facing the second concave reflecting mirror $M_2$ side), a positive meniscus lens $L_{1P2}$ having its convex surface facing the first concave reflecting mirror $M_1$ side (or a positive meniscus lens $L_{2P2}$ having its convex surface facing the second concave reflecting mirror $M_2$ side), and a negative meniscus lens $L_{1P3}$ having its convex surface facing the first concave reflecting mirror $M_1$ side (or a negative meniscus lens $L_{2P3}$ having its convex surface facing the second concave reflecting mirror $M_2$ side). The first negative lens group $G_{1N}$ (or the second negative lens group $G_{2N}$) comprises a biconvex positive lens $L_{1N1}$ (or a biconvex positive lens $L_{2N1}$), and a negative meniscus lens $L_{1N2}$ bonded to the first concave reflecting mirror $M_1$ and having its concave surface facing the first positive lens group $G_{1P}$ side (or a negative meniscus lens $L_{2N2}$ bonded to the second concave reflecting mirror $M_2$ and having its concave surface facing the second positive lens group $G_{2P}$ side).

Table 4 shows the numerical data of the optical system shown in FIG. 9. Leftmost numbers represent the order from an object O side (or the primary image side) to the first concave reflecting mirror $M_1$ (or the second concave reflecting mirror $M_2$); r, the radius of curvature of a lens surface or a reflecting surface; d, the distance between lens surfaces; n, the refractive index of a medium (optical material) with respect to a light beam with an exposure wavelength (g-line: 436 nm); and Φ, the outer diameter of a medium (optical material). In Table 4, WD represents the working distance of the first imaging optical system $K_1$; $D_1$, the distance from the object surface O to the vertex of the rectangular prism $P_1$ (a point on the ridgeline formed by the two reflecting surfaces perpendicular to each other) in the first imaging optical system $K_1$ (the distance from the object surface O to an optical axis AX of the first imaging optical system $K_1$); $D_2$, the distance from the vertex of the rectangular prism $P_1$ to the vertex of the positive meniscus lens $L_{1P1}$ on the prism $P_1$ side; $D_{OI}$, the distance from the object surface O (mask) to an image surface I (primary image surface); φmax, the maximum outer diameter of the first or second imaging optical system ($K_1$ or $K_2$); $f_{GP}$, the focal length of the first positive lens group $G_{1P}$ (or the second positive lens group $G_{2P}$); $f_{GN}$, the focal length of the first negative lens group $G_{1N}$ (or the second negative lens group $G_{2N}$); TL, the distance (total length) on the optical axis AX from the object surface O to the first concave reflecting mirror $M_1$ (or the second concave reflecting mirror $M_2$); $r_M$, the radius of curvature of the first concave reflecting mirror $M_1$ (or the second concave reflecting mirror $M_2$); and $L_{GP\text{-}GN}$, the distance from the image-side principal point, which image side corresponds to the first concave reflecting mirror $M_1$ side of the first positive lens group $G_{1P}$, to the image-side principal point, which image side corresponds to the first concave reflecting mirror $M_1$ side of the first negative lens group $G_{1N}$.

TABLE 4

Third Embodiment

WD = 2.11
$D_1$ = 1.84
$D_2$ = 0.27
$D_{OI}$ = 3.68
TL = 12.26

| | r | d | n | Φ | Optical Member |
|---|---|---|---|---|---|
| 0 | | 2.11 | 1.00000 | | |
| 1 | −14.36 | 0.49 | 1.50332 | 2.7 | $L_{1P1}$ ($L_{2P1}$) |
| 2 | −6.93 | 0.05 | 1.00000 | | |
| 3 | −23.94 | 0.49 | 1.60384 | 2.7 | $L_{1P2}$ ($L_{2P2}$) |
| 4 | −4.34 | 0.11 | 1.00000 | | |
| 5 | −3.72 | 0.41 | 1.50332 | 2.7 | $L_{1P3}$ ($L_{2P3}$) |
| 6 | −4.84 | 5.39 | 1.00000 | | |
| 7 | 244.04 | 0.41 | 1.60384 | 2.7 | $L_{1N1}$ ($L_{2N1}$) |
| 8 | −6.26 | 2.47 | 1.00000 | | |
| 9 | −4.83 | 0.33 | 1.52670 | 1.6 | $L_{1N2}$ ($L_{2N2}$) |
| 10 | −12.71 | | 1.00000 | 1.6 | $M_1$ ($M_2$) |

Condition Correspondence Values of Third Embodiment (1) $2(WD − D_2)/\Phi max$ = 1.36
(2) $|f_{GN}/f_{GP}|$ = 24.2
(5) $L_{GP\text{-}GN}/TL$ = 6.51
(6) $|r_M/TL|$ = 1.04
(7) $f_{GP}/TL$ = 0.777

In Table 4, an image height Y is 1.0, and a numerical aperture N.A on the image side is 0.1. The 0th surface corresponds to the object surface or the image surface.

The optical system shown in Table 4 satisfies relation (1) so that a sufficient working distance is ensured.

The total length TL of the first and second imaging optical systems ($K_1$ and $K_2$) of the embodiment shown in Table 4 is 12.26, and the total length TL of the Dyson optical system shown in Table 2 is 58.22. Therefore, the total length of the embodiment shown in Table 4 is as small as about ⅕ that of the Dyson optical system in FIG. 6.

FIGS. 10A, 10B and 10C show various aberrations caused by the light beam with an exposure wavelength (g-line: 436 nm) of the embodiment shown in FIG. 9. Comas shown in FIG. 10C are represented by aberration curves at image heights of 1, 0.75, and 0.5. The scale of a coma at each image height is ±0.014 μm. As is apparent from various aberrations shown in FIGS. 10A, 10B and 10C, the various aberrations are corrected in a good balance.

A first imaging optical system $K_1$ (or a second imaging optical system $K_2$) constituting a projection optical system according to the fourth embodiment will be described below with reference to FIG. 11.

FIG. 11 is a view showing the lens arrangement of the first imaging optical system $K_1$ (or the second imaging optical system $K_2$) shown in FIG. 1 according to the fourth embodiment. For the descriptive convenience, the lens arrangement shown in FIG. 11 will be described as that of the first imaging optical system $K_1$.

As shown in FIG. 11, the first imaging optical system $K_1$ (or the second imaging optical system $K_2$) has a first refraction optical system $S_1$ (or a second refraction optical system $S_2$) consisting of a first positive lens group $G_{1P}$ (or a second positive lens group $G_{2P}$) and a first negative lens group $G_{1N}$ (or a second negative lens group $G_{2N}$), and a first concave reflecting mirror $M_1$ (or a second concave reflecting mirror $M_2$). For the descriptive convenience, in FIG. 11, a first rectangular prism $P_1$ (or a second rectangular prism $P_2$) arranged on the left side of the first refraction optical system $S_1$ (or the second refraction optical system $S_2$) is not illustrated.

As shown in FIG. 11, the first positive lens group $G_{1P}$ (or the second positive lens group $G_{2P}$) comprises a positive lens $L_{1P1}$ having its surface with a larger curvature facing the first concave reflecting mirror $M_1$ side (or a positive lens $L_{2P1}$ having its surface with a larger curvature facing the second concave reflecting mirror $M_2$ side), a biconcave negative lens $L_{1P2}$ (or a biconcave negative lens $L_{2P2}$), a biconvex positive lens $L_{1P3}$ (or a biconvex positive lens $L_{2P3}$), and a biconcave positive lens $L_{1P4}$ (or a biconcave positive lens $L_{2P4}$). The first negative lens group $G_{1N}$ (or the second negative lens group $G_{2N}$) comprises a negative meniscus lens $L_{1N1}$ having its convex surface facing the first positive lens group $G_{1P}$ side (or a negative meniscus lens $L_{2N1}$ having its convex surface facing the second positive lens group $G_{2P}$ side).

Table 5 shows the numerical data of the optical system shown in FIG. 11. Leftmost numbers represent the order from an object O side (or the primary image side) to the first concave reflecting mirror $M_1$ (or the second concave reflecting mirror $M_2$); r, the radius of curvature of a lens surface or a reflecting surface; d, the distance between lens surfaces; n, the refractive index of a medium (optical material) with respect to a light beam with an exposure wavelength (g-line: 436 nm); and Φ, the outer diameter of a medium (optical material). In Table 5, WD represents the working distance of the first imaging optical system $K_1$; $D_1$, the distance from the object surface O to the vertex of the rectangular prism $P_1$ (a point on the ridgeline formed by the two reflecting surfaces perpendicular to each other) in the first imaging optical system $K_1$ (the distance from the object surface O to an optical axis AX of the first imaging optical system $K_1$); $D_2$, the distance from the vertex of the rectangular prism $P_1$ to the vertex of the positive meniscus lens $L_{1P1}$ on the prism $P_1$ side; $D_{OI}$, the distance from the object surface O (mask) to an image surface I (primary image surface); Φmax, the maximum outer diameter of the first or second imaging optical system ($K_1$ or $K_2$); $f_{GP}$, the focal length of the first positive lens group $G_{1P}$ (or the second positive lens group $G_2P$); $f_{GN}$, the focal length of the first negative lens group $G_{1N}$ (or the second negative lens group $G_{2N}$); TL, the distance (total length) on the optical axis AX from the object surface O to the first concave reflecting mirror $M_1$ (or the second concave reflecting mirror $M_2$); $r_M$, the radius of curvature of the first concave reflecting mirror $M_1$ (or the second concave reflecting mirror $M_2$); $r_{1N}$, the radius of curvature of the lens surface of the negative meniscus lens of the first negative lens group $G_{1N}$ on the first positive lens group $G_{1P}$ side; $r_{2N}$, the radius of curvature of the lens surface of the negative meniscus lens on the first concave reflecting mirror $M_1$ side; $L_{NM}$, the distance on the optical axis from the image-side principal point to the first concave reflecting mirror $M_1$, which image side corresponds to the first concave reflecting mirror $M_1$ side of the negative meniscus lens; and $L_{GP\text{-}GN}$, the distance from the image-side principal point, which image side corresponds to the first concave reflecting mirror $M_1$ side of the first positive lens group $G_{1P}$, to the image-side principal point, which image side corresponds to the first concave reflecting mirror $M_1$ side of the first negative lens group $G_{1N}$.

TABLE 5

Fourth Embodiment

WD = 2.14
$D_1$ = 1.87
$D_2$ = 0.27
$D_{OI}$ = 3.74
TL = 11.06

|    | r      | d    | n        | Φ   | Optical Member |
|----|--------|------|----------|-----|----------------|
| 0  |        | 2.14 | 1.00000  |     |                |
| 1  | 27.29  | 0.52 | 1.50332  | 2.8 | $L_{1P1}$ ($L_{2P1}$) |
| 2  | −2.91  | 0.05 | 1.00000  |     |                |
| 3  | −2.82  | 0.33 | 1.60384  | 2.8 | $L_{1P2}$ ($L_{2P2}$) |
| 4  | 7.51   | 0.08 | 1.00000  |     |                |
| 5  | 7.26   | 0.55 | 1.50332  | 2.8 | $L_{1P3}$ ($L_{2P3}$) |
| 6  | −7.27  | 0.05 | 1.00000  |     |                |
| 7  | 24.14  | 0.47 | 1.60384  | 2.8 | $L_{1N1}$ ($L_{2N1}$) |
| 8  | −7.46  | 5.40 | 1.00000  |     |                |
| 9  | 15.84  | 0.33 | 1.52670  | 1.8 | $L_{1N2}$ ($L_{2N2}$) |
| 10 | 10.07  | 1.14 | 1.00000  |     |                |
| 11 | −11.18 |      | −1.00000 | 1.5 | $M_1$ ($M_2$)  |

Condition Correspondence Values of Fourth Embodiment (1) 2(WD − $D_2$)/Φmax = 1.34
(2) |$f_{GN}/f_{GP}$| = 7.68
(3) q = −4.49
(4) $L_{NM}$/TL = 0.0688
(5) $L_{GP\text{-}GN}$/TL = 0.561
(6) |$r_M$/TL| = 1.01
(7) $f_{GP}$/TL = 0.629

In Table 5, an image height Y is 1.0, and a numerical aperture N.A on the image side is 0.1. The 0th surface corresponds to the object surface or the image surface.

The optical system shown in Table 5 satisfies relation (1) so that a sufficient working distance is ensured.

The total length TL of the first and second imaging optical systems ($K_1$ and $K_2$) of the embodiment shown in Table 5 is 11.06, and the total length TL of the Dyson optical system shown in Table 2 is 58.22. Therefore, the total length of the embodiment shown in Table 5 is as small as about ⅕ that of the Dyson optical system in FIG. 6.

FIGS. 12A, 12B and 12C show various aberrations caused by the light beam with an exposure wavelength (g-line: 436 nm) of the embodiment shown in FIG. 11. Comas shown in FIG. 12C are represented by aberration curves at image heights of 1, 0.75, and 0.5. The scale of a coma at each image height is ±0.014 μm. As is apparent from various aberrations shown in FIGS. 12A, 12B and 12C, the various aberrations are corrected in a good balance.

A first imaging optical system $K_1$ (or a second imaging optical system $K_2$) according to the fifth embodiment will be described below with reference to FIG. 13.

Figure 13:
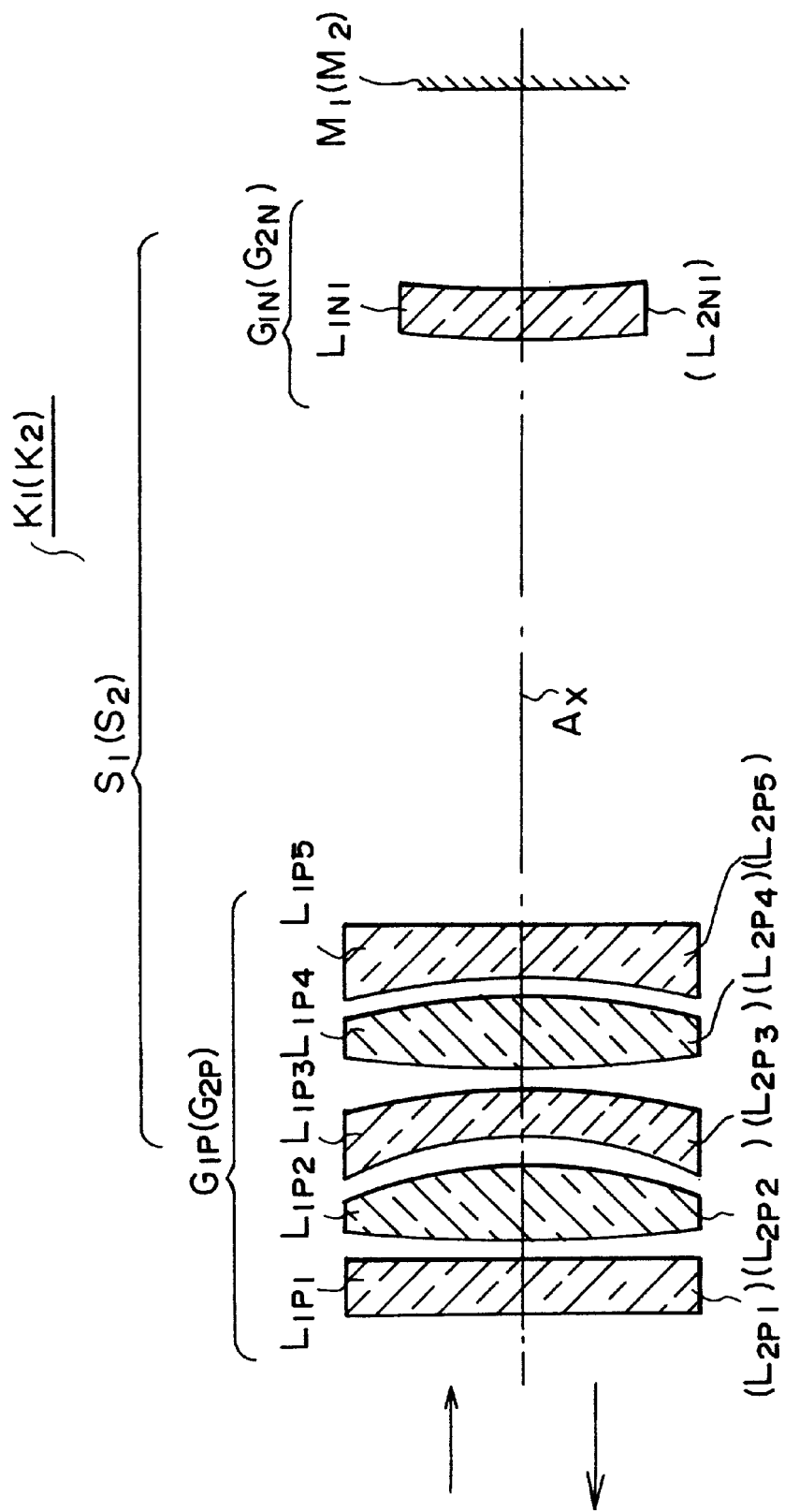
FIG. 13 is a view showing the lens arrangement of a projection optical system according to the fifth embodiment.

FIG. 13 is a view showing the lens arrangement of the first imaging optical system $K_1$ (the a second imaging optical system $K_2$) shown in FIG. 1 according to the fifth embodiment. For the descriptive convenience, the lens arrangement shown in FIG. 13 will be described as that of the first imaging optical system $K_1$.

As shown in FIG. 13, the first imaging optical system $K_1$ (or the second imaging optical system $K_2$) has a first refraction optical system $S_1$ (or a second refraction optical system $S_2$) consisting of a first positive lens group $G_{1P}$ (or a second positive lens group $G_{2P}$) and a first negative lens group $G_{1N}$ (or a second negative lens group $G_{2N}$), and a first concave reflecting mirror $M_1$ (or a second concave reflecting mirror $M_2$). For the descriptive convenience, in FIG. 13, a first rectangular prism $P_1$ (or a second rectangular prism $P_2$) arranged on the left side of the first refraction optical system $S_1$ (or the second refraction optical system $S_2$) is not illustrated.

As shown in FIG. 13, the first positive lens group $G_{1P}$ (or the second positive lens group $G_{2P}$) comprises a biconcave negative lens $L_{1P1}$ having a weak refracting power (or a biconcave negative lens $L_{2P1}$ having a weak refracting power), a biconvex positive lens $L_{1P2}$ (or a biconvex positive lens $L_{2P2}$), a negative meniscus lens $L_{1P3}$ having its convex surface facing the first concave reflecting mirror $M_1$ side (or a negative meniscus lens $L_{2P3}$ having its convex surface facing the second concave reflecting mirror $M_2$), a biconvex positive lens $L_{1P4}$ (or a biconvex positive lens $L_{2P4}$), and a negative lens $L_{1P5}$ having its surface with a larger curvature facing the biconvex positive lens $L_{1P4}$ side (or a negative lens $L_{2P5}$ having its surface with a larger curvature facing the biconvex positive lens $L_{2P4}$ side). The first negative lens group $G_{1N}$ (or the second negative lens group $G_{2N}$) comprises a negative meniscus lens $L_{1N1}$ having its convex surface facing the first positive lens group $G_{1P}$ side (or a negative meniscus lens $L_{2N1}$ having its convex surface facing the second positive lens group $G_{2P}$ side).

Table 6 shows the numerical data of the optical system shown in FIG. 13. Leftmost numbers represent the order from an object O side (or the primary image side) to the first concave reflecting mirror $M_1$ (or the second concave reflecting mirror $M_2$); r, the radius of curvature of a lens surface or a reflecting surface; d, the distance between lens surfaces; n, the refractive index of a medium (optical material) with respect to a light beam with an exposure wavelength (g-line: 436 nm); and Φ, the outer diameter of a medium (optical material). In Table 6, WD represents the working distance of the first imaging optical system $K_1$; $D_1$, the distance from the object surface O to the vertex of the rectangular prism $P_1$ (a point on the ridgeline formed by the two reflecting surfaces perpendicular to each other) in the first imaging optical system $K_1$ (the distance from the object surface O to an optical axis AX of the first imaging optical system $K_1$); $D_2$, the distance from the vertex of the rectangular prism $P_1$ to the vertex of the positive meniscus lens $L_{1P1}$ on the prism $P_1$ side; $D_{OI}$, the distance from the object surface O (mask) to an image surface I (primary image surface); Φmax, the maximum outer diameter of the first or second imaging optical system ($K_1$ or $K_2$); $f_{GP}$, the focal length of the first positive lens group $G_{1P}$ (or the second positive lens group $G_{2P}$); $f_{GN}$, the focal length of the first negative lens group $G_{1N}$ (or the second negative lens group $G_{2N}$); TL, the distance (total length) on the optical axis AX from the object surface O to the first concave reflecting mirror $M_1$ (or the second concave reflecting mirror $M_2$); $r_M$, the radius of curvature of the first concave reflecting mirror $M_1$ (or the second concave reflecting mirror $M_2$); $r_{1N}$, the radius of curvature of the lens surface of the negative meniscus lens of the first negative lens group $G_{1N}$ on the first positive lens group $G_{1P}$ side; $r_{2N}$, the radius of curvature of the lens surface of the negative meniscus lens on the first concave reflecting mirror $M_1$ side; $L_{NM}$, the distance on the optical axis from the image-side principal point to the first concave reflecting mirror $M_1$, which image side corresponds to the first concave reflecting mirror $M_1$ side of the negative meniscus lens; and $L_{GP\text{-}GN}$, the distance from the image-side principal point, which image side corresponds to the first concave reflecting mirror $M_1$ side of the first positive lens group $G_{1P}$, to the image-side principal point, which image side corresponds to the first concave reflecting mirror $M_1$ side of the first negative lens group $G_{1N}$.

TABLE 6

Fifth Embodiment

WD = 2.05
$D_1$ = 1.78
$D_2$ = 0.27
$D_{OI}$ = 3.56
TL = 10.59

| | r | d | n | Φ | Optical Member |
|---|---|---|---|---|---|
| 0 | | 2.05 | 1.00000 | | |
| 1 | −65.99 | 0.41 | 1.60384 | 3.1 | $L_{1P1}$ ($L_{2P1}$) |
| 2 | 25.92 | 0.05 | 1.00000 | | |
| 3 | 12.47 | 0.55 | 1.50332 | 3.1 | $L_{1P2}$ ($L_{2P2}$) |
| 4 | −4.06 | 0.11 | 1.00000 | | |
| 5 | −3.24 | 0.41 | 1.52670 | 3.1 | $L_{1P3}$ ($L_{2P3}$) |
| 6 | −5.31 | 0.05 | 1.00000 | | |
| 7 | 27.75 | 0.55 | 1.50332 | 3.1 | $L_{1P4}$ ($L_{2P4}$) |
| 8 | −4.33 | 0.08 | 1.00000 | | |
| 9 | −4.41 | 0.41 | 1.52670 | 3.1 | $L_{1P5}$ ($L_{2P5}$) |
| 10 | −7.07 | 3.91 | 1.00000 | | |
| 11 | 15.06 | 0.41 | 1.52670 | 2.4 | $L_{1N1}$ ($L_{2N1}$) |
| 12 | 9.05 | 1.60 | 1.00000 | | |
| 13 | −10.79 | | −1.00000 | 2.1 | $M_1$ ($M_2$) |

Condition Correspondence Values of Fifth Embodiment (1) $2(WD - D_2)/\Phi max = 1.15$
(2) $|f_{GN}/f_{GP}| = 6.88$
(3) $q = -4.00$
(4) $L_{NM}/TL = 0.112$
(5) $L_{GP-GN}/TL = 0.497$
(6) $|r_M/TL| = 1.02$
(7) $f_{GP}/TL = 0.605$ In Table 6, an image height Y is 1.0, and a numerical aperture N.A on the image side is 0.15. The 0th surface corresponds to the object surface or the image surface.

The optical system shown in Table 6 satisfies relation (1) so that a sufficient working distance is ensured.

The total length TL of the first and second imaging optical systems ($K_1$ and $K_2$) of the embodiment shown in Table 6 is 10.59, and the total length TL of the Dyson optical system shown in Table 2 is 58.22. Therefore, the total length of the embodiment shown in Table 6 is as small as about ⅕ that of the Dyson optical system in FIG. 6.

FIGS. 14A, 14B and 14C show various aberrations caused by the light beam with an exposure wavelength (g-line: 436 nm) of the embodiment shown in FIG. 13. Comas shown in FIG. 14C are represented by aberration curves at image heights of 1, 0.75, and 0.5. The scale of a coma at each image height is ±0.014 μm. As is apparent from various aberrations shown in FIGS. 14A, 14B and 14C, the various aberrations are corrected in a good balance.

A first imaging optical system $K_1$ (or a second imaging optical system $K_2$) constituting a projection optical system according to the sixth embodiment will be described below with reference to FIG. 15.

FIG. 15 is a view showing the lens arrangement of the first imaging optical system $K_1$ (the a second imaging optical system $K_2$) shown in FIG. 1 according to the sixth embodiment. For the descriptive convenience, the lens arrangement shown in FIG. 15 will be described as that of the first imaging optical system $K_1$.

As shown in FIG. 15, the first imaging optical system $K_1$ (or the second imaging optical system $K_2$) has a first refraction optical system $S_1$ (or a second refraction optical system $S_2$) consisting of a first positive lens group $G_{1P}$ (or a second positive lens group $G_{2P}$) and a first negative lens group $G_{1N}$ (or a second negative lens group $G_{2N}$), and a first concave reflecting mirror $M_1$ (or a second concave reflecting mirror $M_2$). For the descriptive convenience, in FIG. 15, a first rectangular prism $P_1$ (or a second rectangular prism $P_2$) arranged on the left side of the first refraction optical system $S_1$ (or the second refraction optical system $S_2$) is not illustrated.

As shown in FIG. 15, the first positive lens group $G_{1P}$ comprises a positive meniscus lens $L_{1P1}$ having its convex surface facing the first concave reflecting mirror $M_1$ side, a negative meniscus lens $L_{1P2}$ bonded to the positive meniscus lens $L_{1P1}$ and having its convex surface facing the first concave reflecting mirror $M_1$ side, a biconvex positive lens $L_{1P3}$, and a negative meniscus lens $L_{1P4}$ bonded to the biconvex positive lens $L_{1P3}$ and having its convex surface facing the first concave reflecting mirror $M_1$ side, in this order from the object side to the first concave reflecting mirror $M_1$ side. The first negative lens group $G_{1N}$ comprises a negative meniscus lens $L_{1N1}$ having its convex surface facing the first positive lens group $G_{1P}$ side.

In this embodiment, since the first positive lens group $G_{1P}$ is constituted by a bonded lens component (a bonded lens component consisting of the positive meniscus lens $L_{1P1}$ and the negative meniscus lens $L_{1P2}$, or a bonded lens component consisting of the positive lens $L_{1P3}$ and the negative meniscus lens $L_{1P4}$), the number of components of the first positive lens group $G_{1P}$ itself is decreased. With this arrangement, a larger decentering tolerance can be set to the first positive lens group $G_{1P}$, and the projection optical system can be easily manufactured.

Table 7 shows the numerical data of the optical system shown in FIG. 15. Leftmost numbers represent the order from an object O side (or the primary image side) to the first concave reflecting mirror $M_1$ (or the second concave reflecting mirror $M_2$); r, the radius of curvature of a lens surface or a reflecting surface; d, the distance between lens surfaces; n, the refractive index of a medium (optical material) with respect to a light beam with an exposure wavelength (g-line: 436 nm); and Φ, the outer diameter of a medium (optical material). In Table 7, WD represents the working distance of the first imaging optical system $K_1$; $D_1$, the distance from the object surface O to the vertex of the rectangular prism $P_1$ (a point on the ridgeline formed by the two reflecting surfaces perpendicular to each other) in the first imaging optical system $K_1$ (the distance from the object surface O to an optical axis AX of the first imaging optical system $K_1$); $D_2$, the distance from the vertex of the rectangular prism $P_1$ to the vertex of the positive meniscus lens $L_{1P1}$ on the prism $P_1$ side; $D_{OI}$, the distance from the object surface O (mask) to an image surface I (primary image surface); Φmax, the maximum outer diameter of the first or second imaging optical system ($K_1$ or $K_2$); $F_{GP}$, the focal length of the first positive lens group $G_{1P}$ (or the second positive lens group $G_{2P}$); $f_{GN}$, the focal length of the first negative lens group $G_{1N}$ (or the second negative lens group $G_{2N}$); TL, the distance (total length) on the optical axis AX from the object surface O to the first concave reflecting mirror $M_1$ (or the second concave reflecting mirror $M_2$); $r_M$, the radius of curvature of the first concave reflecting mirror $M_1$ (or the second concave reflecting mirror $M_2$); $r_{1N}$, the radius of curvature of the lens surface of the negative meniscus lens of the first negative lens group $G_{1N}$ on the first positive lens group $G_{1P}$ side; $r_{2N}$, the radius of curvature of the lens surface of the negative meniscus lens on the first concave reflecting mirror $M_1$ side; $L_{NM}$, the distance on the optical axis from the image-side principal point to the first concave reflecting mirror $M_1$, which image side corresponds to the first concave reflecting mirror $M_1$ side of the negative meniscus lens; and $L_{GP-GN}$, the distance from the image-side principal point, which image side corresponds to the first concave reflecting mirror $M_1$ side of the first positive lens group $G_{1P}$, to the image-side principal point, which image side corresponds to the first concave reflecting mirror $M_1$ side of the first negative lens group $G_{1N}$.

TABLE 7

Sixth Embodiment

WD = 2.29
$D_1$ = 2.02
$D_2$ = 0.27
$D_{OI}$ = 4.04
TL = 11.99

| | r | d | n | Φ | Optical Member |
|---|---|---|---|---|---|
| 0 | | 2.29 | 1.00000 | | |
| 1 | −12.83 | 0.55 | 1.50332 | 2.9 | $L_{1P1}$ ($L_{2P1}$) |
| 2 | −2.24 | 0.38 | 1.60384 | 2.9 | $L_{1P2}$ ($L_{2P2}$) |
| 3 | −5.05 | 0.05 | 1.00000 | | |
| 4 | 10.57 | 0.55 | 1.50332 | 2.9 | $L_{1P3}$ ($L_{2P3}$) |
| 5 | −8.20 | 0.38 | 1.52670 | 2.9 | $L_{1P4}$ ($L_{2P4}$) |
| 6 | −12.32 | 4.81 | 1.00000 | | |
| 7 | 8.99 | 0.38 | 1.52670 | 2.2 | $L_{1N1}$ ($L_{2N1}$) |
| 8 | 7.56 | 2.60 | 1.00000 | | |
| 9 | −12.33 | | −1.00000 | 1.9 | $M_1$ ($M_2$) |

Condition Correspondence Values of Sixth Embodiment (1) $2(WD - D_2)/\Phi max = 1.39$
(2) $|f_{GN}/f_{GP}| = 12.6$
(3) $q = -11.6$
(4) $L_{NM}/TL = 0.952$
(5) $L_{GP-GN}/TL = 0.568$
(6) $|r_M/TL| = 1.03$
(7) $f_{GP}/TL = 0.656$ In Table 7, an image height Y is 1.0, and a numerical aperture N.A on the image side is 0.1. The 0th surface corresponds to the object surface or the image surface.

The optical system shown in Table 7 satisfies relation (1) so that a sufficient working distance is ensured.

The total length TL of the first and second imaging optical systems ($K_1$ and $K_2$) of the embodiment shown in Table 7 is 11.99, and the total length TL of the Dyson optical system shown in Table 2 is 58.22. Therefore, the total length of the embodiment shown in Table 7 is as small as about ⅕ that of the Dyson optical system in FIG. 6.

FIGS. 16A, 16B and 16C show various aberrations caused by the light beam with an exposure wavelength (g-line: 436 nm) of the embodiment shown in FIG. 15. Comas shown in FIG. 16C are represented by aberration curves at image heights of 1, 0.75, and 0.5. The scale of a coma at each image height is ±0.014 μm. As is apparent from various aberrations shown in FIGS. 16A, 16B and 16C, the various aberrations are corrected in a good balance.

A first imaging optical system $K_1$ (or a second imaging optical system $K_2$) constituting a projection optical system according to the seventh embodiment will be described below with reference to FIG. 17.

FIG. 17 is a view showing the lens arrangement of the first imaging optical system $K_1$ (the a second imaging optical system $K_2$) shown in FIG. 1 according to the seventh embodiment. For the descriptive convenience, the lens arrangement shown in FIG. 17 will be described as that of the first imaging optical system $K_1$.

As shown in FIG. 17, the first imaging optical system $K_1$ (or the second imaging optical system $K_2$) has a first refraction optical system $S_1$ (or a second refraction optical system $S_2$) consisting of a first positive lens group $G_{1P}$ (or a second positive lens group $G_{2P}$) and a first negative lens group $G_{1N}$ (or a second negative lens group $G_{2N}$), and a first concave reflecting mirror $M_1$ (or a second concave reflecting mirror $M_2$). For the descriptive convenience, in FIG. 17, a first rectangular prism $P_1$ (or a second rectangular prism $P_2$) arranged on the left side of the first refraction optical system $S_1$ (or the second refraction optical system $S_2$) is not illustrated.

As shown in FIG. 17, the first positive lens group $G_{1P}$ comprises a positive meniscus lens $L_{1P1}$ having its convex surface facing the first concave reflecting mirror $M_1$ side, a positive meniscus lens $L_{1P2}$ having its convex surface facing the first concave reflecting mirror $M_1$ side, a negative meniscus lens $L_{1P3}$ bonded to the positive meniscus lens $L_{1P2}$ and having its convex surface facing the first concave reflecting mirror $M_1$ side, and a biconvex positive lens $L_{1P4}$ having its surface with a larger curvature facing the negative meniscus lens $L_{1P3}$ side, in this order from the object side to the first concave reflecting mirror $M_1$ side. The first negative lens group $G_{1N}$ comprises a negative meniscus lens $L_{1N1}$ having its convex surface facing the first positive lens group $G_{1P}$ side.

In this embodiment, since the positive meniscus lens $L_{1P2}$ and the negative meniscus lens $L_{1P3}$ in the first positive lens group $G_{1P}$ are constituted as a bonded lens component, a larger decentering tolerance can be set to the two lenses, and the number of components of the first positive lens group $G_{1P}$ itself is decreased. With this arrangement, the projection optical system can be easily manufactured.

Table 8 shows the numerical data of the optical system shown in FIG. 17. Leftmost numbers represent the order from an object O side (or the primary image side) to the first concave reflecting mirror $M_1$ (or the second concave reflecting mirror $M_2$); r, the radius of curvature of a lens surface or a reflecting surface; d, the distance between lens surfaces; n, the refractive index of a medium (optical material) with respect to a light beam with an exposure wavelength (g-line: 436 nm); and Φ, the outer diameter of a medium (optical material). In Table 8, WD represents the working distance of the first imaging optical system $K_1$; $D_1$, the distance from the object surface O to the vertex of the rectangular prism $P_1$ (a point on the ridgeline formed by the two reflecting surfaces perpendicular to each other) in the first imaging optical system $K_1$ (the distance from the object surface O to an optical axis AX of the first imaging optical system $K_1$); $D_2$, the distance from the vertex of the rectangular prism $P_1$ to the vertex of the positive meniscus lens $L_{1P1}$ on the prism $P_1$ side; $D_{OI}$, the distance from the object surface O (mask) to an image surface I (primary image surface); Φmax, the maximum outer diameter of the first or second imaging optical system ($K_1$ or $K_2$); $f_{GP}$, the focal length of the first positive lens group $G_{1P}$ (or the second positive lens group $G_{2P}$); $f_{GN}$, the focal length of the first negative lens group $G_{1N}$ (or the second negative lens group $G_{2N}$); TL, the distance (total length) on the optical axis AX from the object surface O to the first concave reflecting mirror $M_1$ (or the second concave reflecting mirror $M_2$); $r_M$, the radius of curvature of the first concave reflecting mirror $M_1$ (or the second concave reflecting mirror $M_2$); $r_{1N}$, the radius of curvature of the lens surface of the negative meniscus lens of the first negative lens group $G_{1N}$ on the first positive lens group $G_{1P}$ side; $r_{2N}$, the radius of curvature of the lens surface of the negative meniscus lens on the first concave reflecting mirror $M_1$ side; $L_{NM}$, the distance on the optical axis from the image-side principal point to the first concave reflecting mirror $M_1$, which image side corresponds to the first concave reflecting mirror $M_1$ side of the negative meniscus lens; and $L_{GP\text{-}GN}$, the distance from the image-side principal point, which image side corresponds to the first concave reflecting mirror $M_1$ side of the first positive lens group $G_{1P}$, to the image-side principal point, which image side corresponds to the first concave reflecting mirror $M_1$ side of the first negative lens group $G_{1N}$.

TABLE 8

Seventh Embodiment

WD = 2.29
$D_1$ = 2.02
$D_2$ = 0.27
$D_{OI}$ = 4.04
TL = 9.92

| | r | d | n | Φ | Optical Member |
|---|---|---|---|---|---|
| 0 | | 2.29 | 1.00000 | | |
| 1 | −7.12 | 0.39 | 1.48088 | 2.8 | $L_{1P1}$ ($L_{2P1}$) |
| 2 | −4.33 | 0.04 | 1.00000 | | |
| 3 | −34.60 | 0.54 | 1.48088 | 2.8 | $L_{1P2}$ ($L_{2P2}$) |
| 4 | −2.62 | 0.35 | 1.60384 | 2.8 | $L_{1P3}$ ($L_{2P3}$) |
| 5 | −7.75 | 0.04 | 1.00000 | | |
| 6 | 5.78 | 0.43 | 1.48088 | 2.8 | $L_{1P4}$ ($L_{2P4}$) |
| 7 | −24.55 | 4.43 | 1.00000 | | |
| 8 | 9.60 | 0.33 | 1.48088 | 2.8 | $L_{1N1}$ ($L_{2N1}$) |
| 9 | 6.24 | 1.10 | 1.00000 | | |
| 10 | −10.01 | | −1.00000 | 1.5 | $M_1$ ($M_2$) |

Condition Correspondence Values of Seventh Embodiment (1) $2(WD - D_2)/\Phi max = 1.39$
(2) $|f_{GN}/f_{GP}| = 6.33$
(3) $q = -4.71$
(4) $L_{NM}/TL = 0.0687$
(5) $L_{GP\text{-}GN}/TL = 0.546$
(6) $|r_M/TL| = 1.01$
(7) $f_{GP}/TL = 0.610$ In Table 8, an image height Y is 1.0, and a numerical aperture N.A on the image side is 0.1. The 0th surface corresponds to the object surface or the image surface.

The optical system shown in Table 8 satisfies relation (1) so that a sufficient working distance is ensured.

The total length TL of the first and second imaging optical systems ($K_1$ and $K_2$) of the embodiment shown in Table 8 is 9.92, and the total length TL of the Dyson optical system shown in Table 2 is 58.22. Therefore, the total length of the embodiment shown in Table 8 is as small as about ⅙ that of the Dyson optical system in FIG. 6.

FIGS. 18A, 18B and 18C show various aberrations caused by the light beam with an exposure wavelength (g-line: 436 nm) of the embodiment shown in FIG. 17. Comas shown in FIG. 18C are represented by aberration curves at image heights of 1, 0.75, and 0.5. The scale of a coma at each image height is ±0.014 μm. As is apparent from various aberrations shown in FIGS. 18A, 18B and 18C, the various aberrations are corrected in a good balance.

A first imaging optical system $K_1$ (or a second imaging optical system $K_2$) constituting a projection optical system according to the eighth embodiment will be described below with reference to FIG. 19.

Figure 19:
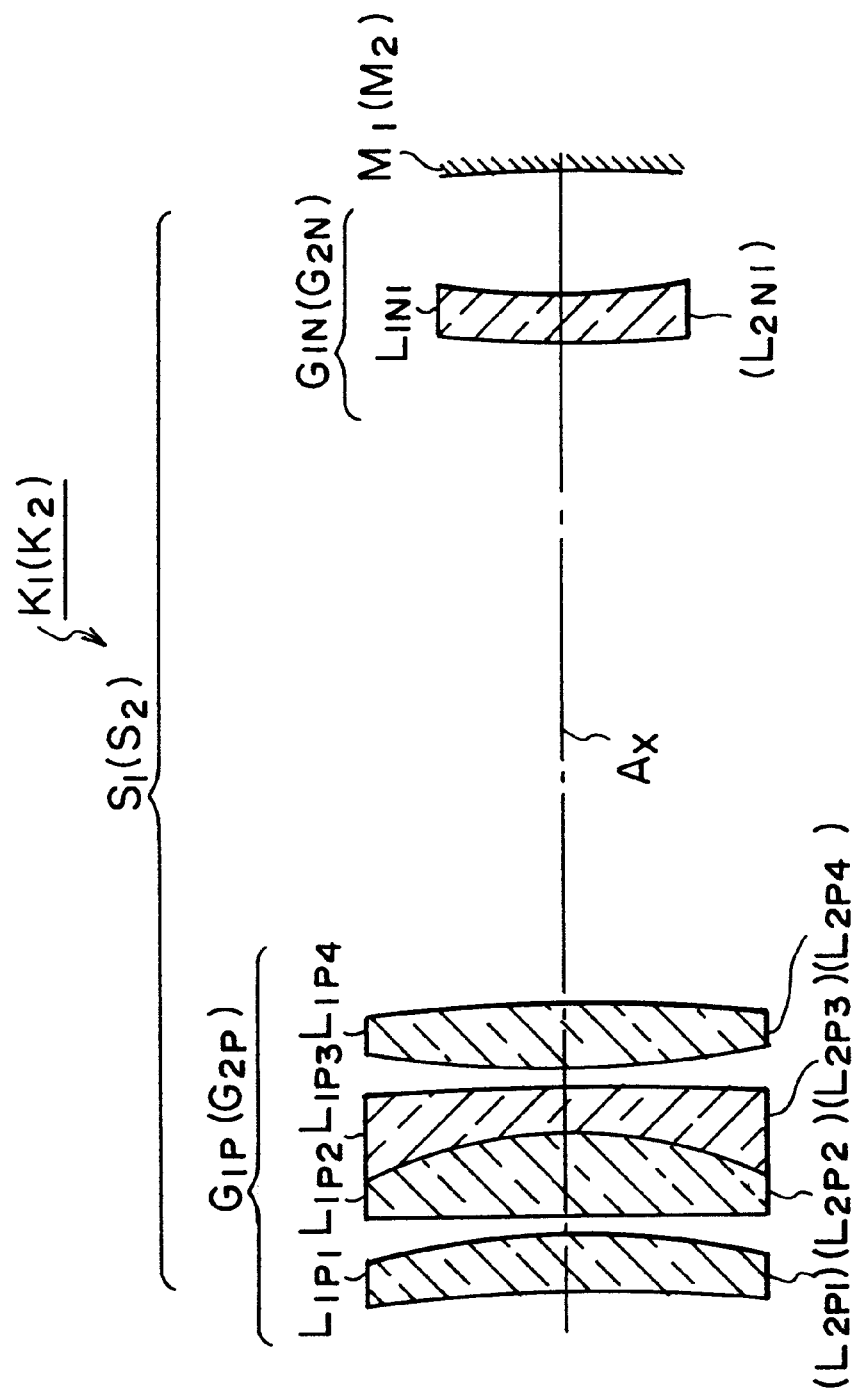
FIG. 19 is a view showing the lens arrangement of a projection optical system according to the eighth embodiment.

FIG. 19 is a view showing the lens arrangement of the first imaging optical system $K_1$ (the a second imaging optical system $K_2$) shown in FIG. 1 according to the eighth embodiment. For the descriptive convenience, the lens arrangement shown in FIG. 19 will be described as that of the first imaging optical system $K_1$.

As shown in FIG. 19, the first imaging optical system $K_1$ (or the second imaging optical system $K_2$) has a first refraction optical system $S_1$ (or a second refraction optical system $S_2$) consisting of a first positive lens group $G_{1P}$ (or a second positive lens group $G_{2P}$) and a first negative lens group $G_{1N}$ (or a second negative lens group $G_{2N}$), and a first concave reflecting mirror $M_1$ (or a second concave reflecting mirror $M_2$). For the descriptive convenience, in FIG. 19, a first rectangular prism $P_1$ (or a second rectangular prism $P_2$) arranged on the left side of the first refraction optical system $S_1$ (or the second refraction optical system $S_2$) is not illustrated.

As shown in FIG. 19, the first positive lens group $G_{1P}$ comprises a positive meniscus lens $L_{1P1}$ having its convex surface facing the first concave reflecting mirror $M_1$ side, a positive meniscus lens $L_{1P2}$ having its convex surface facing the first concave reflecting mirror $M_1$ side, a negative meniscus lens $L_{1P3}$ bonded to the positive meniscus lens $L_{1P2}$ and having its convex surface facing the first concave reflecting mirror $M_1$ side, and a biconvex positive lens $L_{1P4}$ having its surface with a larger curvature facing the negative meniscus lens $L_{1P3}$ side, in this order from the object side to the first concave reflecting mirror $M_1$ side. The first negative lens group $G_{1N}$ comprises a negative meniscus lens $L_{1N1}$ having its convex surface facing the first positive lens group $G_{1P}$ side.

In this embodiment, since the positive meniscus lens $L_{1P2}$ and the negative meniscus lens $L_{1P3}$ in the first positive lens group $G_{1P}$ are constituted as a bonded lens component, a larger decentering tolerance can be set to the two lenses, and the number of components of the first positive lens group $G_{1P}$ itself is decreased. With this arrangement, the projection optical system can be easily manufactured.

Table 9 shows the numerical data of the optical system shown in FIG. 19. Leftmost numbers represent the order from an object O side (or the primary image side) to the first concave reflecting mirror $M_1$ (or the second concave reflecting mirror $M_2$); r, the radius of curvature of a lens surface or a reflecting surface; d, the distance between lens surfaces; n, the refractive index of a medium (optical material) with respect to a light beam with an exposure wavelength (g-line: 436 nm); and Φ, the outer diameter of a medium (optical material). In Table 9, WD represents the working distance of the first imaging optical system $K_1$; $D_1$, the distance from the object surface O to the vertex of the rectangular prism $P_1$ (a point on the ridgeline formed by the two reflecting surfaces perpendicular to each other) in the first imaging optical system $K_1$ (the distance from the object surface O to an optical axis AX of the first imaging optical system $K_1$); $D_2$, the distance from the vertex of the rectangular prism $P_1$ to the vertex of the positive meniscus lens $L_{1P1}$ on the prism $P_1$ side; $D_{OI}$, the distance from the object surface O (mask) to an image surface I (primary image surface); Φmax, the maximum outer diameter of the first or second imaging optical system ($K_1$ or $K_2$); $f_{GP}$, the focal length of the first positive lens group $G_{1P}$ (or the second positive lens group $G_{2P}$); $f_{GN}$, the focal length of the first negative lens group $G_{1N}$ (or the second negative lens group $G_{2N}$); TL, the distance (total length) on the optical axis AX from the object surface O to the first concave reflecting mirror $M_1$ (or the second concave reflecting mirror $M_2$); $r_M$, the radius of curvature of the first concave reflecting mirror $M_1$ (or the second concave reflecting mirror $M_2$); $r_{1N}$, the radius of curvature of the lens surface of the negative meniscus lens of the first negative lens group $G_{1N}$ on the first positive lens group $G_{1P}$ side; $r_{2N}$, the radius of curvature of the lens surface of the negative meniscus lens on the first concave reflecting mirror $M_1$ side; $L_{NM}$, the distance on the optical axis from the image-side principal point to the first concave reflecting mirror $M_1$, which image side corresponds to the first concave reflecting mirror $M_1$ side of the negative meniscus lens; and $L_{GP\text{-}GN}$, the distance from the image-side principal point, which image side corresponds to the first concave reflecting mirror $M_1$ side of the first positive lens group $G_{1P}$, to the image-side principal point, which image side corresponds to the first concave reflecting mirror $M_1$ side of the first negative lens group $G_{1N}$.

TABLE 9

Eighth Embodiment

WD = 2.43
$D_1$ = 2.16
$D_2$ = 0.27
$D_{OI}$ = 4.32
TL = 9.83

| | r | d | n | Φ | Optical Member |
|---|---|---|---|---|---|
| 0 | | 2.43 | 1.00000 | | |
| 1 | −8.43 | 0.39 | 1.48088 | 2.8 | $L_{1P1}$ ($L_{2P1}$) |
| 2 | −4.68 | 0.04 | 1.00000 | | |
| 3 | −27.09 | 0.54 | 1.48088 | 2.8 | $L_{1P2}$ ($L_{2P2}$) |
| 4 | −2.63 | 0.35 | 1.60384 | 2.8 | $L_{1P3}$ ($L_{2P3}$) |
| 5 | −7.41 | 0.04 | 1.00000 | | |
| 6 | 5.15 | 0.43 | 1.48088 | 2.8 | $L_{1P4}$ ($L_{2P4}$) |
| 7 | −33.16 | 4.63 | 1.00000 | | |
| 8 | 9.38 | 0.33 | 1.48088 | 2.8 | $L_{1N1}$ ($L_{2N1}$) |
| 9 | 5.77 | 0.65 | 1.00000 | | |
| 10 | −9.88 | | −1.00000 | 1.5 | $M_1$ ($M_2$) |

Condition Correspondence Values of Eighth Embodiment (1) $2(WD − D_2)/\Phi max = 1.54$
(2) $|f_{GN}/f_{GP}| = 5.53$
(3) $q = −4.20$
(4) $L_{NM}/TL = 0.0294$
(5) $L_{GP\text{-}GN}/TL = 0.567$
(6) $|r_M/TL| = 1.01$
(7) $f_{GP}/TL = 0.591$ In Table 9, an image height Y is 1.0, and a numerical aperture N.A on the image side is 0.1. The 0th surface corresponds to the object surface or the image surface.

The optical system shown in Table 9 satisfies relation (1) so that a sufficient working distance is ensured.

The total length TL of the first and second imaging optical systems ($K_1$ and $K_2$) of the embodiment shown in Table 9 is 9.83, and the total length TL of the Dyson optical system shown in Table 2 is 58.22. Therefore, the total length of the embodiment shown in Table 9 is as small as about ⅙ that of the Dyson optical system in FIG. 6.

Figure 20:
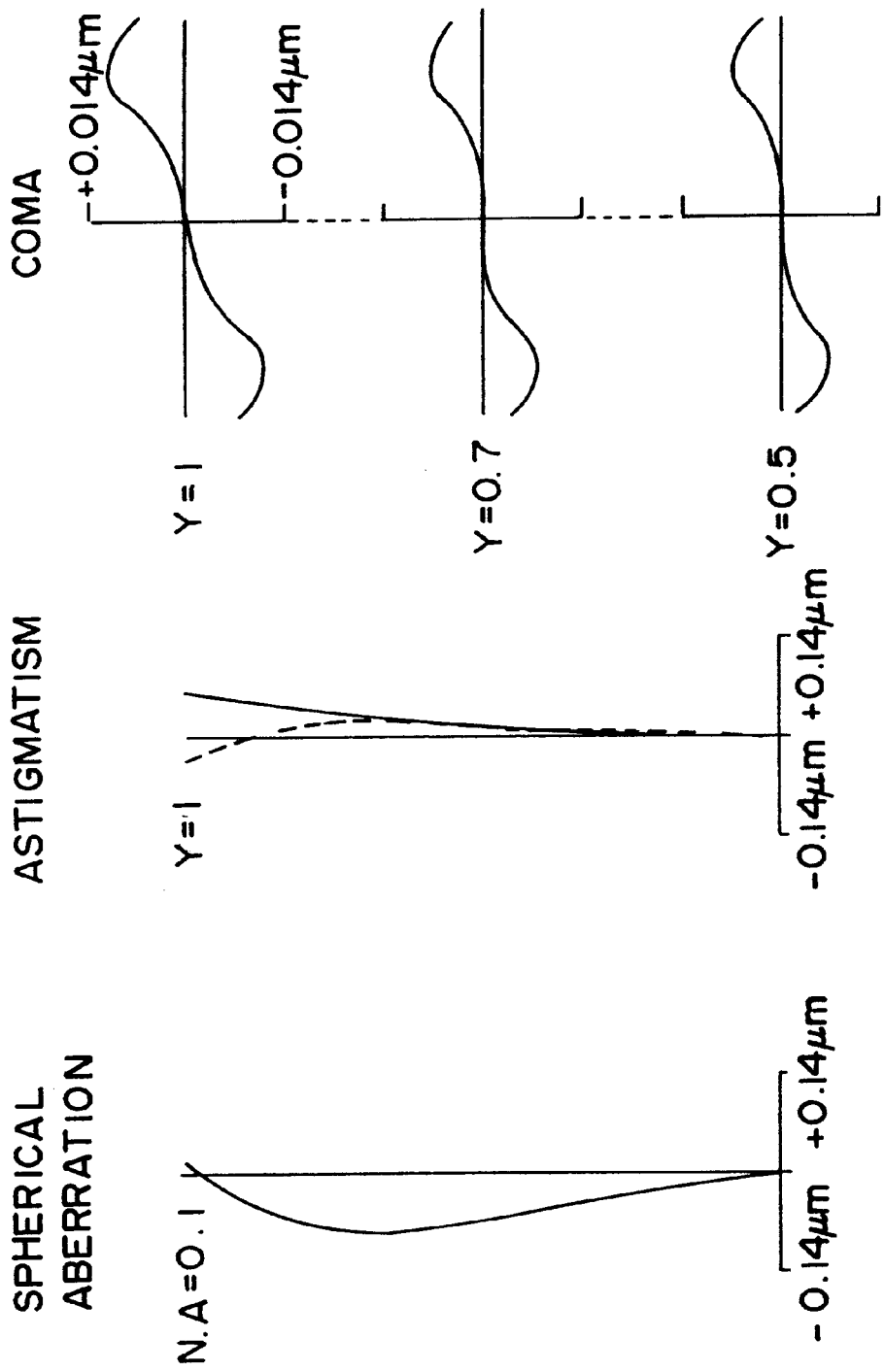
FIGS. 20A, 20B and 20C are views showing various aberrations of the projection optical system shown in FIG. 19.

FIGS. 20A, 20B and 20C show various aberrations caused by the light beam with an exposure wavelength (g-line: 436 nm) of the embodiment shown in FIG. 19. Comas shown in FIG. 20C are represented by aberration curves at image heights of 1, 0.75, and 0.5. The scale of a coma at each image height is ±0.014 μm. As is apparent from various aberrations shown in FIGS. 20A, 20B and 20C, the various aberrations are corrected in a good balance.

A first imaging optical system $K_1$ (or a second imaging optical system $K_2$) constituting a projection optical system according to the ninth embodiment will be described below with reference to FIG. 21.

Figure 21:
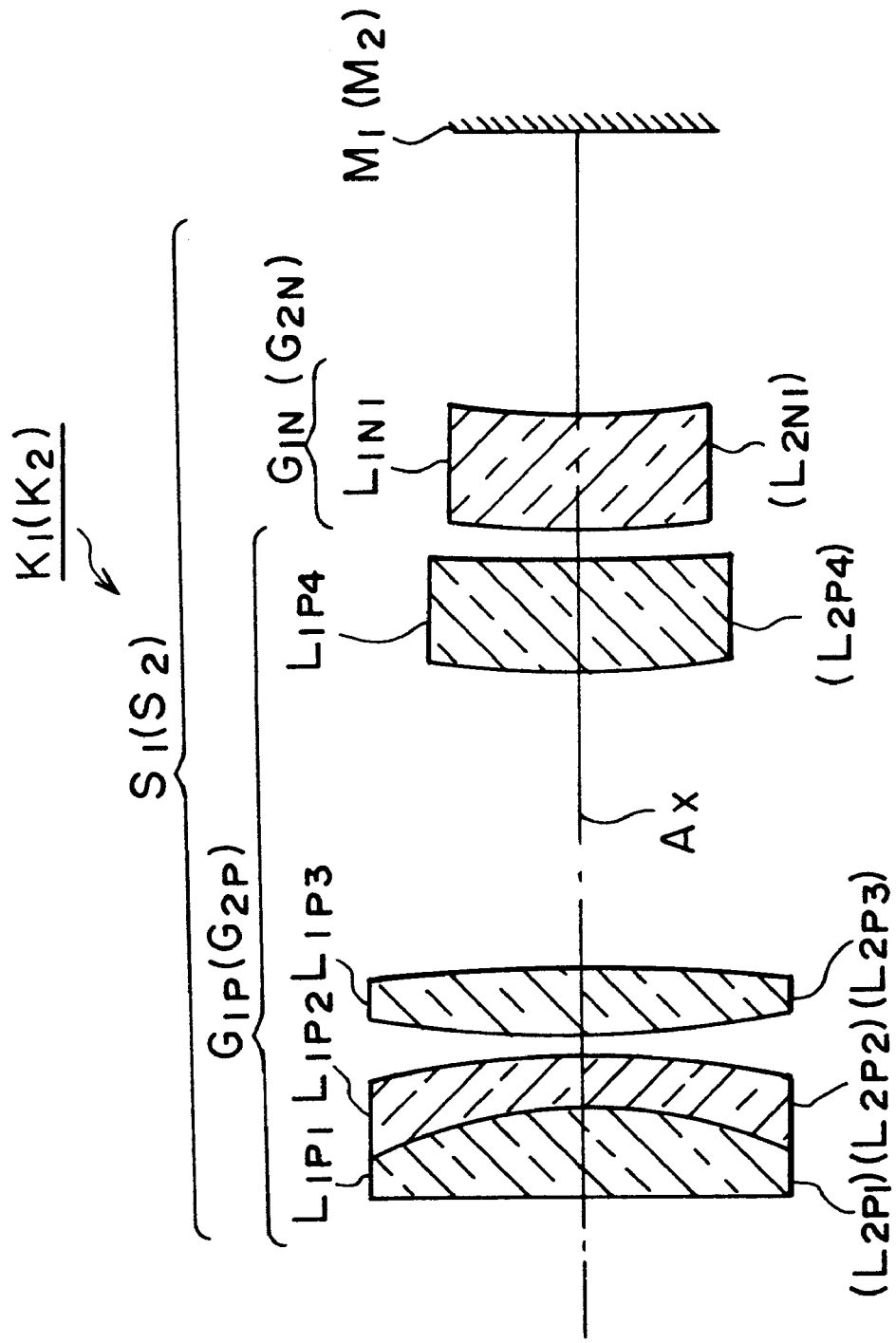
FIG. 21 is a view showing the lens arrangement of a projection optical system according to the ninth embodiment.

FIG. 21 is a view showing the lens arrangement of the first imaging optical system $K_1$ (the a second imaging optical system $K_2$) shown in FIG. 1 according to the ninth embodiment. For the descriptive convenience, the lens arrangement shown in FIG. 21 will be described as that of the first imaging optical system $K_1$.

As shown in FIG. 21, the first imaging optical system $K_1$ (or the second imaging optical system $K_2$) has a first refraction optical system $S_1$ (or a second refraction optical system $S_2$) consisting of a first positive lens group $G_{1P}$ (or a second positive lens group $G_{2P}$) and a first negative lens group $G_{1N}$ (or a second negative lens group $G_{2N}$), and a first concave reflecting mirror $M_1$ (or a second concave reflecting mirror $M_2$). For the descriptive convenience, in FIG. 21, a first rectangular prism $P_1$ (or a second rectangular prism $P_2$) arranged on the left side of the first refraction optical system $S_1$ (or the second refraction optical system $S_2$) is not illustrated.

As shown in FIG. 21, the first positive lens group $G_{1P}$ comprises a positive meniscus lens $L_{1P1}$ having its convex surface facing the first concave reflecting mirror $M_1$ side, a positive meniscus lens $L_{1P2}$ bonded to the positive meniscus lens $L_{1P1}$ and having its convex surface facing the first concave reflecting mirror $M_1$ side, a biconvex positive lens $L_{1P3}$, and a positive meniscus lens $L_{1P4}$ having its convex surface facing the first concave reflecting mirror $M_1$ side, in this order from the object side to the first concave reflecting mirror $M_1$ side. The first negative lens group $G_{1N}$ comprises a negative meniscus lens $L_{1N1}$ having its convex surface facing the first positive lens group $G_{1P}$ side.

In this embodiment, since the positive meniscus lens $L_{1P1}$ and the negative meniscus lens $L_{1P2}$ in the first positive lens group $G_{1P}$ are constituted as a bonded lens component, a larger decentering tolerance can be set to the two lenses, and the number of components of the first positive lens group $G_{1P}$ itself is decreased. With this arrangement, the projection optical system can be easily manufactured.

Table 10 shows the numerical data of the optical system shown in FIG. 21. Leftmost numbers represent the order from an object O side (or the primary image side) to the first concave reflecting mirror $M_1$ (or the second concave reflecting mirror $M_2$); r, the radius of curvature of a lens surface or a reflecting surface; d, the distance between lens surfaces; n, the refractive index of a medium (optical material) with respect to a light beam with an exposure wavelength (g-line: 436 nm); and Φ, the outer diameter of a medium (optical material). In Table 10, WD represents the working distance of the first imaging optical system $K_1$; $D_1$, the distance from the object surface O to the vertex of the rectangular prism $P_1$ (a point on the ridgeline formed by the two reflecting surfaces perpendicular to each other) in the first imaging optical system $K_1$ (the distance from the object surface O to an optical axis AX of the first imaging optical system $K_1$); $D_2$, the distance from the vertex of the rectangular prism $P_1$ to the vertex of the positive meniscus lens $L_{1P1}$ on the prism $P_1$ side; $D_{OI}$, the distance from the object surface O (mask) to an image surface I (primary image surface); Φmax, the maximum outer diameter of the first or second imaging optical system ($K_1$ or $K_2$); $F_{GP}$, the focal length of the first positive lens group $G_{1P}$ (or the second positive lens group $G_{2P}$); $f_{GN}$, the focal length of the first negative lens group $G_{1N}$ (or the second negative lens group $G_{2N}$); TL, the distance (total length) on the optical axis AX from the object surface O to the first concave reflecting mirror $M_1$ (or the second concave reflecting mirror $M_2$); $r_M$, the radius of curvature of the first concave reflecting mirror $M_1$ (or the second concave reflecting mirror $M_2$); $r_{1N}$, the radius of curvature of the lens surface of the negative meniscus lens of the first negative lens group $G_{1N}$ on the first positive lens group $G_{1P}$ side; $r_{2N}$, the radius of curvature of the lens surface of the negative meniscus lens on the first concave reflecting mirror $M_1$ side; $L_{NM}$, the distance on the optical axis from the image-side principal point to the first concave reflecting mirror $M_1$, which image side corresponds to the first concave reflecting mirror $M_1$ side of the negative meniscus lens; and $L_{GP\text{-}GN}$, the distance from the image-side principal point, which image side corresponds to the first concave reflecting mirror $M_1$ side of the first positive lens group $G_{1P}$, to the image-side principal point, which image side corresponds to the first concave reflecting mirror $M_1$ side of the first negative lens group $G_{1N}$.

TABLE 10

Ninth Embodiment

WD = 2.23
$D_1$ = 1.96
$D_2$ = 0.27
$D_{OI}$ = 3.92
TL = 9.16

| | r | d | n | Φ | Optical Member |
|---|---|---|---|---|---|
| 0 | | 2.23 | 1.00000 | | |
| 1 | −359.70 | 0.54 | 1.48088 | 2.7 | $L_{1P1}$ ($L_{2P1}$) |
| 2 | −2.41 | 0.33 | 1.60384 | 2.7 | $L_{1P2}$ ($L_{2P2}$) |
| 3 | −4.79 | 0.04 | 1.00000 | | |
| 4 | 7.53 | 0.61 | 1.48088 | 2.7 | $L_{1P3}$ ($L_{2P3}$) |
| 5 | −18.03 | 1.38 | 1.00000 | | |
| 6 | 5.71 | 0.85 | 1.48088 | 2.3 | $L_{1P4}$ ($L_{2P4}$) |
| 7 | 18.35 | 0.11 | 1.00000 | | |
| 8 | 7.39 | 0.84 | 1.60384 | 2.1 | $L_{1N1}$ ($L_{2N1}$) |
| 9 | 3.90 | 2.23 | 1.00000 | | |
| 10 | −9.01 | | −1.00000 | 1.3 | $M_1$ ($M_2$) |

Condition Correspondence Values of Ninth Embodiment (1) $2(WD - D_2)/\Phi max = 1.45$
(2) $|f_{GN}/f_{GP}| = 3.17$
(3) $q = -3.23$
(4) $L_{NM}/TL = 0.0173$
(5) $L_{GP\text{-}GN}/TL = 0.385$
(6) $|r_M/TL| = 0.983$
(7) $f_{GP}/TL = 0.519$ In Table 10, an image height Y is 1.0, and a numerical aperture N.A on the image side is 0.1. The 0th surface corresponds to the object surface or the image surface.

The optical system shown in Table 10 satisfies relation (1) so that a sufficient working distance is ensured.

The total length TL of the first and second imaging optical systems ($K_1$ and $K_2$) of the embodiment shown in Table 10 is 9.16, and the total length TL of the Dyson optical system shown in Table 2 is 58.22. Therefore, the total length of the embodiment shown in Table 10 is as small as about ⅙ that of the Dyson optical system in FIG. 6.

Figure 22:
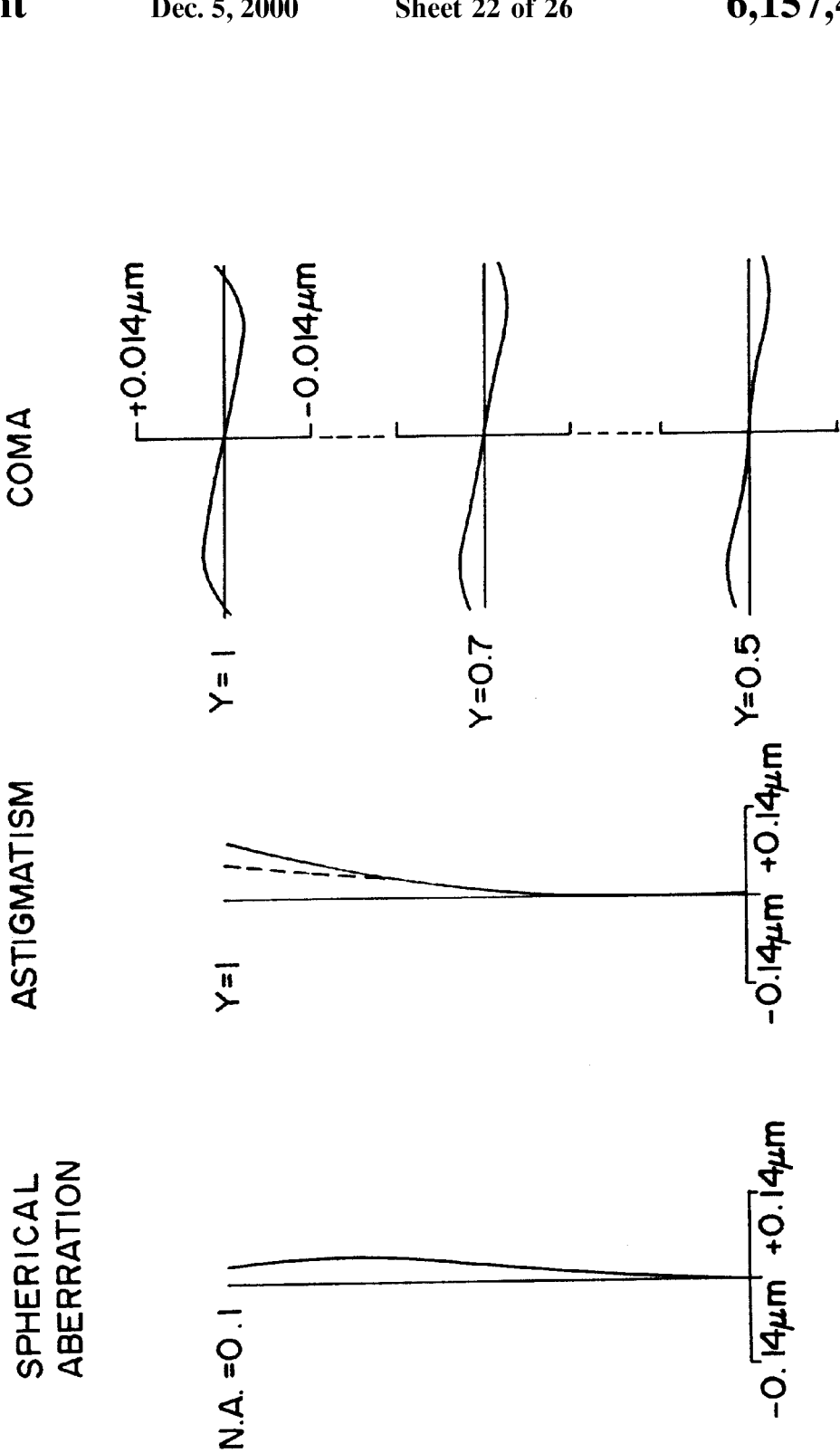
FIGS. 22A, 22B and 22C are views showing various aberrations of the projection optical system shown in FIG. 21.

FIGS. 22A, 22B and 22C show various aberrations caused by the light beam with an exposure wavelength (g-line: 436 nm) of the embodiment shown in FIG. 21. Comas shown in FIG. 22C are represented by aberration curves at image heights of 1, 0.75, and 0.5. The scale of a coma at each image height is ±0.014 μm. As is apparent from various aberrations shown in FIGS. 22A, 22B and 22C, the various aberrations are corrected in a good balance.

In the first or second imaging optical system ($K_1$ or $K_2$) of each of the above first to ninth embodiments, the rectangular prism $P_1$ or $P_2$ serving as a reflecting mirror having reflecting surfaces crossing each other at 90° is used as the first or second reflecting member. Instead, a prism member having total reflecting surfaces crossing each other at 90° may also be used.

The tenth embodiment in which prism members are used as first or second reflecting members will be described below with reference to FIG. 23.

Figure 23:
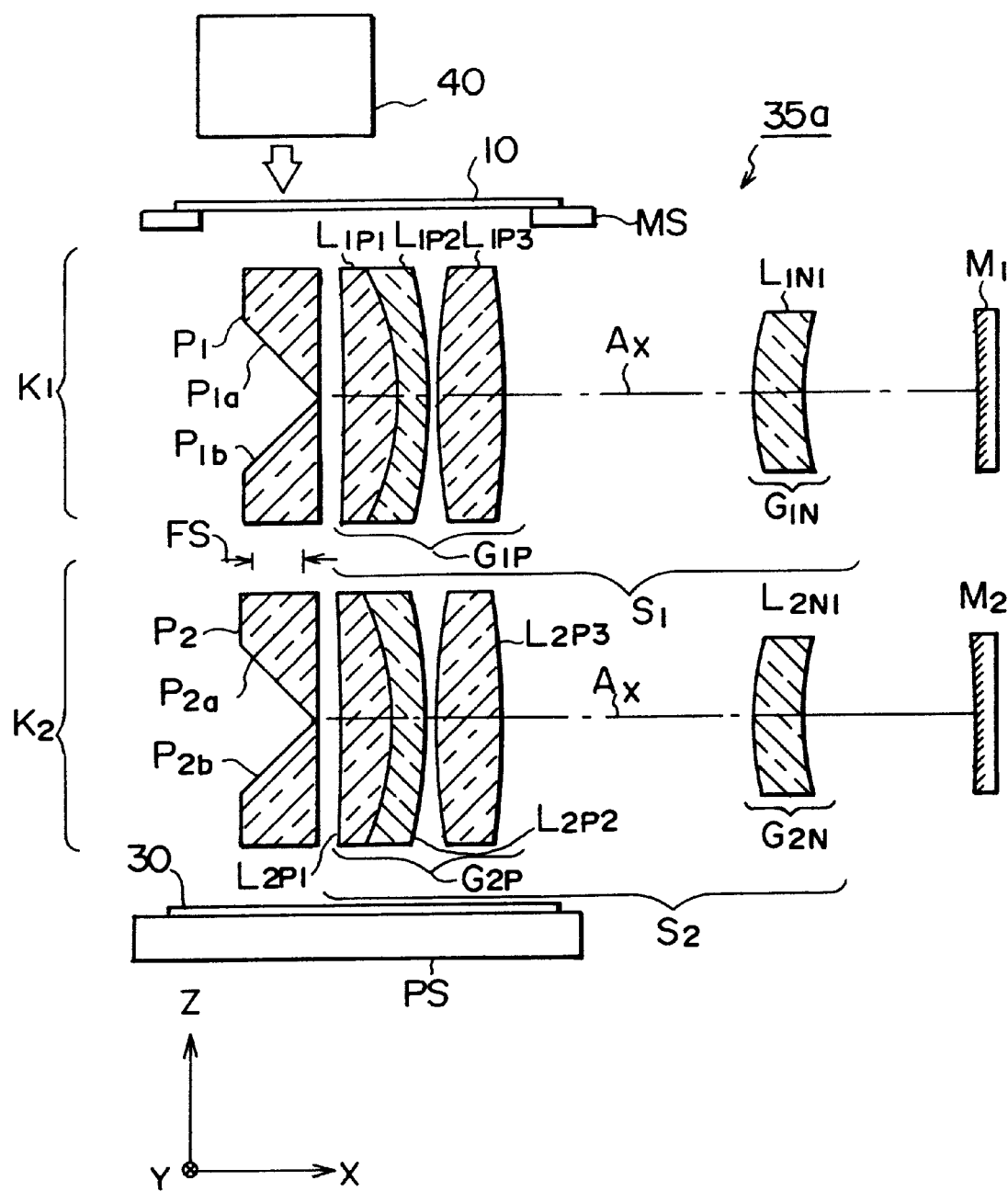
FIG. 23 is a view showing an arrangement using a projection optical system of the tenth embodiment.

FIG. 23 is a view schematically showing a projection optical system of an exposure apparatus according to the tenth embodiment of the present invention. In FIG. 23, the X-Y-Z coordinate system as in FIG. 1 is employed, and the same reference numerals denote the same members.

Referring to FIG. 23, a first projection optical system 35a has a first imaging optical system $K_1$ for forming the primary image of a circuit pattern on a mask 10, and a second imaging optical system $K_2$ for forming the erect image (secondary image) of the circuit pattern onto a plate 30 on the basis of a light beam from the primary image. The first imaging optical system $K_1$ has a prism member $P_1$ (first reflecting member) having total reflecting surfaces $P_{1a}$ and $P_{1b}$ inclined by 45° with respect to the plane (X-Y plane) of the mask 10, a first refraction optical system $S_1$ consisting of a first positive lens group $G_{1P}$ and a first negative lens group $G_{1N}$, and a first concave reflecting mirror $M_1$.

The first positive lens group $G_{1P}$ comprises a bonded lens consisting of a positive meniscus lens $L_{1P1}$ having its convex surface facing the first concave reflecting mirror $M_1$ side and a negative meniscus lens $L_{1P2}$ having its convex surface facing the first concave reflecting mirror $M_1$ side, and a biconvex positive lens $L_{1P3}$. The first negative lens group $G_{1N}$ comprises only a negative meniscus lens $L_{1N1}$ having its convex surface facing the first positive lens group $G_{1P}$ side.

The arrangement of the second imaging optical system $K_2$ is the same as that of the first imaging optical system $K_1$. More specifically, the second imaging optical system $K_2$ has a prism member $P_2$ (second reflecting member) having total reflecting surfaces $P_{2a}$ and $P_{2b}$ inclined by 45° with respect to the plane (X-Y plane) of the plate 30, a second refraction optical system $S_2$ consisting of a second positive lens group $G_{2P}$ and a second negative lens group $G_{2N}$, and a second concave reflecting mirror $M_2$.

As in the first positive lens group $G_{1P}$, the second positive lens group $G_{2P}$ comprises a bonded lens consisting of a positive meniscus lens $L_{2P1}$ having its convex surface facing the second concave reflecting mirror $M_2$ side and a negative meniscus lens $L_{2P2}$ having its convex surface facing the second concave reflecting mirror $M_2$ side, and a biconvex positive lens $L_{2P3}$. The second negative lens group $G_{2N}$ comprises only a negative meniscus lens $L_{2N1}$ having its convex surface facing the second positive lens group $G_{2P}$ side.

A field stop FS for regulating the projection area on the plate 30 is provided at the position where the primary image of the circuit pattern is formed by the first imaging optical system $K_1$. The arrangement of this field stop FS is the same as in the embodiment shown in FIGS. 1, 2A, 2B and 2C, and a detailed description thereof will be omitted.

The circuit pattern on the mask 10 is illuminated with an illumination light beam (exposure light beam) from an illumination optical system 40 at an almost uniform illuminance. The light beam from the circuit pattern propagates along the −Z direction in FIG. 23 is incident on the prism member $P_1$, deflected by 90° by the total reflecting surface $P_{1a}$ of the prism member $P_1$, propagates along the +X direction in FIG. 23, and exits from the prism member $P_1$. The light beam from the prism member $P_1$ is incident on the first positive lens group $G_{1P}$ ($L_{1P1}$ to $L_{1P4}$) and reaches the first concave reflecting mirror $M_1$ through the first negative lens group $G_{1N}$ ($L_{1N1}$). The first concave reflecting mirror $M_1$ is arranged almost at the rear focal position of the first refraction optical system $S_1$ ($G_{1P}$ and $G_{1N}$). That is, the first concave reflecting mirror $M_1$ is located at the pupil plane of the first imaging optical system $K_1$. The rear focal position of the first refraction optical system $S_1$ is obtained when the prism member $P_1$ side is defined as a front side, and the first concave reflecting mirror $M_1$ side is defined as a rear side.

The light beam reflected by the first concave reflecting mirror $M_1$ propagates along the –X direction in FIG. 1 through the first negative lens group $G_{1N}$ ($L_{1N1}$) and the first positive lens group $G_{1P}$ ($L_{1P1}$ to $L_{1P4}$) and is incident on the rectangular prism $P_1$. The light beam incident on the rectangular prism $P_1$ is deflected by about 90° by the total reflecting surface $P_{1b}$ provided in the rectangular prism $P_1$, propagates along the –Z direction in FIG. 23, and forms the primary image of the circuit pattern at the position of the field stop FS. In this primary image, the transverse magnification in the X direction is almost +1 time, and the transverse magnification in the Y direction is almost –1 time.

The light beam from the primary image forms the secondary image of the circuit pattern onto the plate 30 through the second imaging optical system $K_2$. The transverse magnifications in the X and Y directions of this secondary image are almost +1 time. That is, the secondary image formed on the plate 30 is an erect image. The function of the second imaging optical system $K_2$ is the same as that of the first imaging optical system $K_1$, and a detailed description thereof will be omitted.

In this embodiment as well, since the image of the circuit pattern, which is formed on the plate 30, is an erect image, scanning exposure can be performed by performing an exposure operation while integrally moving the mask 10 held by a mask stage MS and the plate 30 held by a plate stage PS in the same direction.

Telecentricity is achieved in the first imaging optical system $K_1$ on the mask 10 side and on the field stop FS side because the first concave reflecting mirror is arranged at the rear focal position of the first refraction optical system $S_1$. Similarly, telecentricity is achieved in the second imaging optical system $K_2$ on the field stop FS side and on the plate 30 side because the second concave reflecting mirror $M_2$ is arranged at the rear focal position of the first refraction optical system $S_2$. That is, the first projection optical system 35a is a both-side telecentric optical system (on the mask 10 side and on the plate 30 side).

In this embodiment, a plurality of projection optical systems each having the same arrangement as that of the first projection optical system 35a are arranged, as shown in FIG. 3. The arrangement of these projection optical systems is the same as in FIG. 3, and a detailed description thereof will be omitted.

Figure 24:
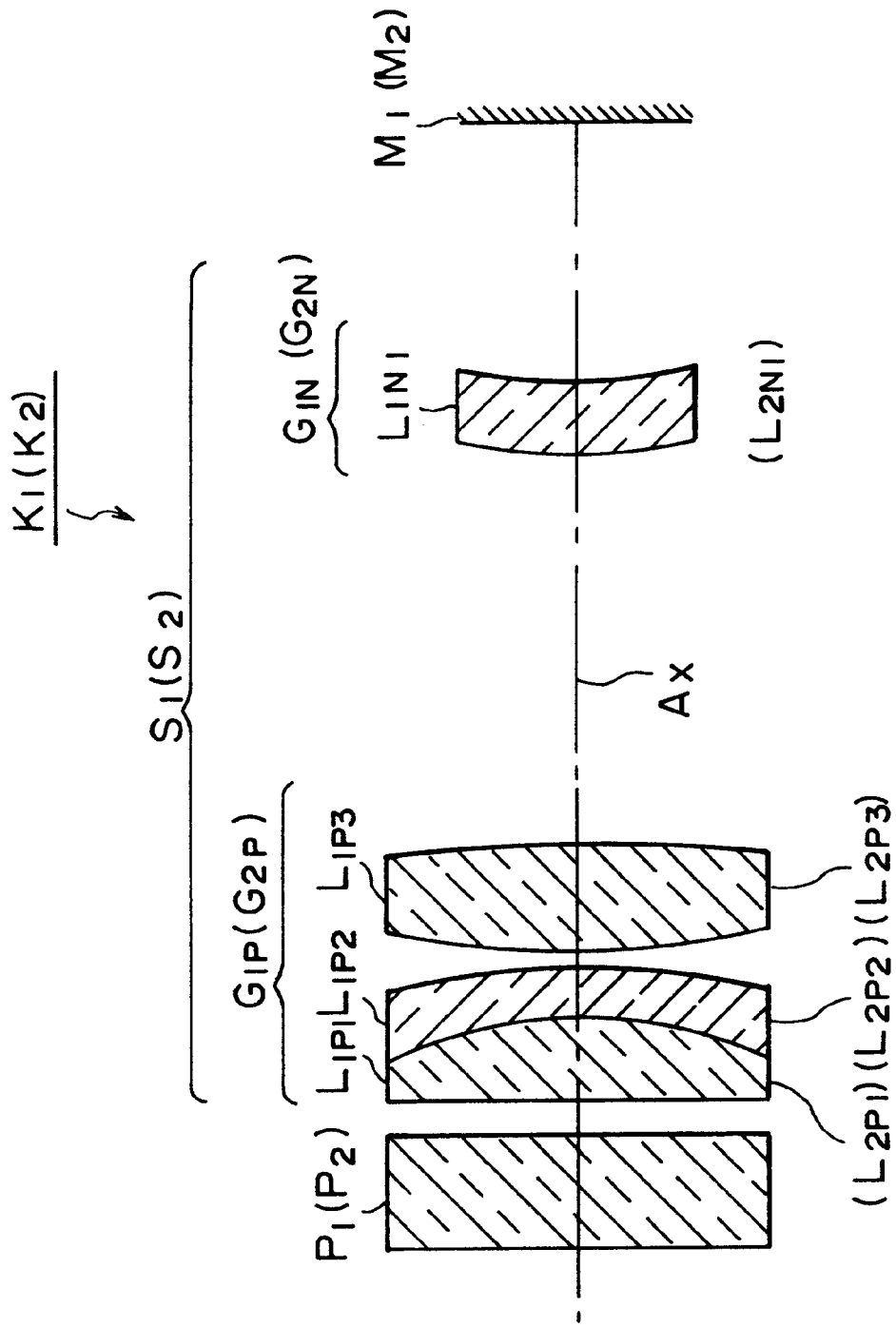
FIG. 24 is a view showing the lens arrangement of a projection optical system according to the tenth embodiment.

FIG. 24 is a view showing the lens arrangement of the first imaging optical system $K_1$ (or the second imaging optical system $K_2$) shown in FIG. 23, in which the prism member $P_1$ (or the prism member $P_2$) is illustrated as a plane-parallel plate.

As shown in FIG. 24, in this embodiment, the bonded lenses $L_{1P1}$ and $L_{1P2}$ (or $L_{2P1}$ and $L_{2P2}$) are arranged in the first positive lens group $G_{1P}$ (or the second positive lens group $G_{2P}$). With this arrangement, the number of components of the first positive lens group $G_{1P}$ (or the second positive lens group $G_{2P}$) itself can be decreased, and a larger decentering tolerance can be set to the first positive lens group $G_{1P}$ (or the second positive lens group $G_{2P}$). Therefore, the projection optical system can be easily manufactured.

Figure 25A:
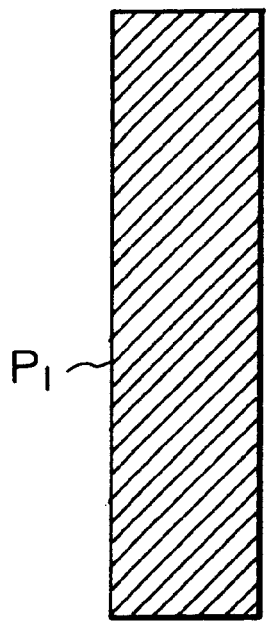
FIGS. 25A and 25B show a modification of a prism member in the tenth embodiment.
Figure 25B:
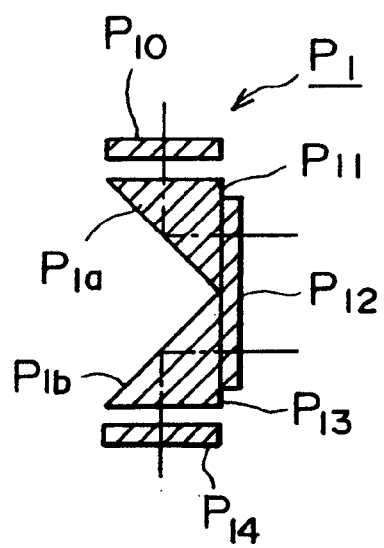

In the embodiment shown in FIG. 24, the plane-parallel plate corresponding to the prism member $P_1$ (or the prism member $P_2$) can also be divided. More specifically, the prism plate $P_1$ consisting of a plane-parallel plate as shown in FIG. 25A can be divided into rectangular prisms $P_{11}$ and $P_{13}$ having the total reflecting surfaces $P_{1a}$ and $P_{1b}$ and plane-parallel plates $P_{10}$, $P_{12}$, and $P_{14}$, as shown in FIG. 25B. In the example shown in FIG. 25B, the plane-parallel plate $P_{12}$ bonded to the rectangular prisms $P_{11}$ and $P_{13}$ has a function of supporting the two rectangular prisms $P_{11}$ and $P_{13}$. The plane-parallel plates $P_{10}$ and $P_{14}$ are arranged to be rotated about an axis corresponding to a direction perpendicular to the optical axis, thereby obtaining a function of moving the field or image in a plane perpendicular to the optical axis, i.e., the function of so-called halving glass.

Table 11 shows the numerical data of the optical system shown in FIG. 24. Leftmost numbers represent the order from an object O side (or the primary image side) to the first concave reflecting mirror $M_1$ (or the second concave reflecting mirror $M_2$); r, the radius of curvature of a lens surface or a reflecting surface; d, the distance between lens surfaces; n, the refractive index of a medium (optical material) with respect to a light beam with an exposure wavelength (g-line: 436 nm); and Φ, the outer diameter of a medium (optical material). In Table 11, WD represents the working distance of the first imaging optical system $K_1$; $D_1$, the distance from the object surface O to the vertex of the rectangular prism $P_1$ (a point on the ridgeline formed by the two reflecting surfaces perpendicular to each other) in the first imaging optical system $K_1$ (the distance from the object surface O to an optical axis AX of the first imaging optical system $K_1$); $D_2$, the distance from the vertex of the rectangular prism $P_1$ to the vertex of the positive meniscus lens $L_{1P1}$ on the prism $P_1$ side; $D_{OI}$, the distance from the object surface O (mask) to an image surface I (primary image surface); Φmax, the maximum outer diameter of the first or second imaging optical system ($K_1$ or $K_2$); $f_{GP}$, the focal length of the first positive lens group $G_{1P}$ (or the second positive lens group $G_{2P}$); $f_{GN}$, the focal length of the first negative lens group $G_{1N}$ (or the second negative lens group $G_{2N}$); TL, the distance (total length) on the optical axis AX from the object surface O to the first concave reflecting mirror $M_1$ (or the second concave reflecting mirror $M_2$); $r_M$, the radius of curvature of the first concave reflecting mirror $M_1$ (or the second concave reflecting mirror $M_2$); $r_{1N}$, the radius of curvature of the lens surface of the negative meniscus lens of the first negative lens group $G_{1N}$ on the first positive lens group $G_{1P}$ side; $r_{2N}$, the radius of curvature of the lens surface of the negative meniscus lens on the first concave reflecting mirror $M_1$ side; $L_{NM}$, the distance on the optical axis from the image-side principal point to the first concave reflecting mirror $M_1$, which image side corresponds to the first concave reflecting mirror $M_1$ side of the negative meniscus lens; and $L_{GP-GN}$, the distance from the image-side principal point, which image side corresponds to the first concave reflecting mirror $M_1$ side of the first positive lens group $G_{1P}$, to the image-side principal point, which image side corresponds to the first concave reflecting mirror $M_1$ side of the first negative lens group $G_{1N}$.

TABLE 11

Tenth Embodiment

WD = 2.49
$D_1$ = 2.38
$D_2$ = 0.11
$D_{OI}$ = 4.72
TL = 9.70

| | r | d | n | Φ | Optical Member |
|---|---|---|---|---|---|
| 0 | | 1.40 | 1.00000 | | |
| 1 | 0.00 | 0.98 | 1.59422 | | $P_1$ ($P_2$) |
| 2 | 0.00 | 0.11 | 1.00000 | | |
| 3 | −17.17 | 0.56 | 1.48088 | 2.7 | $L_{1P1}$ ($L_{2P1}$) |
| 4 | −2.30 | 0.27 | 1.60384 | 2.7 | $L_{1P2}$ ($L_{2P2}$) |

TABLE 11-continued

| 5 | -4.25 | 0.04 | 1.00000 | | |
|---|---|---|---|---|---|
| 6 | 7.35 | 0.70 | 1.48088 | 2.7 | $L_{1P3}$ ($L_{2P3}$) |
| 7 | 18.96 | 3.25 | 1.00000 | | |
| 8 | 3.47 | 0.62 | 1.60384 | 2.0 | $L_{1N1}$ ($L_{2N1}$) |
| 9 | 3.20 | 2.13 | 1.00000 | | |
| 10 | -10.05 | | -1.00000 | 1.8 | $M_1$ ($M_2$) |

Condition Correspondence Values of Tenth Embodiment (1) $2(WD - D_2)/\Phi max = 1.76$
(2) $|f_{GN}/f_{GP}| = 84.6$
(3) $q = -24.8$
(4) $L_{NM}/TL = -3.57$
(5) $L_{GP\text{-}GN}/TL = 4.22$
(6) $|r_M/TL| = 1.04$
(7) $f_{GP}/TL = 0.665$ In Table 11, an image height Y is 1.0, and a numerical aperture N.A on the image side is 0.1. The 0th surface corresponds to the object surface or the image surface. In Table 11, the distance TL on the optical axis AX from the object surface O to the first concave reflecting mirror $M_1$ (or the second concave reflecting mirror $M_2$) represents the air conversion length of the prism member $P_1$ (or the prism member $P_2$).

The optical system shown in Table 11 satisfies relation (1) so that a sufficient working distance is ensured.

The total length TL of the first and second imaging optical systems ($K_1$ and $K_2$) of the embodiment shown in Table 11 is 9.70, and the total length TL of the Dyson optical system shown in Table 2 is 58.22. Therefore, the total length of the embodiment shown in Table 11 is as small as about ⅙ that of the Dyson optical system in FIG. 6.

FIGS. 26A, 26B and 26C show various aberrations caused by the light beam with an exposure wavelength (g-line: 436 nm) of the embodiment shown in FIG. 24. Comas shown in FIG. 22C are represented by aberration curves at image heights of 1, 0.75, and 0.5. The scale of a coma at each image height is ±0.014 μm. As is apparent from various aberrations shown in FIGS. 26A, 26B and 26C, the various aberrations are corrected in a good balance.

Ten examples of an optimum optical system constituting the first or second imaging optical system ($K_1$ or $K_2$) have been described above with reference to FIGS. 4, 7, 9, 11, 13, 15, 17, 19, 21, and 24. However, both the first and second imaging optical systems ($K_1$ and $K_2$) need not be constituted by identical optical systems. For example, the first imaging optical system $K_1$ can be constituted by one of the ten optical systems shown in FIGS. 4, 7, 9, 11, 13, 15, 17, 19, 21, and 24 while the second imaging optical system $K_2$ can be constituted by any other of the ten optical systems, as a matter of course.

According to each of the above embodiments, a wide exposure area can be formed in a direction perpendicular to the scanning direction by a plurality of projection optical systems. For this reason, the exposure area can be extended without increasing the size of the individual projection optical systems. In addition, in each of the above embodiments, since size reduction of the projection optical system can be achieved, an increase in aberration according to an increase in size of the optical system can be suppressed. Furthermore, in each of the above embodiments, an exposure operation of a large screen can be performed by one-shot scanning exposure. Therefore, an increase in throughput can be achieved, and a seamless screen can be formed.

As has been described above, according to the present invention, a high-performance and compact exposure apparatus which can perform a projection exposure operation with satisfactory optical performance by using a plurality of compact projection optical systems each capable of ensuring a sufficient working distance and having excellent imaging performance, while preventing a decrease in throughput even in a large exposure area, can be achieved.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A scanning apparatus for projecting and transferring an image of a first object onto a second object, comprising:

a first both-side telecentric projection optical system including a first imaging optical system and a second imaging optical system, and having a first field area on the first object and a first exposure area on the second object; and a second both-side telecentric projection optical system including a third imaging optical system and a fourth imaging optical system, and having a second field area, which differs from the first field area, on the first object and a second exposure area on the second object;

said first and third imaging optical system each including a first refraction optical system and a first concave reflecting mirror;

said first imaging optical system forms a first intermediate image of the first object;

said third imaging optical system forms a second intermediate image of the first object;

said first refraction optical system including a first positive lens group having a positive refractive power, a first negative lens group, arranged between the first positive lens group and the first concave reflecting mirror, having a negative refracting power, and a first space arranged between said first positive lens group and said first negative lens group;

said first refraction optical system and said first concave reflecting mirror arranged such that light from the first object passes through the first positive lens group, the first space, and the first negative lens group, reflected by said first concave reflecting mirror and passes through the first negative lens group, the first space, and the first positive lens group;

said second and fourth imaging optical system each including a second refraction optical system and a second concave reflecting mirror;

said second imaging optical system forms first image of the first intermediate image onto second object;

said fourth imaging optical system forms second image of the second intermediate image onto second object;

said second refraction optical system including a second positive lens group having a positive refractive power, a second negative lens group, arranged between the second positive lens group and the second concave reflecting mirror, having a negative refractive power, a second space arranged between said second positive lens group and said second negative lens group;

said second refraction optical system and said second concave reflecting mirror arranged such that light from the first object passes through the second positive lens group, the second space, and the second negative lens group, reflected by said second concave reflecting mirror and passes through the second negative lens group, the second space, and the second positive lens group; and said first and second images on the second object each being a real-size erect image with positive horizontal and vertical lateral magnifications, wherein said images are projected and transferred from the first object onto the second object while said telecentric projection optical system and said objects are moved relatively with respect to each other;

said first projection optical system and said second projection optical system arranged such that side portions of said first exposure area and said second exposure area overlap each other in the scanning by the relative scan movement between said first and second objects and said first and second projection optical systems.

2. An scanning apparatus according to claim 1, wherein when a focal length of said first positive lens group in said first imaging optical system is $f_{GP}$, and a focal length of said first negative lens group in said first imaging optical system is $f_{GN}$, the following relation is satisfied:

$$3<|f_{GN}/f_{GP}|.$$

3. An scanning apparatus according to claim 1, wherein when a focal length of said second positive lens group in said second imaging optical system is $f_{GP}$, and a focal length of said second negative lens group in said second imaging optical system is $f_{GN}$, the following relation is satisfied:

$$3<|f_{GN}/f_{GP}|.$$

4. An scanning apparatus according to claim 1, wherein said first negative lens group includes a negative meniscus lens having a convex surface facing a first positive lens group side, and wherein when a radius of curvature of a lens surface of said negative meniscus lens on said first positive lens group side is $r_{1N}$, a radius of curvature of a lens surface of said negative meniscus lens on a first concave reflecting mirror side is $r_{2N}$, a distance on an optical axis from an image-side principal point to said first concave reflecting mirror, which image side corresponds to said first concave reflecting mirror side of said negative meniscus lens, is $L_{NM}$, and a distance on an optical axis from said first object to said first concave reflecting mirror is TL, the following relations are satisfied:

$$-30<q<-3$$

$$-4<L_{NM}/TL<0.2$$

where $q=(r_{2N}+r_{1N})/(r_{2N}-r_{1N})$.

5. An scanning apparatus according to claim 1, wherein said second negative lens group includes a negative meniscus lens having a convex surface facing a second positive lens group side, and wherein when a radius of curvature of a lens surface of said negative meniscus lens on said second positive lens group side is $r_{1N}$, a radius of curvature of a lens surface of said negative meniscus lens on a second concave reflecting mirror side is $r_{2N}$, a distance on an optical axis from an image side principal point to said second concave reflecting mirror, which image side corresponds to said concave reflecting mirror side of said negative meniscus lens, is $L_{MN}$, and a distance on an optical axis from said intermediate image to said second concave mirror is TL, the following relations are satisfied:

$$-30<q<-3$$

$$-4<L_{MN}/TL<0.2$$

where $q=(r_{2N}+r_{1N})/(r_{2N}-r_{1N})$.

6. An scanning apparatus according to claim 1, wherein a distance on an optical axis from a image side-principal point of said first positive lens group to an image side-principal point of said first negative lens group is $L_{GP-GN}$, and a distance on an optical axis from said first object to said first concave reflecting mirror is TL, the following relation is satisfied:

$$0.35<L_{GP-GN}/TL,$$

where said image side concerning the first positive lens group is the first reflecting mirror side of said first positive lens group, and said image side concerning the first negative lens group is the first reflecting mirror side of said first negative lens group.

7. An scanning apparatus according to claim 1, a distance on an optical axis from an image side principal point of said second positive lens group to an image side-principal point of said second negative lens group is $L_{GP-GN}$, and a distance on optical axis from said intermediate image to said second concave reflecting mirror is TL, the following relation is satisfied:

$$0.35<L_{GP-GN}/TL,$$

where said image side concerning the second positive lens group is the second reflecting mirror side of said second positive lens group, and said image side concerning the second negative lens group is the second reflecting mirror side of said second negative lens group.

8. An scanning apparatus according to claim 1, wherein when a radius of curvature of said first concave reflecting mirror in said first imaging optical system is $r_N$, a focal length of said first positive lens group is $f_{GP}$, and a distance on an optical axis from said first object to said first concave reflecting mirror is TL, the following relations are satisfied:

$$0.95<|r_M/TL|<1.08$$

$$0.3<f_{GP}/TL<1.0.$$

9. An scanning apparatus according to claim 1, wherein when a radius of curvature of said second concave mirror in said second imaging optical system is $r_M$, a focal length of said second positive lens group is $F_{GP}$, and a distance on a optical axis from said intermediate image to said second concave reflecting mirror is TL, the following relations are satisfied.

$$0.95<|r_M/TL|<1.08$$

$$0.3<F_{GP}/TL<1.0.$$

10. An scanning apparatus according to claim 1, wherein said first negative lens group has a positive lens and a negative meniscus lens having a concave surface facing said first positive lens group side, in an order from a first positive lens group side, and wherein said second negative lens group has a positive lens and a negative meniscus lens having a concave surface facing said second positive lens group side, in an order from a second positive lens group side.

11. An scanning apparatus according to claim 1, wherein said first negative lens group has a negative meniscus lens bonded to said first concave reflecting mirror, and wherein said second negative lens group has a negative meniscus lens bonded to said second concave reflecting mirror.

12. An scanning apparatus according to claim 1, wherein said first imaging optical system has a first reflecting member for deflecting a light beam from said first object toward said first positive lens group and deflecting the light beam from said first positive lens group toward said second imaging optical system, and wherein said second imaging optical system has a second reflecting member for deflecting the light beam from said first imaging optical system toward said second positive lens group and deflecting the light beam from said second positive lens group toward said second object.

13. A method of manufacturing a liquid crystal panel, comprising a steps of:

preparing a mask with a predetermined circuit pattern formed thereon;

preparing a glass substrate coated with a resist; and transferring a real-size erect image of the mask onto the glass substrate, by the scanning apparatus of claim 1, while moving the mask and the glass substrate.

14. An scanning apparatus according to claim 1, wherein said first and second reflecting surface is formed on a first reflecting member, and said third and fourth reflecting surface is formed on a second reflecting member.

15. An scanning apparatus according to claim 14, wherein said first and second projection optical system satisfy following condition:

$$2(WD-D_2)/\phi\ max>1$$

where $\phi$ max is maximum outer diameter of said first and second imaging optical system, WD is working distance of said first and second imaging optical system, and D2 is distance between said first and second reflecting member and said first and second positive lens group.

16. An scanning apparatus according to claim 1, wherein said first negative lens group includes a first negative meniscus lens having a convex surface facing a first positive group side, and wherein said second negative lens group includes a second negative lens having a convex surface facing a second positive group side.

17. A method of projecting a pattern from an original onto substrate, comprising:

illuminating the original as the first object; and forming the first and second images on the substrate by the scanning apparatus of claim 1.

18. An scanning apparatus according to claim 1, wherein said first positive lens group includes at least three lenses, and said second positive lens group includes at least three lenses.

19. A scanning apparatus for projecting and transferring an image of a mask being a first object onto a plate being a second object, comprising:

a first projection optical system including a first imaging optical system having a unit magnification, a second imaging optical system having a unit magnification, a first field area on the mask and a first exposure area on the plate;

a second projection optical system including a third imaging optical system having a unit magnification, a fourth imaging optical system having a unit magnification, a second field area, which differs from the first field area, on the mask and a second exposure area on the plate;

said first imaging optical system comprises a first reflecting surface, a first positive lens group with a positive refractive power, a first space, a first negative lens group with a negative refractive power, a first concave reflecting mirror, and a second reflecting surface;

said second imaging optical system comprises a third reflecting surface, a second positive lens group with a positive refractive power, a second space, a second negative lens group with a negative refractive power, a second concave reflecting mirror, and a fourth reflecting surface;

said third imaging optical system comprises a fifth reflecting surface, a third positive lens group with a positive refractive power, a third space, a third negative lens group with a negative refractive power, a third concave reflecting mirror, and a sixth reflecting surface;

said fourth imaging optical system comprises a seventh reflecting surface, a fourth positive lens group with a positive refractive power, a fourth space, a fourth negative lens group with a negative refractive power, a fourth concave reflecting mirror, and an eighth reflecting surface;

said first projection optical system arranged such that light from the first field area reflected by the first reflecting surface, passes through the first positive lens group, the first space, and the first negative lens group, reflected by the first concave reflecting mirror, passes through the first negative lens group, the first space, and the first positive lens group again, reflected by the second reflecting surface and the third reflecting surface, passes through the second positive lens group, the second space, and the second negative lens group, reflected by said second concave reflecting mirror, passes through the second negative lens group, the second space, and the second positive lens group again, and reflected by the fourth reflecting surface, thereby forming a first real-size erect image of the first field area on the mask onto the plate; and said second projection optical system arranged such that light from the second field area reflected by the fifth reflecting surface, passes through the third positive lens group, the third space, and the third negative lens group, reflected by the third concave reflecting mirror, passes through the third negative lens group, the third space, and the third positive lens group again, reflected by the sixth reflecting surface and the seventh reflecting surface, passes through the fourth positive lens group, the fourth space, and the fourth negative lens group, reflected by said fourth concave reflecting mirror, passes through the fourth negative lens group, the fourth space, and the fourth positive lens group again, and reflected by the eighth reflecting surface, thereby forming a second real-size erect image of the first field area on the mask onto the plate;

wherein said first and second images are projected and transferred from the first object onto the second object while said telecentric projection optical system and said objects are moved relatively with respect to each other, and wherein said first projection optical system and said second projection optical system arranged such that side portions of said first exposure area and said second exposure area overlap each other in the scanning by the relative scan movement between said first and second objects and said first and second projection optical systems.

20. An scanning apparatus according to claim 19, further comprising:

a mask stage to hold the mask; and a plate stage to hold the plate;

said mask stage and said plate stage moving along a scanning direction.

21. An scanning apparatus according to claim 20, wherein said first field area and said second field area are arranged different position along the scanning direction.

22. An scanning apparatus according to claim 20, wherein said first field area and said second field area are arranged different position along a direction perpendicular to the scanning direction.

23. An scanning apparatus according claim 20, wherein a direction perpendicular to the scanning direction is set along a vertical direction.

24. A method of manufacturing a liquid crystal panel, comprising a steps of:

preparing a mask with a predetermined circuit pattern formed thereon;

preparing a glass substrate coated with a resist; and transferring a real-size erect image of the mask onto the glass substrate, by the scanning apparatus of claim 19, while moving the mask and the glass substrate.

25. An scanning apparatus according to claim 19, wherein when a radius of curvature of said first concave reflecting mirror in said first imaging optical system is $r_{M1}$, a focal length of said first positive lens group is $f_{GP1}$ and a distance on a optical axis from said first object to said first concave reflecting mirror is TL1, the following relations are satisfied:

$$0.95 < |r_{M1}/TL1| < 1.08$$

$$0.3 < f_{GP1}/TL1 < 1.0$$

and when a radius of curvature of said second concave reflecting mirror in said second imaging optical system is $r_{M2}$ a focal length of said second positive lens group is $f_{GP2}$ and a distance on an optical axis from said intermediate image to said second concave reflecting mirror is TL2, the following relations are satisfied:

$$0.95 < |r_{M2}/TL2| < 1.08$$

$$0.3 < f_{GP2}/TL2 < 1.0.$$

26. A method of projecting a pattern from an original onto substrate, comprising:

illuminating the original as the first object; and forming the first and second images on the substrate by the scanning apparatus of claim 19.

27. An scanning apparatus according to claim 19, wherein said first positive lens group includes at least three lenses, said second positive lens group includes at least three lenses, said third positive lens group includes at least three lenses, and said fourth positive lens group includes at least three lenses.

28. A scanning apparatus for projecting and transferring an image of a first object onto a second object, comprising:

a first both-side telecentric projection optical system including a first imaging optical system and a second imaging optical system, and having a first field area on the first object;

a second both-side telecentric projection optical system including a third imaging optical system and a fourth imaging optical system, and having a second field area, which differs from the first field area, on the first object;

said first and third imaging optical system each including a first refraction optical system and a first concave reflecting mirror;

said first imaging optical system forms a first intermediate image of the first object;

said third imaging optical system forms a second intermediate image of the first object;

said first refraction optical system including a first positive lens group having a positive refractive power, a first negative lens group, arranged between the first positive lens group and the first concave reflecting mirror, having a negative refractive power, and a first space arranged between said first positive lens group and said first negative lens group;

said first refraction optical system and said first concave reflecting mirror arranged such that light from the first object passes through the first positive lens group, the first space, and the first negative lens group, reflected by said first concave reflecting mirror and passes through the first negative lens group, the first space, and the first positive lens group;

said second and fourth imaging optical system each including a second refraction optical system and a second concave reflecting mirror;

said second imaging optical system forms a first image of the first intermediate image onto the second object;

said fourth imaging optical system forms a second image of the second intermediate image onto the second object;

said second refraction optical system including a second positive lens group having a positive refractive power, a second negative lens group, arranged between the second positive lens group and the second concave reflecting mirror, having a negative refractive power, a second space arranged between said second positive lens group and said second negative lens group;

said second refraction optical system and said second concave reflecting mirror arranged such that light from the first object passes through the second positive lens group, the second space, and the second negative lens group, reflected by said second concave reflecting mirror and passes through the second negative lens group, the second space, and the second positive lens group;

said first and second images on the second object each being a real size erect image with positive horizontal and vertical lateral magnification, wherein said images are projected and transferred from the first object onto the second object while said telecentric projection optical system and said objects are moved relatively with respect to each other;

said first projection optical system and said second projection optical system are disposed such that the first field area and the second field area are arranged along a direction crossing the scanning direction by the relative scan movement between said first and second objects and said first and second projection optical systems;

wherein the first concave reflecting mirror is substantially arranged at a rear focal point of the first refraction optical system; and the second concave reflecting mirror is substantially arranged at a rear focal point of the second concave mirror.

29. A method of projecting a pattern from an original onto substrate, comprising:

illuminating the original as the first object; and forming the first and second images on the substrate by the scanning apparatus of claim 28.

30. A scanning apparatus for projecting and transferring an image of a mask being a first object onto a plate being a second object, comprising:

a first projection optical system including a first imaging optical system having a unit magnification, a second imaging optical system having a unit magnification, and a first field area on the mask; and a second projection optical system including a third imaging optical system having a unit magnification, a fourth imaging optical system having a unit magnification, and a second field area, which differs from the first field area, on the mask;

said first and third imaging optical system each comprising a first reflecting surface, a first positive lens group with a positive refractive power, a first negative lens group with a negative refractive power, a first concave reflecting mirror, and a second reflecting surface respectively, wherein said first negative lens group includes a negative meniscus lens having a convex surface facing a first positive lens group side, said second and fourth imaging optical system each comprising a third reflecting surface, a second positive lens group with a positive refractive power, a second negative lens group with a negative refractive power, a second concave reflecting mirror, and a fourth reflecting surface respectively;

wherein light from the first field area is reflected by the first reflecting surface of said first imaging optical system, passes through the first positive lens group and the first negative lens group of said first imaging optical system, is reflected by the first concave reflecting mirror of said first imaging optical system, passes through the first negative lens group and the first positive lens group of said first imaging optical system again, is reflected by the second reflecting surface of said first imaging optical system and the third reflecting surface of said second imaging optical system, passes through the second positive lens group and the second negative lens group of said second imaging optical system, is reflected by said second concave reflecting mirror of said second imaging optical system, passes through the second negative lens group and the second positive lens group of said second imaging optical system again, and is reflected by the fourth reflecting surface of said second imaging optical system, thereby forming a real-size erect image of the first field area of the mask onto the plate; and wherein light from the second field area is reflected by the first reflecting surface of said third imaging optical system, passes through the first positive lens group and the first negative lens group of said third imaging optical system, is reflected by the first concave reflecting mirror of said third imaging optical system, passes through the first negative lens group and the first positive lens group of said third imaging optical system again, is reflected by the second reflecting surface of said third imaging optical system and the third reflecting surface of said fourth imaging optical system, passes through the second positive lens group and the second negative lens group of said fourth imaging optical system, is reflected by said second concave reflecting mirror of said fourth imaging optical system, passes through the second negative lens group and the second positive lens group of said fourth imaging optical system again, and is reflected by the fourth reflecting surface of said fourth imaging optical system, thereby forming a real-size erect image of the second field area of the mask onto the plate, wherein when a focal length of said first positive lens group in said first imaging optical system $f_{GP1}$, and a focal length of said first negative lens group in said first imaging optical system, $f_{GN1}$, the following relation is satisfied:

$$3 < |f_{GN1}/f_{GP1}|$$

and when a focal length of said second positive lens group in said second imaging optical system is $f_{GP2}$, and a focal length of said second negative lens group in said second imaging optical system is $f_{GN2}$, the following relation is satisfied:

$$3 < |f_{GN2}/f_{GP2}|,$$

wherein said images are projected and transferred from the first object onto the second object while said telecentric projection optical system and said objects are moved relatively with respect to each other, wherein when a radius of curvature of a lens surface of said negative meniscus lens on said first positive lens group side is $r_{1N1}$, a radius of curvature of a lens surface of said negative meniscus lens on a first concave reflecting mirror side is $r_{2N1}$, the following relation is satisfied:

$$-30 < q < -3,$$

where $q = (r_{2N1} + r_{1N1})/(r_{2N1} - r_{1N1})$.

31. An scanning apparatus according to claim 30, wherein said first negative lens group including a negative meniscus lens having a convex surface facing a first positive lens group side, and wherein when a radius of curvature of a lens surface of said negative meniscus lens on said first positive lens group side is $r_{1N1}$ a radius of curvature of a lens surface of said negative meniscus lens on a first concave reflecting mirror side is $r_{2N1}$, a distance on an optical axis from an image-side principal point to said first concave reflecting mirror, which image side corresponds to said first concave reflecting mirror side of said negative meniscus lens, is $L_{NM1}$, and a distance on an optical axis from said first object to said first concave reflecting mirror is TL1, the following relations are satisfied:

$$-30 < q < -3$$

$$-4 < L_{NM1}/TL1 < 0.2$$

where $q = (r_{2N1} + r_{1N1})/(r_{2N1} - r_{1N1})$ and said second negative lens group including a negative meniscus lens having a convex surface facing a second positive lens group side, and wherein when a radius of curvature of a lens surface of said negative meniscus lens on said second positive lends group side is $r_{1N2}$ a radius of curvature of a lens surface of said negative meniscus lens on a second concave reflecting mirror side to $r_{2N2}$, a distance on an optical axis from an image-side principal point to said second concave reflecting mirror, which image side corresponds to said second concave reflecting mirror side of said negative meniscus lens, is $L_{NM2}$, and a distance on a optical axis, from said first object to said first concave reflecting mirror is TL2, the following relations are satisfied:

$-30 < q < -3$ $-4 < L_{NM2}/TL2 < 0.2$ where $q = (r_{2N2} + r_{1N2})/(r_{2N2} - r_{1N2})$.

32. An scanning apparatus according to claim 31, wherein when a distance from an image-side principal point, which image side corresponds to a first concave reflecting mirror side of said first positive lens group, to an image-side principal point, which image side corresponds to a first concave reflecting mirror side of said first negative lens group is $L_{1(GP-GN)}$, and a distance on a optical axis from said first object to said first concave reflecting mirror is TL1 the following relation is satisfied:

$0.35 < L_{1(GP-GN)}/TL1$.

and when a distance from an image-side principal point, which image side corresponds to a second concave reflecting mirror side of said second positive lens group, to an image-side principal point, which image side corresponds to a second concave reflecting mirror side of said second negative lens group is $L_{2(GP-GN)}$ and a distance on a optical axis from said first object to said second concave reflecting mirror is TL2, the following relation is satisfied:

$0.35 < L_{2(GP-GN)}/TL2$.

33. An scanning apparatus according to claim 32, wherein when a radius of curvature of said first concave reflecting mirror in said imaging optical system is $r_{M1}$, a focal length of said first positive lens group is $f_{GP1}$ and a distance on an optical axis from said first object to said first concave reflecting mirror is TL1, the following relations are satisfied:

$0.95 < |r_{M1}/TL1| < 1.08$ $0.3 < f_{GP1}/TL1 < 1.0$ and when a radius of curvature of said second concave reflecting mirror in said second imaging optical system is $r_{M2}$ a focal length of said second positive lens group is $f_{GP2}$ and a distance on an optical axis from said intermediate image to said second concave reflecting mirror is TL2, the following relations are satisfied:

$0.95 < |r_{M2}/TL2| < 1.08$ $0.3 < f_{GP2}/TL2 < 1.0$.

34. An scanning apparatus according to claim 30, wherein when a distance from an image-side principal point, which image side correspond to a first concave reflecting mirror side of said first positive lens group, to an image-side principal point, which image side corresponds to a first concave reflecting mirror side of said first negative lens group is $L_{1(GP-GN)}$, and a distance on an optical axis from said first object to said first concave reflecting mirror is TL1, the following relation is satisfied:

$0.35 < L_{1(GP-GN)}/TL1$ and when a distance from an image-side principal point, which image side corresponds to a second concave reflecting mirror side of said second positive lens group, to an image-side principal point, which image side corresponds to a second concave reflecting mirror side of said second negative lens group is $L_{2(GP-GN)}$ and a distance on an optical axis from said first object to said second concave reflecting mirror is TL2, the following relation is satisfied:

$0.35 < L_{2(GP-GN)}/TL2$.

35. An scanning apparatus according to claim 34, wherein when a radius of curvature of said first concave reflecting mirror in said first imaging optical system is $r_{M1}$, a focal length of said first positive lens group is $F_{GP1}$ and a distance on an optical axis from said first object to said first concave reflecting mirror is TL1, the following relations are satisfied:

$0.95 < |r_{M1}/TL1| < 1.08$ $0.3 < f_{GP1}/TL1 < 1.0$ and when a radius of curvature of said second concave reflecting mirror in said second imaging optical system is $r_{M2}$ a focal length of said second positive lens group is $f_{GP2}$ and a distance on an optical axis from said intermediate image to said second concave reflecting mirror is TL2, the following relations are satisfied:

$0.95 < |r_{M2}/TL2| < 1.08$ $0.3 < f_{GP2}/TL2 < 1.0$.

36. A method of projecting a pattern from an original onto substrate, comprising:
    illuminating the original as the first object; and
    forming the first and second images on the substrate by the scanning apparatus of claim 30.

37. An exposure apparatus for projecting and transferring an image of a mask being a first object onto a plate being a second object, comprising:
    a first projection optical system including a first imaging optical system having a unit magnification, a second imaging optical system having a unit magnification, and a first field area on the mask; and
    a second projection optical system includes a third imaging optical system having a unit magnification, a fourth imaging optical system having a unit magnification, and a second field area, which differs from the first field area, on the mask;
    said first and third imaging optical system each comprising a first reflecting surface, a first positive lens group with a positive refractive power, a first negative lens group with a negative refractive power, a first concave reflecting mirror, and a second reflecting surface respectively;

said second and fourth imaging optical system each comprising a third reflecting surface, a second positive lens group with a positive refractive power, a second negative lens group with a negative refractive power, a second concave reflecting mirror, and a fourth reflecting surface respectively;

wherein light from the first field area is reflected by the first reflecting surface of said first imaging optical system, passes through the first positive lens group and the first negative lens group of said first imaging optical system, reflected by the first concave reflecting mirror of said first imaging optical system, passes through the first negative lens group and the first positive lens group of said first imaging optical system again, is reflected by the second reflecting surface of said first imaging optical system and the third reflecting surface of said second imaging optical system, passes through the second positive lens group and the second negative lens group of said second imaging optical system, is reflected by said second concave reflecting mirror of said second imaging optical system, passes through the second negative lens group and the second positive lens group of said second imaging optical system again, and is reflected by the fourth reflecting surface of said second imaging optical system, thereby forming a real-size erect image of the first field area of the mask onto the plate; and wherein light from the second field area is reflected by the first reflecting surface of said third imaging optical system, passes through the first positive lens group and the first negative lens group of said third imaging optical system, reflected by the first concave reflecting mirror of said third imaging optical system, passes through the first negative lens group and the first positive lens group of said third imaging optical system again, is reflected by the second reflecting surface of said third imaging optical system and the third reflecting surface of said fourth imaging optical system, passes through the second positive lens group and the second negative lens group of said fourth imaging optical system, is reflected by said second concave reflecting mirror of said fourth imaging optical system, passes through the second negative lens group and the second positive lens group of said fourth imaging optical system again, and is reflected by the fourth reflecting surface of said fourth imaging optical system, thereby forming a real-size erect image of the second field area of the mask onto the plate, wherein said first negative lens group including a negative meniscus lens having a convex surface facing a first positive lens group side, and wherein when a radius of curvature of a lens surface of said negative meniscus lens on said first positive lens group side is $r_{1N1}$ a radius of curvature of a lens surface of said negative meniscus lens on a first concave reflecting mirror side is $r_{2N1}$, a distance on an optical axis from an image-side principal point to said first concave reflecting mirror, which image side corresponds to said first concave reflecting mirror side of said negative meniscus lens, is $L_{NM1}$, and a distance on an optical axis from said first object to said first concave reflecting mirror is TL1, the following relations are satisfied:

$$-30<q<-3$$

$$-4<L_{NM1}/TL1<0.2$$

where $q=(r_{2N1}+r_{1N1})/(r_{2N1}-r_{1N1})$ and said second negative lens group including a negative meniscus lens having a convex surface facing a second positive lens group side, and wherein when a radius of curvature of a lens surface of said negative meniscus lens on said second positive lens group side is $r_{1N2}$, a radius of curvature of a lens surface of said negative meniscus lens on a second concave reflecting mirror side is $r_{2N2}$, a distance on an optical axis from an image side principal point to said second concave reflecting mirror, which image side corresponds to said second concave reflecting mirror side of said negative meniscus lens, is $L_{NM2}$, and a distance on a optical axis, from an intermediate image to said second concave reflecting mirror is TL2, the following relations are satisfied:

$$-30<q<-3$$

$$-4<L_{NM2}/TL2<0.2$$

where $q=(r_{2N2}+r_{1N2})/(r_{2N2}-r_{1N2})$, wherein said images are projected and transferred from the first object onto the second object while said telecentric projection optical system and said objects are moved relatively with respect to each other.

38. An exposure apparatus according to claim 37, wherein when a distance from an image-side principal point, which image side corresponds to a first concave reflecting mirror side of said first positive lens group, to an image-side principal point, which image side corresponds to a first concave reflecting mirror side of said first negative lens group is $L_{1(GP-GN)}$, and a distance on an optical axis from said first object to said first concave reflecting mirror is TL1, the following relating is satisfied:

$$0.35<L_{1(GP-GN)}/TL1$$

and when a distance from an image-side principal point, which image side corresponds to a second concave reflecting mirror side of said second positive lens group, to an image-side principal point, which image side corresponds to a second concave reflecting mirror side of said second negative lens group is $L_{2(GP-GN)}$ and a distance on an optical axis from said first object to said second concave reflecting mirror is TL2, the following relation is satisfied:

$$0.35<L_{2(GP-GN)}/TL2.$$

39. An exposure apparatus according to claim 38, wherein when a radius of curvature of said first concave reflecting mirror in said first imaging optical system is $r_{M1}$, a focal length of said first positive lens group is $f_{GP1}$ and a distance on an optical axis from said first object to said first concave reflecting mirror is TL1, the following relations are satisfied:

$$0.95<|r_{M1}/TL1|<1.08$$

$$0.3<f_{GP1}/TL1<1.0$$

and when a radius of curvature of said second concave reflecting mirror in said second imaging optical system is $r_{M2}$ a focal length of said second positive lens group is $f_{GP2}$ and a distance on an optical axis from said intermediate image to said second concave reflecting mirror is TL2, the following relations are satisfied:

$$0.95<|r_{M2}/TL2|<1.08$$

$$0.3<f_{GP2}/TL2<1.0.$$

40. A method of projecting a pattern from an original onto substrate, comprising:
- illuminating the original as the first object; and
- forming the first and second images on the substrate by the exposure apparatus of claim 37.

41. An exposure apparatus for projecting and transferring an image of a mask being a first object onto a plate being a second object, comprising:
- a first projection optical system including a first imaging optical system having a unit magnification, a second imaging optical system having a unit magnification, a first field area on the mask; and
- a second projection optical system includes a third imaging optical system having a unit magnification, a fourth imaging optical system having a unit magnification, and a second field area, which differs from the first field area, on the mask;
- said first and third imaging optical system each comprising a first reflecting surface, a first positive lens group with a positive refractive power, a first negative lens group with a negative refractive power, a first concave reflecting mirror, and a second reflecting surface respectively;
- said second and fourth imaging optical system each comprising a third reflecting surface, a second positive lens group with a positive refractive power, a second negative lens group with a negative refractive power, a second concave reflecting mirror, and a fourth reflecting surface respectively;
- wherein light from the first field area is reflected by the first reflecting surface of said first imaging optical system, passes through the first positive lens group and the first negative lens group of said first imaging optical system, is reflected by the first concave reflecting mirror of said first imaging optical system, passes through the first negative lens group and the first positive lens group of said first imaging optical system again, is reflected by the second reflecting surface of said first imaging optical system and the third reflecting surface of said second imaging optical system, passes through the second positive lens group and the second negative group of said second imaging optical system, is reflected by said second concave reflecting mirror of said second imaging optical system, passes through the second negative lens group and the second positive lens group of said second imaging optical system again, and is reflected by the fourth reflecting surface of said second imaging optical system, thereby forming a real-size erect image of the first field area of the mask onto the plate; and
- wherein light from the second field area is reflected by the first reflecting surface of said third imaging optical system, passes through the first positive lens group and the first negative lens group of said third imaging optical system, is reflected by the first concave reflecting mirror of said third imaging optical system, passes through the first negative lens group and the first positive lens group of said third imaging optical system again, is reflected by the second reflecting surface of said third imaging optical system and the third reflecting surface of said fourth imaging optical system, passes through the second positive lens group and the second negative lens group of said fourth imaging optical system, is reflected by said second concave reflecting mirror of said fourth imaging optical system, passes through the second negative lens group and the second positive lens group of said fourth imaging optical system again, and is reflected by the fourth reflecting surface of said fourth imaging optical system, thereby forming a real-size erect image of the second field area of the mask onto the plate, wherein when a distance from an image-side principal point, which image side corresponds to a first concave reflecting mirror side of said first positive lens group, to an image-side principal point, which image side corresponds to a first concave reflecting mirror side of said first negative lens group is $L_{1(GP-GN)}$, and a distance on an optical axis from said first object to said first concave reflecting mirror is TL1, the following relation is satisfied:

$$0.35 < L_{1(GP-GN)}/TL1$$

and when a distance from an image-side principal point, which image side corresponds to a second concave reflecting mirror side of said second positive lens group, to an image-side principal point, which image side corresponds to a second concave reflecting mirror side of said second negative lens group is $L_{2(GP-GN)}$ and a distance on an optical axis from an intermediate image to said second concave reflecting mirror is TL2, the following relation is satisfied:

$$0.35 < L_{2(GP-GN)}/TL2,$$

wherein said images are projected and transferred from the first object onto the second object while said telecentric projection optical stems and said objects are moved relatively with respect to each other.

42. An exposure apparatus claim 41, wherein when a radius of curvature of said first concave reflecting mirror in said first imaging optical system is $r_{M1}$, a focal length of said first positive lens group is $f_{GP1}$ and a distance on an optical axis from said first object to said first concave reflecting mirror is TL1, the following relations are satisfied:

$$0.95 < |r_{M1}/TL1| < 1.08$$

$$0.3 < f_{GP1}/TL1 < 1.0$$

and when a radius of curvature of said second concave reflecting mirror in said second imaging optical system is $r_{M2}$, a focal length of said second positive lens group is $f_{GP2}$ and a distance on an optical axis from said intermediate image to said second concave reflecting mirror is TL2, the following relations are satisfied:

$$0.95 < |r_{M2}/TL2| < 1.08$$

$$0.3 < f_{GP2}/TL2 < 1.0.$$

43. A method of projecting a pattern from an original onto substrate, comprising:
- illuminating the original as the first object; and
- forming the first and second images on the substrate by the exposure apparatus of claim 41.

44. A scanning apparatus for projecting and transferring an image of a mask onto a plate while moving said mask and said plate along a scanning direction, comprising:
- an illuminating optical system for illuminating said mask;
- a mask stage for holding the mask;
- a first projection optical system having a first field area on the mask illuminated by said illuminating optical system;

a second projection optical system having a second field area, adjacent to the first field area, on the mask illuminated by said illuminating optical system;

a plate stage for holding the plate;

said first projection optical system includes a first reflecting surface, a first positive lens group, a first negative lens group, a first concave reflecting mirror, a second reflecting surface, a third reflecting surface, a second positive lens group, a second negative lens group, a second concave mirror, and a fourth reflecting surface;

said second projection optical system including a fifth reflecting surface, a third positive lens group, a third negative lens group, a third concave reflecting mirror, a sixth reflecting surface, a seventh reflecting surface, a fourth positive lens group, a fourth negative lens group, a fourth concave reflecting mirror, and an eighth reflecting surface;

light from the first field area reflected by said first reflecting surface, passes through the first positive lens group, and the first negative lens group, reflected by said first concave mirror, passes through the first negative lens group, and the first positive lens group again, reflected by the second reflecting surface, thereby forming an intermediate image of said first field area;

light from the intermediate image of said first field area reflected by said third reflecting surface, passes through the second positive lens group, and the second negative lens group, reflected by the second concave reflecting mirror, passes through the second negative lens group, and the second positive lens group again, and reflected by said fourth reflecting surface, thereby forming a secondary image of the first field area onto the plate;

light from the second field area reflected by said fifth reflecting surface, passes through the third positive lens group, and the third negative lens group, reflected by said third concave mirror, passes through the third negative lens group and the third positive lens group again, reflected by the sixth reflecting surface, thereby forming an intermediate image of the second field area;

light from the intermediate image of the second field area reflected by the seventh reflecting surface, passes through the fourth positive lens group, and the fourth negative lens group reflected by the fourth concave reflecting mirror, passes through the fourth negative lens group, and the fourth positive lens group again, and reflected by said eighth reflecting surface, thereby forming a secondary image of the second field area onto the plate;

said first and fifth reflecting surface reflect said light from the mask in opposite directions;

said third and seventh reflecting surface reflect said light from the intermediate images in opposite directions;

said first projection optical system and said second projection optical system are disposed such that the first field area and the second field area are arranged along a direction crossing the scanning direction by the relative scan movement between said first and second objects and said first and second projection optical systems; and said first through fourth positive lens group have a focal length $f_{GP1-4}$ respectively, said first through fourth negative lens group have a focal length $f_{GN1-4}$, respectively, and satisfying the following condition:

$$3 < |f_{GN1-4}/f_{GP1-4}|.$$

45. An scanning apparatus according to claim 44, wherein said first negative lens group including a negative meniscus lens having a convex surface facing a first positive lens group side, and wherein when a radius of curvature of a lens surface of said negative meniscus lens on said first positive lens group side is $r_{1N1}$ a radius of curvature of a lens surface of said negative meniscus lens on a first concave reflecting mirror said is $r_{2N1}$, a distance on an optical axis from an image-side principal point to said first concave reflecting mirror, which image side corresponds to said first concave reflecting mirror side of said negative meniscus lens, is $L_{NM1}$, and a distance on an optical axis from said first object to said first concave reflecting mirror is TL1, the following relations are satisfied:

$$-30 < q < -3$$

$$-4 < L_{NM1}/TL1 < 0.2$$

where $q = (r_{2N1} + r_{1N1})/(r_{2N1} - r_{1N1})$ and said second negative lens group including a negative meniscus lens having a convex surface facing a second positive lens group side, and wherein when a radius of curvature of a lens surface of said negative meniscus lens on said second positive lens group side is $r_{1N2}$ a radius of curvature of a lens surface of said negative meniscus lens on a second concave reflecting mirror side is $r_{2N2}$, a distance on an optical axis from an image-side principal point to said second concave reflecting mirror which image side corresponds to said second concave reflecting mirror side of said negative meniscus lens, is $L_{NM2}$, and a distance on an optical axis, from said first object to said first concave reflecting mirror is TL2, the following relations are satisfied:

$$-30 < q < -3$$

$$-4 < L_{NM2}/TL2 < 0.2$$

where $q = (r_{2N2} + r_{1N2})/(r_{2N2} - r_{1N2})$.

46. An scanning apparatus according to claim 44, wherein when a distance from an image-side principal point, which image side corresponds to a first concave reflecting mirror side of said first positive lens group, to an image-side principal point, which image side corresponds to a first concave reflecting mirror side of said first negative lens group is $L_{1(GP-GN)}$, and a distance on an optical axis from said first object to said first concave reflecting mirror is TL1, the following relation is satisfied:

$$0.35 < L_{1(GP-GN)}/TL1,$$

and when a distance from an image-side principal point, which image side corresponds to a second concave reflecting mirror side of said second positive lens group, to an image-side principal point, which image side corresponds to a second concave reflecting mirror side of said second negative lens group is $L_{2(GP-GN)}$ and a distance on an optical axis from said first object to said second concave reflecting mirror is TL2, the following relation is satisfied:

$$0.35 < L_{2(GP-GN)}/TL2.$$

47. An scanning apparatus according to claim 44, wherein when a radius of curvature of said first concave reflecting mirror in said first imaging optical system is $r_{M1}$, a focal length of said first positive lens group is $f_{GP1}$ and a distance on an optical axis from said first object to said first concave reflecting mirror is TL1, the following relations are satisfied:

$$0.95<|r_{M1}/TL1|<1.08$$

$$0.3<f_{GP1}/TL1<1.0$$

and when a radius of curvature of said second concave reflecting mirror in said second imaging optical system is $r_{M2}$ a focal length of said second positive lens group is $f_{GP2}$ and a distance on an optical axis from said intermediate image to said second concave reflecting mirror is TL2, the following relations are satisfied:

$$0.95<|r_{M2}/TL2|<1.08$$

$$0.3<f_{GP2}/TL2<1.0.$$

48. A method of projecting a pattern from an original onto substrate, comprising:
   illuminating the original as the first object; and
   forming the first and second images on the substrate by the scanning apparatus of claim 44.

49. An scanning apparatus according to claim 44, wherein said first positive lens group includes at least three lenses, said second positive lens group includes at least three lenses, said third positive lens group includes at least three lenses, and said fourth positive lens group includes at least three lenses.

50. An exposure apparatus for projecting and transferring an image of a mask onto a plate while moving said mask and said plate along a scanning direction, comprising: an illuminating optical system for illuminate said mask; a mask stage for holding the mask;
   a first projection optical system having a first field area on the mask illuminated by said illuminating optical system; a second projection optical system having a second field area, adjacent to the first field area, on the mask illuminated by said illuminating optical system; and
   a plate stage for holding the plate;
   said first projection optical system including a first reflecting surface, a first positive lens group, a first negative lens group, a first concave reflecting mirror, a second reflecting surface, a third reflecting surface, a second positive lens group, a second negative lens group, a second concave mirror, and a fourth reflecting surface;
   said second projection optical system including a fifth reflecting surface, a third positive lens group, a third negative lens group, a third concave reflecting mirror, a sixth reflecting surface, a seventh reflecting surface, a fourth positive lens group, a fourth negative lens group, a fourth concave reflecting mirror, a eighth reflecting surface; light from the first field area being reflected by said first reflecting surface, passing through the first positive lens group and the first negative lens group, being reflected by said first concave mirror, passing through the first negative lens group and the first positive lens group again, being reflected by the second reflecting surface, thereby forming an intermediate image of said first field area; light from the intermediate image of said first field area reflected by said third reflecting surface, passing through the second positive lens group and the second negative lens group, being reflected by the second concave reflecting mirror, passing through the second negative lens group and the second positive lens group again, and being reflected by said fourth reflecting surface, thereby forming an secondary image of the first field area onto the plate;
   light from the second field area being reflected by said fifth reflecting surface, passing through the third positive lens group and the third negative lens group, being reflected by said third concave mirror, passing through the third negative lens group and the third positive lens group again, and being reflected by the sixth reflecting surface, thereby forming an intermediate image of the second field area;
   light from the intermediate image of a second field area being reflected by the seventh reflecting surface, passing through the fourth positive lens group and the fourth negative lens group, being reflected by the fourth concave reflecting mirror, passing through the fourth negative lens group side and the fourth positive lens group again, and being reflected by said eighth reflecting surface, thereby forming an secondary image of the second field area onto the plate;
   said first and fifth reflecting surface reflect said light from the mask in opposite directions;
   said third and seventh reflecting surface reflecting said light from intermediate images in opposite directions;
   said first through fourth negative lens group having a negative meniscus lens having a convex surface facing a first through fourth positive lens group side respectively; wherein when radius of curvature of lens surfaces of said negative lenses on said first through fourth positive lens group side are $r_{1N}$ respectively, radius of curvature of lens surfaces of said negative meniscus lenses on the first through fourth concave reflecting mirror side are $r_{2N}$ respectively, distances on optical axes from an image-side principal point to said first through fourth concave reflecting mirror, which image side corresponds to said first through fourth reflecting mirror side of said negative meniscus lenses, are $L_{MN}$ respectively, and distances on optical axes from said mask to said first and third concave mirrors and distances on optical axes from said intermediate images to said second and fourth concave mirrors are TL respectively, the following conditions are satisfied:

$$-30<q<-3$$

$$-4<L_{MN}/TL<0.2$$

where $q=(r_{2N}+r_{1N})/(r_{2N}-r_{1N})$.

51. An exposure apparatus according to claim 50, wherein when a distance from an image-side principal point, which image-side corresponds to a first concave reflecting mirror side of said first positive lens group, to an image-side principal point, which image side corresponds to a first concave reflecting mirror side of said first negative lens group is $L_{1(GP-GN)}$, and a distance on an optical axis from said first object to said first concave reflecting mirror is TL1, the following relation is satisfied:

$$0.35<L_{1(GP-GN)}/TL1,$$

and when a distance from an image-side principal point, which image side corresponds to a second concave reflecting mirror side of said second positive lens group, to an image-side principal point, which image side corresponds to a second concave reflecting mirror side of said second negative lens group is $L_{2(GP-GN)}$ and a distance on a optical axis from said first object to said second concave reflecting mirror is TL2, the following relation is satisfied:

$$0.35 < L_{2(GP-GN)}/TL2.$$

52. An exposure apparatus according to claim 50, wherein when a radius of curvature of said first concave reflecting mirror in said first imaging optical system is $r_{M1}$ a focal length of said first positive lens group is $f_{GP1}$ and a distance on an optical axis from said first object to said first concave reflecting mirror is TL1, the following relations are satisfied:

$$0.95 < |r_{M1}/TL1| < 1.08$$

$$0.3 < f_{GP1}/TL1 < 1.0$$

and when a radius of curvature of said second concave reflecting mirror in said second imaging optical system is $r_{M2}$ a focal length of said second positive lens group is $f_{GP2}$ and a distance on an optical axis from said intermediate image to said second concave reflecting mirror is TL2, the following relations are satisfied:

$$0.95 < |r_{M2}/TL2| < 1.08$$

$$0.3 < f_{GP2}/TL2 < 1.0.$$

53. A method of projecting a pattern from an original onto substrate, comprising:
   illuminating the original as the first object; and
   forming the first and second images on the substrate by the exposure apparatus of claim 50.

54. An exposure apparatus for projecting and transferring an image of a mask onto a plate while moving said mask and said plate along a scanning direction, comprising:
   an illuminating optical system for illuminate said mask; a mask stage for holding the mask; a first projection optical system having a first field area on the mask illuminated by said illuminating optical system;
   a second projection optical system having a second field area, adjacent to the first field area, on the mask illuminated by said illuminating optical system; and
   a plate stage for holding the plate;
   said first projection optical system including a first reflecting surface, a first positive lens group, a first negative lens group, a first concave reflecting mirror, a second reflecting surface, a third reflecting surface a second positive lens group, a second negative lens group, a second concave mirror, and a fourth reflecting surface;
   said second projection optical system includes a fifth reflecting surface, a third positive lens group, a third negative lens group, a third concave reflecting mirror, a sixth reflecting surface, a seventh reflecting surface, a fourth positive lens group, a fourth negative lens group, a fourth concave reflecting mirror, a eighth reflecting surface;
   light from the first field area being reflected by said first reflecting surface, passing through the first positive lens group and the first negative lens group, being reflected by said first concave mirror, passing through the first negative lens group and the first positive lens group again, and being reflected by the third reflecting surface, thereby forming an intermediate image of said first field area;
   light from the intermediate image of said first field area being reflected by said fourth reflecting surface, passing through the second positive lens group and the second negative lens group being reflected by the second concave reflecting mirror, passing through the second negative lens group and the second positive lens group again, and being reflected by said fourth reflecting surface, thereby forming an secondary image of the first field area onto the plate;
   light from the second field are being reflected by said fifth reflecting surface, passing through the third positive lens group and the third negative lens group, being reflected by said third concave mirror, passing through the third negative lens group and the third positive lens group again, and being reflected by the sixth reflecting surface, thereby forming an intermediate image of the second field area;
   light from the intermediate image of the second field area being reflected by the seventh reflecting surface, passing through the fourth positive lens group and the fourth negative lens group, being reflected by the fourth concave reflecting mirror, passing through the fourth negative lens group and the fourth positive lens group again, and being reflected by said eighth reflecting surface, thereby forming an secondary image of the second field area onto the plate;
   said first and fifth reflecting surface reflect said light from the mask in opposite directions;
   said third and seventh reflecting surface reflect said light from intermediate images in opposite directions;
   distances from image-side principal points of said first through fourth positive lens group to image-side principal points of said first through fourth negative lens groups being $L_{GP-GN}$ respectively, and distances on optical axes from said mask to said first and third concave mirrors and distances on optical axes from said intermediate images to said second and fourth concave mirrors are TL respectively, the following conditions are satisfied: $0.35 < L_{GP-GN}/TL$, where said image side concerning the first positive lens group is the first reflecting mirror side of said first negative lens group, said image side concerning the first negative lens group is the first reflecting mirror side of said first negative lens group, said image side concerning the second positive lens group is the second reflecting mirror side of said second negative lens group, said image side concerning the second negative lens group is the second reflecting mirror side of said second negative lens group, said image side concerning the third positive lens group is the third reflecting mirror side of said third negative lens group, said image side concerning the third negative lens group is the third reflecting mirror side of said third negative lens group, said image side concerning the fourth positive lens group is the fourth reflecting mirror side of said fourth negative lens group, and said image side concerning the fourth negative lens group is the fourth reflecting mirror side of said fourth negative lens group.

55. An exposure apparatus according to claim 54, wherein when a radius of curvature of said first concave reflecting mirror in said first imaging optical system is $r_{M1}$, a focal length of said first positive lens group is $f_{GP1}$ and a distance on an optical axis from said first object to said first concave reflecting mirror is TL1, the following relations are satisfied:

$$0.95 < |r_{M1}/TL1| < 1.08$$

$$0.3 < f_{GP1}/TL1 < 1.0$$

and when a radius of curvature of said second concave reflecting mirror in said second imaging optical system is $r_{M2}$ a focal length of said second positive lens group is $f_{GP2}$ and a distance on an optical axis form said intermediate image to said second concave reflecting mirror is TL2, the following relations are satisfied:

$$0.95 < |r_{M2}/TL2| < 1.08$$

$$0.3 < f_{GP2}/TL2 < 1.0.$$

56. A method of projecting a pattern from an original onto substrate, comprising:

illuminating the original as the first object; and forming the first and second images on the substrate by the exposure apparatus of claim 54.

57. An exposure apparatus for projecting and transferring an image of a mask onto a plate while moving said mask and said plate along a scanning direction, comprising:

a first projection optical system including a first imaging optical system having a unit magnification and a first optical axis, a second imaging optical system having a unit magnification and a second optical axis, and a first field area on the mask; and a second projection optical system including a third imaging optical system having a unit magnification and a third optical axis, a fourth imaging optical system having a unit magnification and a fourth optical axis, and a second field area, which differs from the first field area, on the mask;

said first and third imaging optical system each comprising a first reflecting surface, a first positive lens group with a positive refractive power, a first negative lens group with a negative refractive power, a first concave reflecting mirror, and a second reflecting surface respectively, wherein said first negative lens group including a negative meniscus lens having a convex surface facing a first positive lens group side;

said second and fourth imaging optical system each comprising a third reflecting surface, a second positive lens group with a positive refractive power, a second negative lens group with a negative refractive power, a second concave reflecting mirror, and a fourth reflecting surface respectively;

wherein light from the first field area is reflected by the first reflecting surface of said first imaging optical system, passes through the first positive lens group and the first negative lens group of said first imaging optical system, is reflected by the first concave reflecting mirror of said first imaging optical system, passes through the first negative lens group and the first positive lens group of said first imaging optical system again, is reflected by the second reflecting surface of said first imaging optical system and the third reflecting surface of said second imaging optical system, passes through the second positive lens group and the second negative lens group of said second imaging optical system, is reflected by said second concave reflecting mirror of said second imaging optical system, passes through the second negative lens group and the second positive lens group of said second imaging optical system again, and is reflected by the fourth reflecting surface of said second imaging optical system, thereby forming a real-size erect image of the first field area of the mask onto the plate;

wherein light form the second field area is reflected by the first reflecting surface of said third imaging optical system, passes through the first positive lens group and the first negative lens group of said third imaging optical system, is reflected by the first concave reflecting mirror of said third imaging optical system, passes through the first negative lens group and the first positive lens group of said third imaging optical system again, is reflected by the second reflecting surface of said third imaging optical system and the third reflecting surface of said fourth imaging optical system, passes through the second positive lens group and the second negative lens group of said fourth imaging optical system, is reflected by said second concave reflecting mirror of said fourth imaging optical system, passes through the second negative lens group and the second positive lens group of said fourth imaging optical system again, and is reflected by the fourth reflecting surface of said fourth imaging optical system, thereby forming a real-size erect image of the second field area of the mask onto the plate; and said first through fourth optical axes being parallel to the scanning direction, wherein when a radius of curvature of a lens surface of said negative meniscus lens on said first positive lens group side is $r_{1N}$ a radius of curvature of a lens surface of said negative meniscus lens on a first concave reflecting mirror said is $r_{2N}$, the following relation is satisfied:

$$-30 < q < -3$$

where $q=(r_{2N}+r_{1N})/(r_{2N}-r_{1N})$.

58. An exposure apparatus according to claim 57, wherein numerical aperture of said first and second projection optical system is 0.1.

59. An exposure apparatus according to claim 57, wherein said light passes through said first and second projection optical system including at least g-line.

60. An exposure apparatus according to claim 57, wherein said first and second field area has trapezoidal shape.

61. A method of projecting a pattern from an original onto substrate, comprising:

illuminating the original as the first object; and forming the first and second images on the substrate by the exposure apparatus of claim 57.

62. An exposure apparatus for use in photolithography transferring an image of a first object onto a second object, the apparatus comprising:

a unit magnification projection optical system, arranged between said first object and said second object, for forming an image of a pattern on said first object onto said second object, and having a concave mirror, a first lens group, a second lens group, a first space, a second space, a first mirror, and a second mirror, wherein:

said first lens group arranged in an optical path between said first object and said concave mirror, and in an optical path between said concave mirror and said second object, said second lens group, arranged between said first lens group and said concave mirror, has a concave lens surface facing toward said concave mirror, said first space arranged between said first lens group and said second lens group, said second space arranged between said second lens group and said concave mirror, said first mirror arranged in an optical path between said first object and said first lens group, said second mirror arranged in an optical path between said first lens group and said second object, said first space is larger than said second space, said projection optical system is a both-side telecentric optical system, and the optical path from said first mirror through said first lens group is substantially parallel to the optical path which travels back through said first lens group to said second mirror.

63. An exposure apparatus according to claim 62, wherein said projection optical system further comprising:

an another concave mirror, a third lens group, a fourth lens group, a third space, a fourth space, a third mirror, a fourth mirror, wherein said another concave mirror arranged in an optical path between said second mirror and said second object, wherein said third lens group arranged in an optical path between said second mirror and said another concave mirror, and in an optical path between said another concave mirror and said second object, wherein said fourth lens group, arranged between said third lens group and said another concave mirror, and has an another concave lens surface facing toward said another concave mirror, wherein said third space arranged between said third lens group and fourth lens group, wherein said fourth space arranged between said fourth lens group and said another concave mirror, wherein said third mirror arranged in an optical path between said second mirror and said third lens group, wherein said fourth mirror arranged in an optical path between said third lens group and said second object, and wherein said third space is larger than said fourth space.

64. An exposure apparatus according to claim 62, wherein said concave lens surface juxtaposed said second space.

65. An exposure apparatus according to claim 62, wherein said second lens group having negative refractive power.

66. An exposure apparatus according to claim 62, wherein said second lens group consisting of a single lens.

67. An exposure apparatus according to claim 63, further comprising a field stop arranged in an optical path between said second mirror and said third mirror.

68. An exposure apparatus according to claim 67, wherein said field stop defines an exposure area on said second object, said exposure area has trapezoidal shape.

69. A method of projecting a pattern from an original onto a substrate, comprising:

illuminating the original as the first object, and forming an image on the substrate as the second object, by the exposure apparatus of claim 62.

70. An exposure apparatus capable of transferring an image of a first object onto a second object, the apparatus comprising:

a first projection optical system, arranged to receive light from a first field area on the first object, for forming a first image of said first field area within a first exposure area on the second object, and having a first catadioptric optical system and a second catadioptric optical system; and a second projection optical system, arranged to receive light from a second field area on the first object, for forming a second image of said second field area within a second exposure area on the second object, and having a third catadioptric optical system and a fourth catadioptric optical system, said first catadioptric optical system includes a first concave mirror, a first lens group, a second lens group arranged between said first lens group and said first concave mirror, a first space between said first lens group and said second lens group, and a second space between said second lens group and said first concave mirror, said second catadioptric optical system includes a second concave mirror, a third lens group, a fourth lens group arranged between said third lens group and said second concave mirror, a third space between said third lens group and said fourth lens group, and a fourth space between said fourth lens group and said concave mirror, said third catadioptric optical system includes a third concave mirror, a fifth lens group, a sixth lens group arranged between said fifth lens group and said third concave mirror, a fifth space between said fifth lens group and said sixth lens group, and a sixth space between said sixth lens group and said third concave mirror, said fourth catadioptric optical system includes a fourth concave mirror, a seventh lens group, an eighth lens group arranged between said seventh lens group and said fourth concave mirror, a seventh space between said seventh lens group and said eighth lens group, and an eighth space between said eighth lens group and said fourth concave mirror, said first catadioptric optical system arranged so that said light from the first field area passes through the first lens group, the first space, the second lens group, and the second space, reflected by said first concave mirror, and passes through the second space, the second lens group, the first space, and the first lens group, said second catadioptric optical system arranged so that light from said first catadioptric optical system passes through said third lens group, the third space, the fourth lens group, and the fourth space, reflected by said second concave mirror, and passes through the fourth space, the fourth lens group, the third space, and the third lens group, said third catadioptric optical system arranged so that said light from the second field area passes through the fifth lens group, the fifth space, the sixth lens group, and the sixth space, reflected by said third concave mirror, and passes through the sixth space, the sixth lens group, the fifth space, and the fifth lens group, said fourth catadioptric optical system arranged so that light from the third catadioptric optical system passes through the seventh lens group, the seventh space, the eighth lens group, and the eighth space, reflected by said fourth concave mirror, and passes through the eighth space, the eighth lens group, the seventh space, and the seventh lens group, said second lens group has a first concave lens surface facing toward said first concave mirror, said fourth lens group has a second concave lens surface facing toward said second concave mirror, said sixth lens group has a third concave lens surface facing toward said third concave mirror, said eighth lens group has a fourth concave lens surface facing toward said fourth concave mirror, said first space larger than said second space, said third space larger than said fourth space, said fifth space larger than said sixth space, and said seventh space larger than said eighth space.

71. An exposure apparatus according to claim 70, wherein said first, second, third, and fourth catadioptric optical system are both-side telecentric optical system.

72. An exposure apparatus according to claim 70, further comprising:

a first mirror arranged in an optical path between said first object and said first lens group, a second mirror arranged in an optical path between said first lens group and said third lens group, a third mirror arranged in an optical path between said second mirror and said third lens group, a fourth mirror arranged in an optical path between said third lens group and said second object, a fifth mirror arranged in an optical path between said first object and said fifth lens group, a sixth mirror arranged in an optical path between said fifth lens group and said seventh lens group, a seventh mirror arranged in an optical path between said sixth mirror and said seventh lens group, and an eighth mirror arranged in an optical path between said seventh lens group and said second object.

73. An exposure apparatus according to claim 72, further comprising:

a first field stop arranged in an optical path between said second mirror and said third mirror, and a second field stop arranged in an optical path between said sixth mirror and said seventh mirror.

74. An exposure apparatus according to claim 73, wherein said first and second field stops define said first and second exposure areas respectively, said first and second exposure areas have trapezoidal shape.

75. An exposure apparatus according to claim 70, wherein said first concave lens surface juxtaposed said second space, said second concave lens surface juxtaposed said fourth space, said third concave lens surface juxtaposed said sixth space, and said fourth concave lens surface juxtaposed said eighth space.

76. An exposure apparatus according to claim 70, wherein said second, fourth, sixth, and eighth lens group having negative refractive power respectively.

77. An exposure apparatus according to claim 70, wherein said second, fourth, sixth, and eighth lens group consisting of a single lens respectively.

78. A method of projecting a pattern from an original onto a substrate, comprising:

illuminating the original as the first object, and forming said first and second images on the substrate as the second object, by the exposure apparatus of claim 70.

\* \* \* \* \*